US008365035B2

(12) United States Patent
Hara

(10) Patent No.: US 8,365,035 B2
(45) Date of Patent: Jan. 29, 2013

(54) DATA MODULATING DEVICE AND METHOD THEREOF

(75) Inventor: Masaaki Hara, Tokyo (JP)

(73) Assignee: Sony Corporation, Tokyo (JP)

( * ) Notice: Subject to any disclaimer, the term of this patent is extended or adjusted under 35 U.S.C. 154(b) by 328 days.

(21) Appl. No.: 12/689,100

(22) Filed: Jan. 18, 2010

(65) Prior Publication Data

US 2010/0205506 A1 Aug. 12, 2010

(30) Foreign Application Priority Data

Feb. 10, 2009 (JP) ................................ 2009-028381

(51) Int. Cl.
*H04L 1/18* (2006.01)
*H03M 13/00* (2006.01)

(52) U.S. Cl. ......................... 714/755; 714/751; 714/752

(58) Field of Classification Search ........................ None
See application file for complete search history.

(56) References Cited

U.S. PATENT DOCUMENTS 7,365,657 B2 4/2008 Hara

FOREIGN PATENT DOCUMENTS

JP 2005-302079 10/2005
JP 2007-79438 3/2007
JP 2007-188576 7/2007
JP 2007-226879 9/2007

OTHER PUBLICATIONS

Ryan, William, "An Introduction to LDPC Codes", Aug. 19, 2003, U. of Arizona.
Gallager, Robert G., "Low Densitiy Parity-Check Codes", Department of Electrical Engineering, M.I.T., Cambridge, MA, Doctoral Thesis, Jul. 1963.
An Introduction to L D P C codes.
Low-density parity-checkcodes Robert G. Gallater 1963.
Practicing composition method of LDPC sign vol. 1' Nikkei electronics Aug. 15, 2005 p. 126-130.
Practicing composition method of LDPC sign vol. 2' Nikkei electronics Aug. 29, 2005 p. 127-132.

*Primary Examiner* — Guerrier Merant
(74) *Attorney, Agent, or Firm* — Robert J. Depke; Rockey, Depke & Lyons, LLC

(57) ABSTRACT

A data modulating device includes: an LDPC encoding unit configured to execute LDPC encoding; and a balance encoding unit configured to input a data string subjected to encoding by the LDPC encoding unit as data to be encoded, and convert k bits of this data to be encoded into balance code made up of m-bit block data; with the balance encoding unit executing balance encoding of said data to be encoded using a data conversion table subjected to mapping so that a set of the k-bit data patterns of which the Hamming distance is 1 corresponds to a set of block data of which the Hamming distance is 2.

6 Claims, 43 Drawing Sheets

FIG. 4

| | | | | | | | |
|---|---|---|---|---|---|---|---|
| ## 0##<br>0101<br>1000<br>0000<br>0000 | ## 1##<br>1010<br>0100<br>0000<br>0000 | ## 2##<br>1001<br>0100<br>0000<br>0000 | ## 3##<br>1001<br>0010<br>0000<br>0000 | ## 4##<br>0101<br>0010<br>0000<br>0000 | ## 5##<br>0100<br>1010<br>0000<br>0000 | ## 6##<br>0001<br>1010<br>0000<br>0000 | ## 7##<br>0101<br>0001<br>0000<br>0000 |
| ## 8##<br>0100<br>1001<br>0000<br>0000 | ## 9##<br>0010<br>1001<br>0000<br>0000 | ##10##<br>1000<br>0101<br>0000<br>0000 | ##11##<br>0010<br>0101<br>0000<br>0000 | ##12##<br>1010<br>0000<br>1000<br>0000 | ##13##<br>1001<br>0000<br>1000<br>0000 | ##14##<br>0101<br>0000<br>1000<br>0000 | ##15##<br>1000<br>0100<br>1000<br>0000 |
| ##16##<br>0010<br>0100<br>1000<br>0000 | ##17##<br>0001<br>0100<br>1000<br>0000 | ##18##<br>1000<br>0010<br>1000<br>0000 | ##19##<br>0100<br>0010<br>1000<br>0000 | ##20##<br>0001<br>0010<br>1000<br>0000 | ##21##<br>1000<br>0001<br>1000<br>0000 | ##22##<br>0100<br>0001<br>1000<br>0000 | ##23##<br>0010<br>0001<br>1000<br>0000 |
| ##24##<br>0000<br>0101<br>1000<br>0000 | ##25##<br>1010<br>0000<br>0100<br>0000 | ##26##<br>1001<br>0000<br>0100<br>0000 | ##27##<br>0101<br>0000<br>0100<br>0000 | ##28##<br>0100<br>1000<br>0100<br>0000 | ##29##<br>0010<br>1000<br>0100<br>0000 | ##30##<br>0001<br>1000<br>0100<br>0000 | ##31##<br>1000<br>0010<br>0100<br>0000 |
| ##32##<br>0100<br>0010<br>0100<br>0000 | ##33##<br>0001<br>0010<br>0100<br>0000 | ##34##<br>0000<br>1010<br>0100<br>0000 | ##35##<br>1000<br>0001<br>0100<br>0000 | ##36##<br>0100<br>0001<br>0100<br>0000 | ##37##<br>0010<br>0001<br>0100<br>0000 | ##38##<br>0000<br>1001<br>0100<br>0000 | ##39##<br>1010<br>0000<br>0010<br>0000 |

(EXPLANATORY NOTE)

0## ← 8-BIT DECIMAL NOTATION
0101
1000 ← SYMBOL OF 4×4
0000
0000

FIG. 5

| | | | | | | | |
|---|---|---|---|---|---|---|---|
| ##40##<br>1001<br>0000<br>0010<br>0000 | ##41##<br>0101<br>0000<br>0010<br>0000 | ##42##<br>0100<br>1000<br>0010<br>0000 | ##43##<br>0010<br>1000<br>0010<br>0000 | ##44##<br>0001<br>1000<br>0010<br>0000 | ##45##<br>1000<br>0100<br>0010<br>0000 | ##46##<br>0010<br>0100<br>0010<br>0000 | ##47##<br>0001<br>0100<br>0010<br>0000 |
| ##48##<br>1000<br>0001<br>0010<br>0000 | ##49##<br>0100<br>0001<br>0010<br>0000 | ##50##<br>0010<br>0001<br>0010<br>0000 | ##51##<br>0000<br>1001<br>0010<br>0000 | ##52##<br>0000<br>0101<br>0010<br>0000 | ##53##<br>1000<br>0000<br>1010<br>0000 | ##54##<br>0100<br>0000<br>1010<br>0000 | ##55##<br>0010<br>0000<br>1010<br>0000 |
| ##56##<br>0001<br>0000<br>1010<br>0000 | ##57##<br>0000<br>0100<br>1010<br>0000 | ##58##<br>0000<br>0001<br>1010<br>0000 | ##59##<br>1010<br>0000<br>0001<br>0000 | ##60##<br>1001<br>0000<br>0001<br>0000 | ##61##<br>0101<br>0000<br>0001<br>0000 | ##62##<br>0100<br>1000<br>0001<br>0000 | ##63##<br>0010<br>1000<br>0001<br>0000 |
| ##64##<br>0001<br>1000<br>0001<br>0000 | ##65##<br>1000<br>0100<br>0001<br>0000 | ##66##<br>0010<br>0100<br>0001<br>0000 | ##67##<br>0001<br>0100<br>0001<br>0000 | ##68##<br>1000<br>0010<br>0001<br>0000 | ##69##<br>0100<br>0010<br>0001<br>0000 | ##70##<br>0001<br>0010<br>0001<br>0000 | ##71##<br>0000<br>1010<br>0001<br>0000 |
| ##72##<br>1000<br>0000<br>1001<br>0000 | ##73##<br>0100<br>0000<br>1001<br>0000 | ##74##<br>0010<br>0000<br>1001<br>0000 | ##75##<br>0001<br>0000<br>1001<br>0000 | ##76##<br>0000<br>0100<br>1001<br>0000 | ##77##<br>0000<br>0010<br>1001<br>0000 | ##78##<br>1000<br>0000<br>0101<br>0000 | ##79##<br>0100<br>0000<br>0101<br>0000 |

FIG. 6

| | | | | | | | |
|---|---|---|---|---|---|---|---|
| ##80##<br>0010<br>0000<br>0101<br>0000 | ##81##<br>0001<br>0000<br>0101<br>0000 | ##82##<br>0000<br>1000<br>0101<br>0000 | ##83##<br>0000<br>0010<br>0101<br>0000 | ##84##<br>1010<br>0000<br>0000<br>1000 | ##85##<br>1001<br>0000<br>0000<br>1000 | ##86##<br>0101<br>0000<br>0000<br>1000 | ##87##<br>0100<br>1000<br>0000<br>1000 |
| ##88##<br>0010<br>1000<br>0000<br>1000 | ##89##<br>0001<br>1000<br>0000<br>1000 | ##90##<br>1000<br>0100<br>0000<br>1000 | ##91##<br>0010<br>0100<br>0000<br>1000 | ##92##<br>0001<br>0100<br>0000<br>1000 | ##93##<br>1000<br>0010<br>0000<br>1000 | ##94##<br>0100<br>0010<br>0000<br>1000 | ##95##<br>0001<br>0010<br>0000<br>1000 |
| ##96##<br>0000<br>1010<br>0000<br>1000 | ##97##<br>1000<br>0001<br>0000<br>1000 | ##98##<br>0100<br>0001<br>0000<br>1000 | ##99##<br>0010<br>0001<br>0000<br>1000 | ##100##<br>0000<br>1001<br>0000<br>1000 | ##101##<br>0000<br>0101<br>0000<br>1000 | ##102##<br>1000<br>0000<br>0100<br>1000 | ##103##<br>0100<br>0000<br>0100<br>1000 |
| ##104##<br>0010<br>0000<br>0100<br>1000 | ##105##<br>0001<br>0000<br>0100<br>1000 | ##106##<br>0000<br>1000<br>0100<br>1000 | ##107##<br>0000<br>0010<br>0100<br>1000 | ##108##<br>0000<br>0001<br>0100<br>1000 | ##109##<br>1000<br>0000<br>0010<br>1000 | ##110##<br>0100<br>0000<br>0010<br>1000 | ##111##<br>0010<br>0000<br>0010<br>1000 |
| ##112##<br>0001<br>0000<br>0010<br>1000 | ##113##<br>0000<br>1000<br>0010<br>1000 | ##114##<br>0000<br>0100<br>0010<br>1000 | ##115##<br>0000<br>0001<br>0010<br>1000 | ##116##<br>1000<br>0000<br>0001<br>1000 | ##117##<br>0100<br>0000<br>0001<br>1000 | ##118##<br>0010<br>0000<br>0001<br>1000 | ##119##<br>0001<br>0000<br>0001<br>1000 |

FIG. 7

| | | | | | | | |
|---|---|---|---|---|---|---|---|
| ##120##<br>0000<br>1000<br>0001<br>1000 | ##121##<br>0000<br>0100<br>0001<br>1000 | ##122##<br>0000<br>0010<br>0001<br>1000 | ##123##<br>0000<br>0000<br>0101<br>1000 | ##124##<br>1010<br>0000<br>0000<br>0100 | ##125##<br>1001<br>0000<br>0000<br>0100 | ##126##<br>0101<br>0000<br>0000<br>0100 | ##127##<br>0100<br>1000<br>0000<br>0100 |
| ##128##<br>0010<br>1000<br>0000<br>0100 | ##129##<br>0001<br>1000<br>0000<br>0100 | ##130##<br>1000<br>0100<br>0000<br>0100 | ##131##<br>0010<br>0100<br>0000<br>0100 | ##132##<br>0001<br>0100<br>0000<br>0100 | ##133##<br>1000<br>0010<br>0000<br>0100 | ##134##<br>0100<br>0010<br>0000<br>0100 | ##135##<br>0001<br>0010<br>0000<br>0100 |
| ##136##<br>0000<br>1010<br>0000<br>0100 | ##137##<br>1000<br>0001<br>0000<br>0100 | ##138##<br>0100<br>0001<br>0000<br>0100 | ##139##<br>0010<br>0001<br>0000<br>0100 | ##140##<br>0000<br>1001<br>0000<br>0100 | ##141##<br>0000<br>0101<br>0000<br>0100 | ##142##<br>1000<br>0000<br>1000<br>0100 | ##143##<br>0100<br>0000<br>1000<br>0100 |
| ##144##<br>0010<br>0000<br>1000<br>0100 | ##145##<br>0001<br>0000<br>1000<br>0100 | ##146##<br>0000<br>0100<br>1000<br>0100 | ##147##<br>0000<br>0010<br>1000<br>0100 | ##148##<br>0000<br>0001<br>1000<br>0100 | ##149##<br>1000<br>0000<br>0010<br>0100 | ##150##<br>0100<br>0000<br>0010<br>0100 | ##151##<br>0010<br>0000<br>0010<br>0100 |
| ##152##<br>0001<br>0000<br>0010<br>0100 | ##153##<br>0000<br>1000<br>0010<br>0100 | ##154##<br>0000<br>0100<br>0010<br>0100 | ##155##<br>0000<br>0001<br>0010<br>0100 | ##156##<br>0000<br>0000<br>1010<br>0100 | ##157##<br>1000<br>0000<br>0001<br>0100 | ##158##<br>0100<br>0000<br>0001<br>0100 | ##159##<br>0010<br>0000<br>0001<br>0100 |

FIG. 8

| | | | | | | | |
|---|---|---|---|---|---|---|---|
| ##160##<br>0001<br>0000<br>0001<br>0100 | ##161##<br>0000<br>1000<br>0001<br>0100 | ##162##<br>0000<br>0100<br>0001<br>0100 | ##163##<br>0000<br>0010<br>0001<br>0100 | ##164##<br>0000<br>0000<br>1001<br>0100 | ##165##<br>1010<br>0000<br>0000<br>0010 | ##166##<br>1001<br>0000<br>0000<br>0010 | ##167##<br>0101<br>0000<br>0000<br>0010 |
| ##168##<br>0100<br>1000<br>0000<br>0010 | ##169##<br>0010<br>1000<br>0000<br>0010 | ##170##<br>0001<br>1000<br>0000<br>0010 | ##171##<br>1000<br>0100<br>0000<br>0010 | ##172##<br>0010<br>0100<br>0000<br>0010 | ##173##<br>0001<br>0100<br>0000<br>0010 | ##174##<br>1000<br>0010<br>0000<br>0010 | ##175##<br>0100<br>0010<br>0000<br>0010 |
| ##176##<br>0001<br>0010<br>0000<br>0010 | ##177##<br>0000<br>1010<br>0000<br>0010 | ##178##<br>1000<br>0001<br>0000<br>0010 | ##179##<br>0100<br>0001<br>0000<br>0010 | ##180##<br>0010<br>0001<br>0000<br>0010 | ##181##<br>0000<br>1001<br>0000<br>0010 | ##182##<br>0000<br>0101<br>0000<br>0010 | ##183##<br>1000<br>0000<br>1000<br>0010 |
| ##184##<br>0100<br>0000<br>1000<br>0010 | ##185##<br>0010<br>0000<br>1000<br>0010 | ##186##<br>0001<br>0000<br>1000<br>0010 | ##187##<br>0000<br>0100<br>1000<br>0010 | ##188##<br>0000<br>0010<br>1000<br>0010 | ##189##<br>0000<br>0001<br>1000<br>0010 | ##190##<br>1000<br>0000<br>0100<br>0010 | ##191##<br>0100<br>0000<br>0100<br>0010 |
| ##192##<br>0010<br>0000<br>0100<br>0010 | ##193##<br>0001<br>0000<br>0100<br>0010 | ##194##<br>0000<br>1000<br>0100<br>0010 | ##195##<br>0000<br>0010<br>0100<br>0010 | ##196##<br>0000<br>0001<br>0100<br>0010 | ##197##<br>1000<br>0000<br>0001<br>0010 | ##198##<br>0100<br>0000<br>0001<br>0010 | ##199##<br>0010<br>0000<br>0001<br>0010 |

FIG. 9

| | | | | | | | |
|---|---|---|---|---|---|---|---|
| ##200##<br>0001<br>0000<br>0001<br>0010 | ##201##<br>0000<br>1000<br>0001<br>0010 | ##202##<br>0000<br>0100<br>0001<br>0010 | ##203##<br>0000<br>0010<br>0001<br>0010 | ##204##<br>0000<br>0000<br>1001<br>0010 | ##205##<br>0000<br>0000<br>0101<br>0010 | ##206##<br>1000<br>0000<br>0000<br>1010 | ##207##<br>0100<br>0000<br>0000<br>1010 |
| ##208##<br>0010<br>0000<br>0000<br>1010 | ##209##<br>0001<br>0000<br>0000<br>1010 | ##210##<br>0000<br>1000<br>0000<br>1010 | ##211##<br>0000<br>0100<br>0000<br>1010 | ##212##<br>0000<br>0010<br>0000<br>1010 | ##213##<br>0000<br>0001<br>0000<br>1010 | ##214##<br>0000<br>0000<br>0100<br>1010 | ##215##<br>0000<br>0000<br>0001<br>1010 |
| ##216##<br>1010<br>0000<br>0000<br>0001 | ##217##<br>1001<br>0000<br>0000<br>0001 | ##218##<br>0101<br>0000<br>0000<br>0001 | ##219##<br>0100<br>1000<br>0000<br>0001 | ##220##<br>0010<br>1000<br>0000<br>0001 | ##221##<br>0001<br>1000<br>0000<br>0001 | ##222##<br>1000<br>0100<br>0000<br>0001 | ##223##<br>0010<br>0100<br>0000<br>0001 |
| ##224##<br>0001<br>0100<br>0000<br>0001 | ##225##<br>1000<br>0010<br>0000<br>0001 | ##226##<br>0100<br>0010<br>0000<br>0001 | ##227##<br>0001<br>0010<br>0000<br>0001 | ##228##<br>0000<br>1010<br>0000<br>0001 | ##229##<br>1000<br>0001<br>0000<br>0001 | ##230##<br>0100<br>0001<br>0000<br>0001 | ##231##<br>0010<br>0001<br>0000<br>0001 |
| ##232##<br>0000<br>1001<br>0000<br>0001 | ##233##<br>0000<br>0101<br>0000<br>0001 | ##234##<br>1000<br>0000<br>1000<br>0001 | ##235##<br>0100<br>0000<br>1000<br>0001 | ##236##<br>0010<br>0000<br>1000<br>0001 | ##237##<br>0001<br>0000<br>1000<br>0001 | ##238##<br>0000<br>0100<br>1000<br>0001 | ##239##<br>0000<br>0010<br>1000<br>0001 |

FIG. 10

| | | | | | | | |
|---|---|---|---|---|---|---|---|
| ##240##<br>0000<br>0001<br>1000<br>0001 | ##241##<br>1000<br>0000<br>0100<br>0001 | ##242##<br>0100<br>0000<br>0100<br>0001 | ##243##<br>0010<br>0000<br>0100<br>0001 | ##244##<br>0001<br>0000<br>0100<br>0001 | ##245##<br>0000<br>1000<br>0100<br>0001 | ##246##<br>0000<br>0010<br>0100<br>0001 | ##247##<br>0000<br>0001<br>0100<br>0001 |
| ##248##<br>1000<br>0000<br>0010<br>0001 | ##249##<br>0100<br>0000<br>0010<br>0001 | ##250##<br>0010<br>0000<br>0010<br>0001 | ##251##<br>0001<br>0000<br>0010<br>0001 | ##252##<br>0000<br>1000<br>0010<br>0001 | ##253##<br>0000<br>0100<br>0010<br>0001 | ##254##<br>0000<br>0001<br>0010<br>0001 | ##255##<br>0000<br>0000<br>1010<br>0001 |

FIG. 16

| SORTING COUNT (j) | SUM OF RANK ORDERS OF TOP THREE (M) | RANK ORDERS AFTER SORTING | ABSOLUTE VALUE OF LLR CANDIDATE VALUE AT THE TIME OF j'TH SORTING (EVA(j)) |
|---|---|---|---|
| 1 | 6 | s1 s2 s3 s4 s5 s6 s7 s8−s16 | 1 |
| 2 | 7 | s1 s2 **s4** **s3** s5 s6 s7 s8−s16 | s3−s4 |
| 3 | 8 | s1 s2 **s5** s4 **s3** s6 s7 s8−s16 | s3−s5 |
| 4 | 8 | s1 **s4** s3 **s2** s5 s6 s7 s8−s16 | s2−s4 |
| 5 | 9 | s1 s2 **s6** s4 s5 **s3** s7 s8−s16 | s3−s6 |
| 6 | 9 | s1 **s5** s3 s4 **s2** s6 s7 s8−s16 | s2−s5 |
| 7 | 9 | **s4** s2 s3 **s1** s5 s6 s7 s8−s16 | s1−s4 |
| 8 | 10 | s1 s2 **s7** s4 s5 s6 **s3** s8−s16 | s3−s7 |
| 9 | 10 | s1 **s6** s3 s4 s5 **s2** s7 s8−s16 | s2−s6 |
| 10 | 10 | **s5** s2 s3 s4 **s1** s6 s7 s8−s16 | s1−s5 |
| 11 | 10 | s1 **s4** **s5** **s2** **s3** s6 s7 s8−s16 | s2+s3−s4−s5 |
| 12 | 11 | s1 s2 **s8** s4 s5 s6 s7 **s3** s9−s16 | s3−s8 |
| 13 | 11 | s1 **s7** s3 s4 s5 s6 **s2** s8−s16 | s2−s7 |
| 14 | 11 | **s6** s2 s3 s4 s5 **s1** s7 s8−s16 | s1−s6 |
| 15 | 11 | **s5** s2 **s4** **s3** **s1** s6 s7 s8−s16 | s1+s3−s4−s5 |
| 16 | 11 | s1 **s4** **s6** **s2** s5 **s3** s7 s8−s16 | s2+s3−s5−s6 |

FIG. 22

| MAPPING TECHNIQUE \ HAMMING DISTANCE | 1 | 2 | 3 | 4 | 5 | 6 | 7 | 8 |
|---|---|---|---|---|---|---|---|---|
| STRAIGHT | 556 | 1026 | 1250 | 1316 | 918 | 412 | 102 | 18 |
| FIRST EMBODIMENT | 1100 | 1944 | 1598 | 648 | 122 | 18 | 2 | 0 |

| | | | | | | | |
|---|---|---|---|---|---|---|---|
| ##40##<br>0100<br>0001<br>0000<br>1000 | ##41##<br>0000<br>0101<br>1000<br>0000 | ##42##<br>0100<br>0001<br>1000<br>0000 | ##43##<br>1000<br>0000<br>1010<br>0000 | ##44##<br>0000<br>0101<br>0000<br>1000 | ##45##<br>0010<br>0001<br>1000<br>0000 | ##46##<br>1000<br>0100<br>0000<br>1000 | ##47##<br>1000<br>0001<br>1000<br>0000 |
| ##48##<br>0100<br>1000<br>0000<br>1000 | ##49##<br>0100<br>0000<br>0010<br>0100 | ##50##<br>0100<br>1000<br>0010<br>0000 | ##51##<br>0000<br>1000<br>0010<br>0100 | ##52##<br>0010<br>0001<br>0000<br>1000 | ##53##<br>1000<br>0001<br>0000<br>0100 | ##54##<br>0000<br>1000<br>0100<br>1000 | ##55##<br>1000<br>0000<br>0010<br>0100 |
| ##56##<br>0000<br>1001<br>0000<br>1000 | ##57##<br>0000<br>0001<br>0010<br>0100 | ##58##<br>0100<br>0000<br>0010<br>1000 | ##59##<br>0000<br>0001<br>1010<br>0000 | ##60##<br>1000<br>0001<br>0000<br>1000 | ##61##<br>1000<br>0001<br>0000<br>0001 | ##62##<br>0000<br>0001<br>0010<br>1000 | ##63##<br>1000<br>0001<br>0010<br>0000 |
| ##64##<br>0100<br>0000<br>0100<br>0010 | ##65##<br>0000<br>1010<br>0000<br>0100 | ##66##<br>0100<br>0010<br>0100<br>0000 | ##67##<br>0100<br>1010<br>0000<br>0000 | ##68##<br>0000<br>0010<br>0100<br>0010 | ##69##<br>0000<br>1010<br>0100<br>0000 | ##70##<br>0001<br>0010<br>0100<br>0000 | ##71##<br>0000<br>1010<br>0000<br>0010 |
| ##72##<br>0100<br>0000<br>0000<br>1010 | ##73##<br>0000<br>0010<br>1000<br>0010 | ##74##<br>0100<br>0010<br>0000<br>0010 | ##75##<br>0100<br>0000<br>1000<br>0010 | ##76##<br>0000<br>0010<br>0000<br>1010 | ##77##<br>0010<br>0000<br>0100<br>0010 | ##78##<br>0001<br>0010<br>0000<br>0010 | ##79##<br>1001<br>0010<br>0000<br>0000 |

FIG. 28

| | | | | | | | |
|---|---|---|---|---|---|---|---|
| ##80##<br>0101<br>0000<br>0100<br>0000 | ##81##<br>0001<br>0100<br>0000<br>0100 | ##82##<br>0001<br>1000<br>0000<br>0010 | ##83##<br>0001<br>1010<br>0000<br>0000 | ##84##<br>0001<br>0000<br>0100<br>0010 | ##85##<br>1010<br>0000<br>0100<br>0000 | ##86##<br>1000<br>0000<br>0100<br>0010 | ##87##<br>1001<br>0000<br>0100<br>0000 |
| ##88##<br>0001<br>0000<br>0000<br>1010 | ##89##<br>0001<br>0000<br>1000<br>0010 | ##90##<br>0101<br>0000<br>0000<br>0010 | ##91##<br>0001<br>0100<br>0010<br>0000 | ##92##<br>1000<br>0010<br>0000<br>0010 | ##93##<br>1010<br>0000<br>0000<br>0001 | ##94##<br>1001<br>0000<br>0000<br>0010 | ##95##<br>1001<br>0100<br>0000<br>0000 |
| ##96##<br>0000<br>0010<br>0100<br>0001 | ##97##<br>0000<br>0010<br>1000<br>0100 | ##98##<br>0100<br>0010<br>0000<br>1000 | ##99##<br>0001<br>0000<br>1000<br>0100 | ##100##<br>0000<br>0010<br>0100<br>1000 | ##101##<br>1000<br>0010<br>0000<br>0100 | ##102##<br>1000<br>0010<br>0100<br>0000 | ##103##<br>0001<br>0010<br>0000<br>0100 |
| ##104##<br>0100<br>0000<br>0000<br>1001 | ##105##<br>1000<br>0010<br>1000<br>0000 | ##106##<br>0100<br>0010<br>1000<br>0000 | ##107##<br>0001<br>0010<br>1000<br>0000 | ##108##<br>1000<br>0010<br>0000<br>1000 | ##109##<br>1000<br>0010<br>0000<br>0001 | ##110##<br>1001<br>0000<br>0000<br>1000 | ##111##<br>1001<br>0000<br>1000<br>0000 |
| ##112##<br>0101<br>0000<br>0000<br>1000 | ##113##<br>0101<br>0000<br>0000<br>0100 | ##114##<br>0001<br>1000<br>0000<br>1000 | ##115##<br>0001<br>0000<br>0010<br>0100 | ##116##<br>0001<br>0000<br>0100<br>1000 | ##117##<br>1000<br>0000<br>0100<br>0001 | ##118##<br>0001<br>0010<br>0000<br>1000 | ##119##<br>1001<br>0000<br>0000<br>0100 |

FIG. 29

| | | | | | | | |
|---|---|---|---|---|---|---|---|
| ##120##<br>0101<br>0000<br>0010<br>0000 | ##121##<br>1000<br>0000<br>1000<br>0001 | ##122##<br>0001<br>0000<br>0010<br>1000 | ##123##<br>0001<br>0000<br>1010<br>0000 | ##124##<br>1000<br>0000<br>0000<br>1001 | ##125##<br>1001<br>0000<br>0000<br>0001 | ##126##<br>1000<br>0000<br>0010<br>1000 | ##127##<br>1001<br>0000<br>0010<br>0000 |
| ##128##<br>0100<br>0000<br>0101<br>0000 | ##129##<br>0000<br>0100<br>0000<br>0101 | ##130##<br>0100<br>1000<br>0001<br>0000 | ##131##<br>0000<br>1000<br>0001<br>0100 | ##132##<br>0010<br>0000<br>0101<br>0000 | ##133##<br>0010<br>0100<br>0000<br>0100 | ##134##<br>0000<br>1000<br>0001<br>0010 | ##135##<br>0000<br>0100<br>0001<br>0100 |
| ##136##<br>0000<br>0100<br>0000<br>1010 | ##137##<br>0010<br>0000<br>1000<br>0010 | ##138##<br>0000<br>0101<br>0000<br>0010 | ##139##<br>0000<br>0100<br>1000<br>0010 | ##140##<br>0010<br>0000<br>0000<br>1010 | ##141##<br>0010<br>0100<br>0000<br>0010 | ##142##<br>0000<br>0100<br>0001<br>1000 | ##143##<br>0010<br>0100<br>0010<br>0000 |
| ##144##<br>0100<br>1000<br>0000<br>0001 | ##145##<br>0010<br>1000<br>0000<br>0100 | ##146##<br>0000<br>1000<br>0001<br>1000 | ##147##<br>0001<br>1000<br>0001<br>0000 | ##148##<br>0010<br>1000<br>0100<br>0000 | ##149##<br>0010<br>1001<br>0000<br>0000 | ##150##<br>0000<br>1000<br>0101<br>0000 | ##151##<br>0010<br>0000<br>0001<br>0100 |
| ##152##<br>0000<br>1001<br>0000<br>0001 | ##153##<br>0000<br>0101<br>0000<br>0001 | ##154##<br>0000<br>1001<br>0010<br>0000 | ##155##<br>0000<br>0100<br>0010<br>0001 | ##156##<br>1010<br>0000<br>0000<br>0010 | ##157##<br>0010<br>0101<br>0000<br>0000 | ##158##<br>1000<br>0100<br>0000<br>0010 | ##159##<br>1010<br>0100<br>0000<br>0000 |

FIG. 30

| | | | | | | | |
|---|---|---|---|---|---|---|---|
| ##160##<br>0100<br>0001<br>0000<br>0100 | ##161##<br>0100<br>0000<br>0000<br>0101 | ##162##<br>0100<br>0000<br>0001<br>0100 | ##163##<br>0100<br>0000<br>1000<br>0100 | ##164##<br>0010<br>0000<br>0100<br>1000 | ##165##<br>0010<br>0000<br>1000<br>0100 | ##166##<br>0000<br>0000<br>0101<br>1000 | ##167##<br>1000<br>0000<br>0001<br>0100 |
| ##168##<br>0100<br>0001<br>0000<br>0001 | ##169##<br>0000<br>0001<br>1000<br>0001 | ##170##<br>0100<br>0000<br>1010<br>0000 | ##171##<br>0000<br>0100<br>1010<br>0000 | ##172##<br>0010<br>0100<br>0000<br>1000 | ##173##<br>0010<br>0100<br>1000<br>0000 | ##174##<br>0000<br>0100<br>0010<br>1000 | ##175##<br>0010<br>0000<br>1010<br>0000 |
| ##176##<br>0000<br>1000<br>0010<br>0001 | ##177##<br>0000<br>0001<br>0000<br>0101 | ##178##<br>0000<br>1000<br>0010<br>1000 | ##179##<br>0010<br>0000<br>0010<br>0100 | ##180##<br>0010<br>1000<br>0000<br>1000 | ##181##<br>0010<br>0001<br>0000<br>0100 | ##182##<br>0010<br>1000<br>0010<br>0000 | ##183##<br>1010<br>0000<br>0010<br>0000 |
| ##184##<br>0100<br>0000<br>0010<br>0001 | ##185##<br>0000<br>0000<br>1010<br>0001 | ##186##<br>0100<br>0001<br>0010<br>0000 | ##187##<br>0000<br>0001<br>0010<br>0001 | ##188##<br>0000<br>0001<br>0000<br>1001 | ##189##<br>0010<br>0001<br>0000<br>0001 | ##190##<br>0010<br>0000<br>0010<br>1000 | ##191##<br>0010<br>0001<br>0010<br>0000 |
| ##192##<br>0100<br>0000<br>0100<br>0001 | ##193##<br>0000<br>1010<br>0000<br>0001 | ##194##<br>0100<br>0010<br>0001<br>0000 | ##195##<br>0001<br>0010<br>0001<br>0000 | ##196##<br>0000<br>0000<br>0101<br>0010 | ##197##<br>0010<br>0100<br>0001<br>0000 | ##198##<br>0000<br>0010<br>0101<br>0000 | ##199##<br>0000<br>1010<br>0001<br>0000 |

FIG. 31

| | | | | | | | |
|---|---|---|---|---|---|---|---|
| ##200##<br>0000<br>0000<br>0001<br>1010 | ##201##<br>0000<br>0100<br>1000<br>0001 | ##202##<br>0100<br>0000<br>0001<br>0010 | ##203##<br>0000<br>0100<br>1001<br>0000 | ##204##<br>0010<br>0000<br>0001<br>0010 | ##205##<br>0000<br>0000<br>1001<br>0010 | ##206##<br>0000<br>0010<br>0001<br>0010 | ##207##<br>0000<br>0100<br>0001<br>0010 |
| ##208##<br>0001<br>0000<br>0100<br>0001 | ##209##<br>0000<br>1000<br>0000<br>0101 | ##210##<br>0001<br>0000<br>0101<br>0000 | ##211##<br>0001<br>0100<br>0001<br>0000 | ##212##<br>0000<br>1000<br>0100<br>0001 | ##213##<br>0010<br>0000<br>0100<br>0001 | ##214##<br>0010<br>1000<br>0001<br>0000 | ##215##<br>1010<br>0000<br>0001<br>0000 |
| ##216##<br>0001<br>0100<br>0000<br>0010 | ##217##<br>0001<br>0100<br>0000<br>0001 | ##218##<br>0001<br>0000<br>0001<br>0010 | ##219##<br>0001<br>0100<br>1000<br>0000 | ##220##<br>0010<br>1000<br>0000<br>0001 | ##221##<br>0010<br>0100<br>0000<br>0001 | ##222##<br>1000<br>0000<br>0001<br>0010 | ##223##<br>1000<br>0100<br>0001<br>0000 |
| ##224##<br>0100<br>0010<br>0000<br>0001 | ##225##<br>0000<br>0000<br>1000<br>0101 | ##226##<br>0100<br>0000<br>0001<br>1000 | ##227##<br>0000<br>0000<br>1001<br>0100 | ##228##<br>0000<br>0010<br>0000<br>1001 | ##229##<br>0000<br>0010<br>0000<br>0101 | ##230##<br>0000<br>0010<br>0001<br>1000 | ##231##<br>0000<br>0010<br>0001<br>0100 |
| ##232##<br>0100<br>0000<br>1000<br>0001 | ##233##<br>0000<br>0010<br>1000<br>0001 | ##234##<br>0100<br>0000<br>1001<br>0000 | ##235##<br>0000<br>0010<br>1001<br>0000 | ##236##<br>0000<br>0100<br>0000<br>1001 | ##237##<br>0010<br>0000<br>1001<br>0000 | ##238##<br>1000<br>0010<br>0001<br>0000 | ##239##<br>1000<br>0000<br>1001<br>0000 |

| MAPPING TECHNIQUE \ HAMMING DISTANCE | 1 | 2 | 3 | 4 | 5 | 6 | 7 | 8 |
|---|---|---|---|---|---|---|---|---|
| STRAIGHT | 556 | 1026 | 1250 | 1316 | 918 | 412 | 102 | 18 |
| FIRST EMBODIMENT | 1100 | 1944 | 1598 | 648 | 122 | 18 | 2 | 0 |
| SECOND EMBODIMENT | 1162 | 2014 | 1612 | 572 | 90 | 40 | 0 | 0 |

DATA MODULATING DEVICE AND METHOD THEREOF

The present application claims priority to Japanese Patent Application JP 2009-028381 filed in the Japan Patent Office on Feb. 10, 2009, the entire content of which is hereby incorporated by reference.

BACKGROUND OF THE INVENTION

1. Field of the Invention

The present invention relates to a data modulating device and method thereof for obtaining recorded modulation code using block data by performing balance encoding after LDPC encoding.

2. Description of the Related Art

Hologram Recording/Reproducing Method

As disclosed in Japanese Unexamined Patent Application Publication No. 2007-79438 for example, a hologram recording/reproducing method for executing recording of data using a hologram format has been in common use. Other examples of the related art include that disclosed in Japanese Unexamined Patent Application Publication Nos. 2007-188576 and 2005-302079. With the hologram recording/reproducing method, at the time of recording, signal light to which spatial light intensity modulation (intensity modulation) has been applied according to data to be recorded, and reference light to which a predetermined light intensity pattern is given, are generated, and these are irradiated on a hologram recording medium, thereby forming a hologram on a recording medium to execute recording of data.

Also, at the time of reproducing, the reference light is irradiated on a recording medium. Thus, the same reference light as at the time of recording (having the same intensity pattern as at the time of recording) is irradiated on the hologram formed according to irradiation of signal light and reference light at the time of recording, thereby obtaining diffracted light according to a recorded signal light component. That is to say, the reproduced image corresponding to data thus recorded (reproduced light) is obtained. The reproduced light thus obtained is detected by an image sensor, for example, such as a CCD (Charge Coupled Device) sensor, a CMOS (Complementary Metal Oxide Semiconductor) sensor, or the like, thereby reproducing recorded information.

Also, as such a hologram recording/reproducing method, the so-called coaxial method has been in use wherein reference light and signal light are disposed on the same optical axis, and these are irradiated on a hologram recording medium via an objective lens.

FIGS. 38, 39A, and 39B are diagrams for describing hologram recording/reproducing by the coaxial method, wherein FIG. 38 schematically illustrates a recording technique, and FIGS. 39A and 39B schematically illustrate a reproducing technique. Note that FIGS. 38, 39A, and 39B exemplify a case where a reflection-type hologram recording medium 100 includes a reflection film.

First, with a hologram recording/reproducing system, an SLM (Spatial Light Modulator) 101 is provided to generate signal light and reference light at the time of recording, and reference light at the time of reproducing, such as shown in FIGS. 38 and 39A. This SLM 101 includes an intensity modulator for executing light intensity modulation as to incident light in increments of pixels. This intensity modulator may be configured of a liquid crystal panel, for example.

At the time of recording shown in FIG. 38, signal light to which the intensity pattern corresponding to data to be recorded is given, and reference light to which a predetermined intensity pattern is given are generated according to intensity modulation of the SLM 101. With the coaxial method, spatial light modulation as to incident light is executed so that signal light and reference light are disposed on the same optical axis such as shown in the drawing. At this time, it is common for the signal light to be situated at the inner side, and reference light at the outer side thereof, such as shown in the drawing.

The signal light/reference light generated at the SLM 101 is irradiated on the hologram recording medium 100 via an objective lens 102. Thus, a hologram in which data to be recorded is reflected is formed with an interference pattern between the above signal light and the above reference light. That is to say, recording of the data is executed with formation of this hologram.

On the other hand, at the time of reproducing, such as shown in FIG. 39A, reference light is generated at the SLM 101 (at this time, the intensity pattern of reference light is the same as at the time of recording). Subsequently, this reference light is irradiated on the hologram recording medium 100 via the objective lens 102.

Thus, in response to reference light being irradiated on the hologram recording medium 100, such as shown in FIG. 39B, diffracted light according to the hologram formed on the hologram recording medium 100 is obtained, and thus, a reproduced image (reproduced light) regarding recorded data is obtained. In this case, the reproduced image is guided to an image sensor 103 via the objective lens 102 as the reflected light from the hologram recording medium 100, such as shown in the drawing.

The image sensor 103 optically receives the reproduced image guides as described above in increments of pixels to obtain the electrical signal corresponding to the light-receiving quantity for each pixel, thereby obtaining a detection image regarding the above reproduced image. Thus, the image signal detected by the image sensor 103 becomes a readout signal regarding recorded data.

Note that, as can be understood from the description in FIGS. 38, 39A, and 39B, with the hologram recording/reproducing method, data is written in/read out in increments of signal light. That is to say, with the hologram recording/reproducing method, a sheet of hologram formed with one-time interference between signal light and reference light (referred to as "hologram page") is the minimum increments of writing in/reading out.

Balance Code

Now, as can be understood from the above description, with the hologram recording/reproducing system, data (channel data) to be recorded finally in a recording medium is in a state of being arrayed two-dimensionally.

Thus, with the hologram recording/reproducing system for arraying channel data two-dimensionally to execute recording, so-called balance code is preferably used, wherein a data pattern is represented with a block made up of vertical multiple bits×horizontal multiple bits.

Balance code is recorded modulation code satisfying a condition wherein l bit of m bits making up the above block is "1", and the remaining m−l bits are all "0", and a data pattern is represented with a combination between a position where bit "1" is disposed and a position where bit "0" is disposed within the block.

For example, if encoding parameter E(m, l, k) is E(16, 3, 8), 8 bits of a data string to be processed (let us say that this is simply user data) are converted into 16-bit (4×4) balance code. At this time, i=3, and accordingly, the number of data patterns that can be represented with balance code in this case is 560 kinds since a combination where 3 bits are selected from 16 bits is 16C3.

Here, data patterns that can be represented with user data of k=8 bits are $2^8$, and accordingly, 256 kinds. That is to say, in this case, 256 patterns of the above 560 kinds of balance code patterns are correlated to each of 256 kinds of data patterns that can be represented with 8-bit user data, whereby encoding/decoding of balance code can be executed.

At this time, the number of data patterns that 9-bit user data can represent is $2^9$, i.e., 512 kinds. Accordingly, according to balance code of m=16 and l=3 that can represent 560 kinds of data patterns as described above, up to k=9 bits can be handled.

However, with the hologram recording/reproducing system, parameter E(m, l, k) of encoding is set intentionally so as to generate a redundant balance code pattern. This is for enabling the following.

- Reduction of check errors is realized by narrowing down patterns to be used for encoding to patterns of which the similarity of mutual patterns is low.
- Only patterns where "1" does not continue horizontally and vertically within the block are used for encoding to reduce the low-frequency component of special frequency within a read signal (image).

Identification of Channel Data

In order to execute decoding of balance code described above, identification of bit "0"/"1" has to be executed from the amplitude of a read signal for each pixel. That is to say, this is data identification. With the hologram recording/reproducing system, a technique called "sorting check" and "correlation check" is preferably used for identification of channel data.

Here, "threshold check" is the easiest to use technique, wherein bit "1" is identified when the amplitude of a read signal is greater than a predetermined threshold, and bit "0" is identified when the amplitude of a read signal is smaller than a predetermined threshold. However, with the hologram recording/reproducing system, change in the amplitude of a read signal within a page is relatively great, and setting of a threshold for "threshold check" is very difficult. That is to say, from this point of view, using threshold check with the hologram recording/reproducing system causes increase in data identification errors, and it is very difficult to execute suitable data identification.

From such, a technique such as "sorting check" or "correlation check" such as described below is preferably used as an identification method of channel data with the hologram recording/reproducing system.

The procedure of "sorting check" will be shown below.

1) m bits (pixels) making up one balance code block are represented by numbers of #1 through #m in descending order of the amplitude values of read signals (ranking).

2) The bit values of the upper l pixels (#1 through #l) are determined to be "1", and the bit values of other pixels (#l+1 through #m) are determined to be "0".

On the other hand, "correlation check" is a technique wherein correlativity between an actually obtained read signal and each of $2^k$ kinds of possibly-recorded balance code patterns is checked, and a pattern correlated most with the read signal is output as an identification result.

For example, if we say that the amplitude of a read signal has been A/D-converted into 8 bits (0 through 255), the procedure of "correlation check" will be shown as below.

1) With regard to each of $2^k$ kinds of possibly-recorded balance code patterns,

- The amplitude reference value of a pixel of which the bit value is "1" is set to 191, and the square of difference between this amplitude reference value and the amplitude value of the corresponding pixel within the read signal is computed.
- The amplitude reference value of a pixel of which the bit value is "0" is set to 64, and the square of difference between this amplitude reference value and the amplitude value of the corresponding pixel within the read signal is computed.
- The sum of this squared error is calculated each for m pixels.

Thus, $2^k$ evaluated values are obtained, which represent correlativity between each of $2^k$ kinds of possibly-recorded balance code patterns and an actually obtained read signal.

2) The evaluated values regarding each of the balance code patterns computed in the above 1) are compared, and the most reliable pattern, i.e., the pattern where the above evaluated value becomes the minimum is output as an identification result.

The technique such as the above "sorting check" or "correlation check" differs from the technique of "threshold check", and has a great advantage wherein amplitude fluctuation within a page is hardly influenced. In particular, sorting check is a technique only for determining that the upper l pixels having a great amplitude are determined to be "1", and pixels other than those are determined to be "0", and accordingly, has an advantage wherein the processing load is small, and the circuit scale can be reduced to a small scale. However, on the other hand, sorting check determining bit "1" or "0" in accordance with simply amplitude rank order includes a problem in that there is concern wherein an identification result that is not a code word may be obtained.

On the other hand, correlation check is the most reliable check technique wherein the most reliable code word is selected from possibly-recorded code words as an identification result, and accordingly, there is no concern that an identification result that is not a code word might be obtained, and identification performance is markedly advanced. However, the evaluated value of reliability has to be computed regarding all the possibly-recorded patterns, which causes a problem wherein the processing load becomes great, and the circuit scale also becomes great.

LDPC Code

While there has been such hologram recording/reproducing technology as described above, LDPC (Low Density Parity Check) code (low-density parity check code) has also been in use as one kind of error correction code. LDPC code is code belonging to a linear code category similar to error correction code according to the related art such as Reed-Solomon code or the like, which is a generally recognized fact. A check bit string generated in accordance with a certain rule is suitably added to transmission information (recorded information), whereby information can be decoded with high probability from a signal deteriorated due to influence of noise over a communication path (recording/reproducing channel).

LDPC code has powerful error correction capability, but practical realization has been thought to be difficult due to the sheer number of calculations involved. However, with the advent of turbo code serving as repetitive correction code, it has been found that implementation as a high-performance high-speed circuit is feasible, and in recent years, this has received attention.

An outline of LDPC encoding/decoding will be described with reference to FIGS. 40A and 40B. FIG. 40A schematically illustrates an outline of processing to be executed on the information transmission (recording) side (LDPC encoding processing). First, with LDPC, a bit to be encoded is generally called "information bit". Also, a predetermined check matrix (represented by H) is determined at the time of executing LDPC encoding.

With encoding, first a "check bit string" (i.e., parity) is generated based on an input information bit string and the above check matrix H. This "check bit string" is generated and added for every certain number of information bits. In the drawing, a case is exemplified wherein "check bits" are generated and added for every 8 bits of information bits. At this time, data increments to which check bits are added, i.e., increments of "information bits+check bits" become "one LDPC block" that is the minimum increments of LDPC encoding/decoding.

Thus, data LDPC-encoded (LDPC code string) is transmitted (or recorded in a recording medium) to the communication path. It should be noted that with actual encoding, the number of bits of one LDPC block is greater, for example, for information bits of around several thousand bits, around several thousand check bits (parity) are also added.

FIG. 40B schematically illustrates outline of processing (decoding processing of LDPC code) on the information reception (recording) side.

With decoding of LDPC code, first such as shown in <1>, the "log likelihood ratio" of each bit making up a LDPC code string is computed from the amplitude value of each bit of a reception (read) signal. This "log likelihood ratio" is used as information representing the likelihood of the value of each bit ("0" or "1"), which is a generally recognized fact.

Now, the above log likelihood ratio will be roughly described with reference to FIG. 41. The log likelihood ratio becomes a value depending on a communication path model, which is a generally recognized fact. For example, in the case of a memoryless communication path (a communication path wherein there is no correlation between transmission errors of transmission bit strings), if we say that a transmission signal is $x_n$, and a reception signal is $y_n$, the log likelihood ratio (represented by $\lambda_n$) can be computed according to conditional probability $P(y_n|x_n)$ of a known communication path as follows.

$$\lambda_n = \log_e(P(y_n|x_n=+1)/P(y_n|x_n=-1)$$

FIG. 41 exemplifies LDPC encoding and decoding models in the case of assuming a common AWGN (Addition White Gaussian Noise) communication path. In the case of the AWGN communication path, the conditional probability of the communication path can be replaced as follows.

$$P(y_n|x_n=b)=1/\sqrt{(2\pi\sigma^2)}\exp(-(y_n-b)2/(2\sigma^2))$$

where $\sigma^2$ is distribution of Gaussian noise.

Here, b in the above expression takes values of +1 and −1. Accordingly, upon computing $\log_e(P(y_n|x_n=+1)/P(y_n|x_n=-1)$, the log likelihood ratio $\lambda_n$ in this case is as follows.

$$\lambda_n = 2y_n/\sigma^2$$

Hereafter, the log likelihood ratio will be abbreviated as LLR. Also, LLR for each bit will be represented by as λ(n).

Returning to FIG. 40B, computing LLR (λ(n)) of each bit from the reception (read) signal, such as shown in <2>, based on λ(n) and a predetermined check matrix (H), estimates each bit value of information bits for each LDPC block (LDPC decoding). That is to say, such as shown in FIG. 41, after LLR (λ(n)) of each bit is computed from the reception (read) signal, each value of information bits within one LDPC block is estimated (decoded) according to the LDPC decoding algorithm based on λ(n) and the predetermined check matrix H.

Here, the LDPC decoding algorithm is an algorithm based on a so-called MAP decoding method. With the MAP decoding method, a conditional probability representing a probability wherein when transmitting a code word x, a reception word y is received (the previous $P(y_n|x_n)$; also referred to as posterior probability) is computed, and a symbol of "0" or "1" where this conditional probability P is the maximum is taken as an evaluated value thereof. As a result thereof, there is a feature in that error after decoding becomes minimal, and regarding the point of bit error rate, this method is an optimal decoding technique.

However, in the case of executing a procedure for computing posterior probability for each bit by adding the value of posterior probability $P(y_n|x_n)$ regarding all the code words in accordance with a definition without change, the amount of computations becomes an astronomical figure, and practical realization is very difficult. Therefore, as an LDPC decoding algorithm for reducing this computation amount, for example, a sum-product algorithm has been proposed. This sum-product algorithm can be regarded as an algorithm approximate to the MAP decoding method, and markedly reduces the amount of calculations by sacrificing some computational precision of posterior probability for each bit. Specifically, with the sum-product algorithm, computation relating to posterior probability is classified into two processes of "variable node processing" and "check node processing", and repetitive processing is executed therebetween. Improvement in estimation precision is realized by repeating such repetitive processing.

FIG. 42 illustrates a diagram schematically describing the content of the LDPC decoding processing by the sum-product algorithm, wherein (a) in FIG. 42 illustrates a flowchart illustrating the content of the decoding processing, and (b) in FIG. 42 illustrates a conceptual diagram regarding variable nodes and check nodes.

Here, "A(m)" in (b) in FIG. 42 represents a variable node group to be connected to a check node m. Also, "A(m)\n" represents a group difference obtained by removing n from the group A(m). Similarly, "B(n)" represents a check node group to be connected to a variable node n, and "B(n)\," represents a group difference obtained by removing m from the group B(n).

Also, a function f(x) is a function defined as $f(x)=\log_e(e^x+1/e^x-1)$ such as shown in the drawing, and f·f has a feature serving as identity mapping. A function sign(x) is a code function wherein a value of +1 is taken when x is positive, a value of −1 is taken when x is negative, and a value of 0 is taken when x is 0.

Note that though not clearly illustrated in this drawing, with the decoding processing in this case, computation is started with the initial values of both of "a message $\alpha_{mn}$ from a check node m to a variable node n" and "a message $\beta_{nm}$ from a variable node n to a check node m" as "0".

In (a) in FIG. 42, processing in step S1001 is processing called check node processing. Also, processing in step S1002 is processing called variable node processing.

Here, $L_n$ computed in step S1003 (estimated bit determining processing) is an approximate value of amount called "log posterior probability ratio" relating to the above posterior probability P. The absolute value of this $L_n$ represents the reliability of estimation, and represents that the greater this value is, the higher the reliability of estimation. As shown in the drawing, "0" is determined to be the value of an estimated bit in the case that the value of this $L_n$ is positive $(0(L_n>0))$. Also, "1" is determined to be the value of an estimated bit in the case that the value of this $L_n$ is negative $(0(L_n<0))$.

According to the flowchart in (a) in FIG. 42, the value of LLR ($\lambda_n$ in the drawing) of each bit computed from the reception (read) signal can be found to be used for computation of the value of $L_n$. Also, the value of LLR is also used for computation of the value of $\beta_{nm}$ in step S1002.

Also, parity check processing in step S1004 following the estimation bit determining processing in the above step S1003 is processing determining whether or not the determined estimated bit series satisfy parity check conditions. With the parity check processing in step S1004, a predetermined check matrix H is used.

In the case that the estimated bit series satisfy the parity check conditions, the estimated bit series are output as the estimated values of transmitted (recorded) information bit series (S1005). On the other hand, in the case that the estimated bit series do not satisfy the parity check conditions, from the check node processing in step S1001 to the estimated bit determining processing in step S1003 is executed again.

Thus, with the decoding processing by the sum-product algorithm, the check node processing, variable node processing, and estimated bit determining processing are taken as one round of processing, and this round of processing is repeated until the estimated bit series determined in this round of processing satisfy the parity check conditions.

Note that the LDPC decoding algorithm including such a sum-product algorithm is a technique in general use. For detailed content of the LDPC decoding algorithm, refer to "Practical Configuration Method of LDPC Code (First)", NIKKEI ELECTRONICS, Aug. 15, 2005, pp 126-130, and "Practical Configuration Method of LDPC Code (Second)", NIKKEI ELECTRONICS, Aug. 29, 2005, pp 127-132, and the like.

Here, it is important that at the time of decoding of LDPC code, the log likelihood ratio (LLR) of each bit making up LDPC code should be obtained from the reception (read) signal. That is to say, in the event that the LLR of each bit of LDPC code is thus obtained from the reception (read) signal, decoding processing in accordance with the LDPC decoding algorithm such as the above sum-product algorithm or the like is executed using a predetermined check matrix (known information), whereby the values of information bits can be decoded.

SUMMARY OF THE INVENTION

Here, with the hologram recording/reproducing system as well, in order to improve reproducing performance, it can be conceived to apply LDPC such as described above. However, with the hologram recording/reproducing system, channel data is commonly recorded, modulated, and encoded.

As can be understood from the above description, LDPC code decoding processing according to the related art assumes a case where channel data is transmitted without being recorded, modulated, and encoded, and accordingly, even if the decoding processing described above is applied to a hologram recording/reproducing system where channel data is arrayed two-dimensionally, LDPC code is not suitably decoded.

Description will be made specifically regarding this point with reference to FIG. 43. First, as can be understood from the above description, in the case of a hologram recording/reproducing system, from a relation wherein a hologram page where channel data is arrayed two-dimensionally is recorded by irradiating signal light (and reference light), balance code is used as channel data code suitable for this.

Thus, from a relation wherein balance code is used as channel data, in the case of a hologram recording/reproducing system, at the time of recording, an information bit string is subjected to LDPC encoding such as shown in the drawing, and then the LDPC code string obtained as a result thereof is subjected to balance encoding. In the drawing, a case is exemplified wherein the LDPC code string is subjected to balance encoding with m=16, and k=8.

Multiple m-bit blocks obtained in order according to such balance encoding (referred to as one balance code block) are arrayed within signal light (page mapping), and this signal light and reference light are irradiated on a hologram recording medium, thereby executing recording of a hologram page.

Here, as described above, at the time of decoding of LDPC code, the LLR of each bit of the LDPC code has to be obtained, but as can be clearly seen from the drawing, in the case of a hologram recording/reproducing system, "the LLR of each bit of a read signal of channel data=the LLR of each bit of LDPC code" does not hold. That is to say, as with the LLR computation technique according to the related art as described above, the LLR of each bit of LDPC code is not readily computed directly from the read signal.

Also, with a hologram recording/reproducing system wherein channel data is subjected to recorded modulation encoding with balance code, the LLR computation technique itself has to be changed from the technique according to the related art.

That is to say, with the case according to the related art assuming that channel data is transmitted serially (with one-dimensional array), the LLR ($\lambda_n$) of each bit should have been calculated with $\lambda_n=2y_n/\sigma^2$ according to the property of a transmission path, but in the case that channel data is subjected to recorded modulation encoding with balance code, even if the above computation technique according to the related art is applied to the hologram recording/reproducing system without change, it is clearly seen that suitable LLR is not obtained.

In light of these points, in the case that an error correction function by LDPC code is added to a hologram recording/reproducing system wherein balance code is used as a recorded modulation code, LDPC decoding is not suitably executed when simply applying decoding processing thereto with the same technique as the technique according to the related art without change.

Here, in the case that LDPC has been applied to the hologram recording/reproducing system, in order to compute the LLR of each bit of an LDPC code string from a read signal, as described later with reference to FIG. 15 and the like, a technique can be conceived wherein sorting check of read signals is repeated while switching amplitude rank order between certain pixels in order, and the LLR of each bit is obtained with regarding whether or not a value has been inverted according to a decoding result of balance code obtained as a result of each sorting check as determination criterion.

Specifically, in the event that a value has been inverted with the decoding result of balance code as a result of switching amplitude rank order, this means that reliability thereof is low as the value of a bit of which the value has been inverted, and accordingly, the likelihood of the bit thereof has to be set so as to be small. Conversely, with regard to a bit of which the value has not been inverted according to the decoding result even if the amplitude rank order is switched, the value of this bit is more reliable, and accordingly, the likelihood of the bit thereof has to be set so as to be great.

Thus, with regard to a read signal in increments of block data, an LLR is calculated so that switching of amplitude rank order is repeated to obtain the decoding result there, and at the process thereof, a value of which the absolute value is smaller is given to a bit of which the value has been inverted at the time of earlier switching of amplitude rank order as an LLR, and a value of which the absolute value is greater is given to a bit of which the value has not been inverted even in the event of repeating switching of amplitude rank order as an LLR.

At this time, the value (the absolute value) of an LLR is computed, for example, as shown in FIG. 16 which will be described later, based on the amplitude difference between predetermined certain pixels of a read signal. According to such a technique, in the case of using balance code as recorded modulation code, the LLR of each bit of an LDPC code string can be computed from the read signal.

An important point with the above LLR computation technique is to give an LLR according to a smaller absolute value to a bit of which the value has been inverted immediately by a decoding result, and to give an LLR according to a greater absolute value to a bit of which the value has not been inverted, along with switching of amplitude rank order of the read signal. That is to say, thus, an LLR in which reliability of the value of each bit is reflected well can be obtained.

However, this holds in the case of assuming that the number of bits of which the values are inverted by a decoding result along with one-time amplitude rank order switching is small, such as shown in FIG. 15. That is to say, for example, if we consider a case where the values of all 8 bits are inverted along with one-time amplitude rank order switching, in this case, difference is not readily given to the likelihood of each bit, and consequently, a suitable LLR is not readily computed.

Here, the content of a data conversion table is used for balance encoding/decoding to determine how many bits are inverted by a decoding result along with amplitude rank order switching. That is to say, it is important how to determine the correspondence relation between each of k-bit data patterns and each piece of m-bit block data (how data is mapped) as the content of this data conversion table.

As can be understood from the above description, in the case of assuming that an LLR computation technique suitable for the above hologram recording/reproducing system (a technique for providing the LLR corresponding to regarding whether there is an inverted bit value due to a decoding result along with amplitude rank order switching) is used, an LLR may not be suitably computed in the event that nothing is taken into consideration regarding mapping of the data conversion table used for balance encoding/decoding. That is to say, there is a possibility that deterioration in LDPC decoding performance may result.

It has been found to be desirable to provide a data modulating device having the following configuration.

Specifically, a data modulating device according to an embodiment of the present invention includes an LDPC encoding unit configured to execute LDPC encoding; and a balance encoding unit configured to input a data string subjected to encoding by the LDPC encoding unit as data to be encoded, and convert k bits of this data to be encoded into balance code made up of m-bit block data; with the balance encoding unit executing balance encoding of the data to be encoded using a data conversion table subjected to mapping so that a set of the k-bit data patterns of which the Hamming distance is 1 corresponds to a set of block data of which the Hamming distance is 2.

Here, as described above, in the case of using the LLR computation method for providing the log likelihood ratio (LLR) corresponding to regarding whether or not there is inverting of a bit value due to a decoding result along with amplitude rank order switching, when executing one-time amplitude rank order switching regarding a read signal of balance code (of block data making up m bits, l bit is "1", and the remaining m−l bits are "0"), the number of bits of which the values differ between the data before switching and the data after switching, is absolutely not one but two. That is to say, the Hamming distance between data before and after switching is absolutely "2".

As described above, an important point at the time of causing the likelihood of each bit to differ along with amplitude rank order switching is in that the number of bits of which the values of decoding results are inverted along with one-time rank order switching is small. That is to say, ideally, the number of bits to be inverted at this time is preferably "1".

In order to realize this, such as the above present invention, a data conversion table may be used wherein a set of k-bit data patterns of which the Hamming distance is 1 is mapped so as to be correlated to a set of block data of which the Hamming distance is 2. In the case of using such a data conversion table, between a k-bit data pattern serving as a decoding result of block data before amplitude rank order switching, and a k-bit data pattern serving as a decoding result of block data after amplitude rank order switching, the Hamming distance thereof may be arranged to become 1. In other words, the number of bits of which the values are inverted of decoding results along with one-time amplitude rank order switching may be arranged to become 1.

According to the above configuration, the values are inverted of decoding results along with one-time amplitude rank order switching may be arranged to become 1. Thus, as described above, in the case of using a technique for providing the LLR according to whether or not there is an inverted bit value serving as a decoding result along with amplitude rank order switching, computation of an LLR may be arranged to be suitably executed. That is to say, in this result, LDPC (Low Density Parity Check) decoding performance may be arranged to further improve.

BRIEF DESCRIPTION OF THE DRAWINGS

FIG. 4 is a diagram illustrating an example of a conversion table according to straight mapping (1/7);

FIG. 5 is a diagram illustrating an example of the conversion table according to straight mapping (2/7);

FIG. 6 is a diagram illustrating an example of the conversion table according to straight mapping (3/7);

FIG. 7 is a diagram illustrating an example of the conversion table according to straight mapping (4/7);

FIG. 8 is a diagram illustrating an example of the conversion table according to straight mapping (5/7);

FIG. 9 is a diagram illustrating an example of the conversion table according to straight mapping (6/7);

FIG. 10 is a diagram illustrating an example of the conversion table according to straight mapping (7/7);

FIG. 16 is a diagram for describing a specific example of an LLR computation technique premised with the present embodiment;

FIG. 22 is a diagram illustrating a distribution (at the time of straight mapping, at the time of mapping according to the first embodiment) of Hamming distance between data patterns corresponding to a set of block data of which the Hamming distance is 2;

Figure 26:
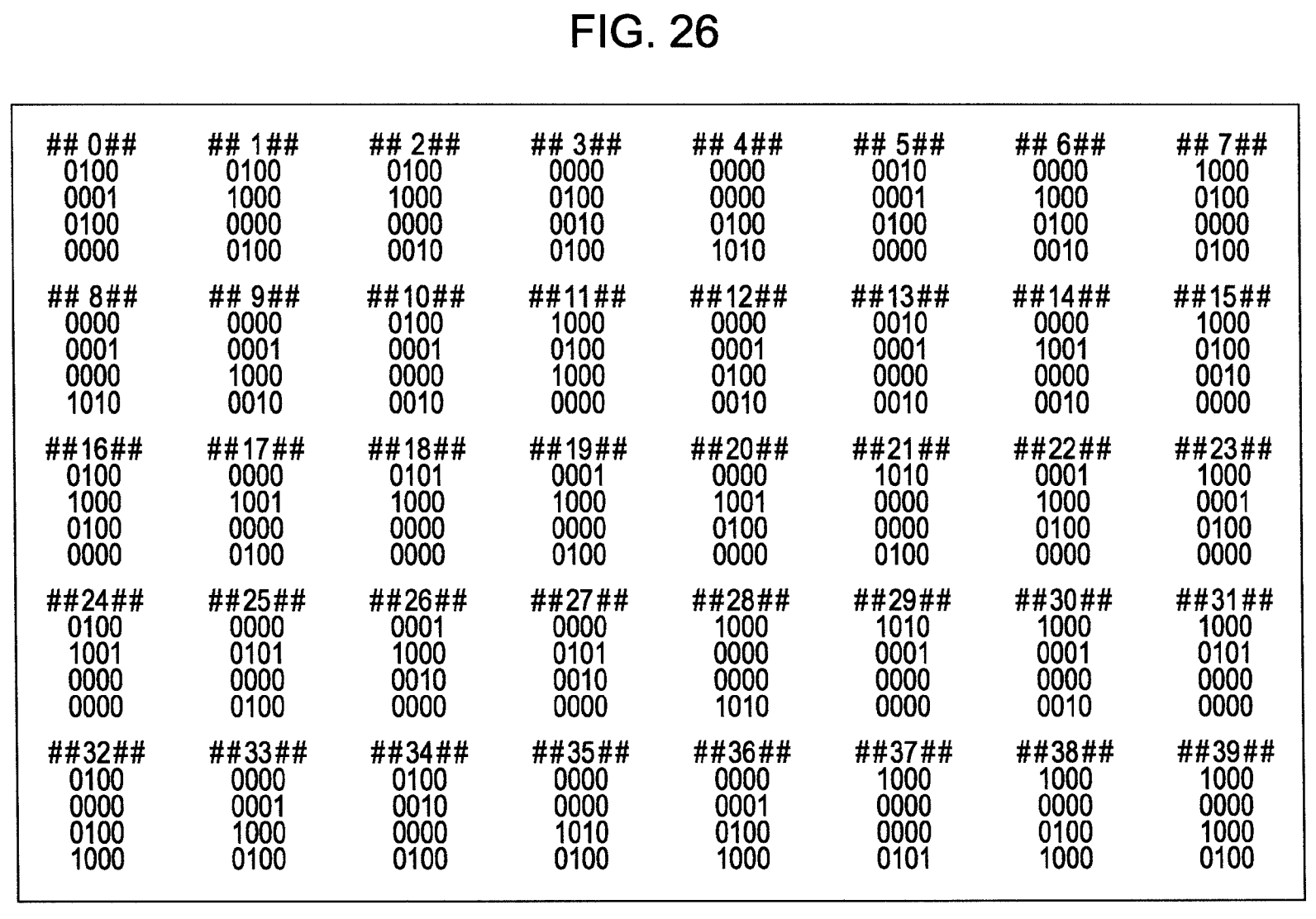

FIG. 26 is a diagram illustrating an example of an encoding/decoding table according to a mapping technique according to a second embodiment (1/7);

FIG. 27 is a diagram illustrating an example of the encoding/decoding table according to the mapping technique according to the second embodiment (2/7);

FIG. 28 is a diagram illustrating an example of the encoding/decoding table according to the mapping technique according to the second embodiment (3/7);

FIG. 29 is a diagram illustrating an example of the encoding/decoding table according to the mapping technique according to the second embodiment (4/7);

FIG. 30 is a diagram illustrating an example of the encoding/decoding table according to the mapping technique according to the second embodiment (5/7);

FIG. 31 is a diagram illustrating an example of the encoding/decoding table according to the mapping technique according to the second embodiment (6/7);

Figure 32:
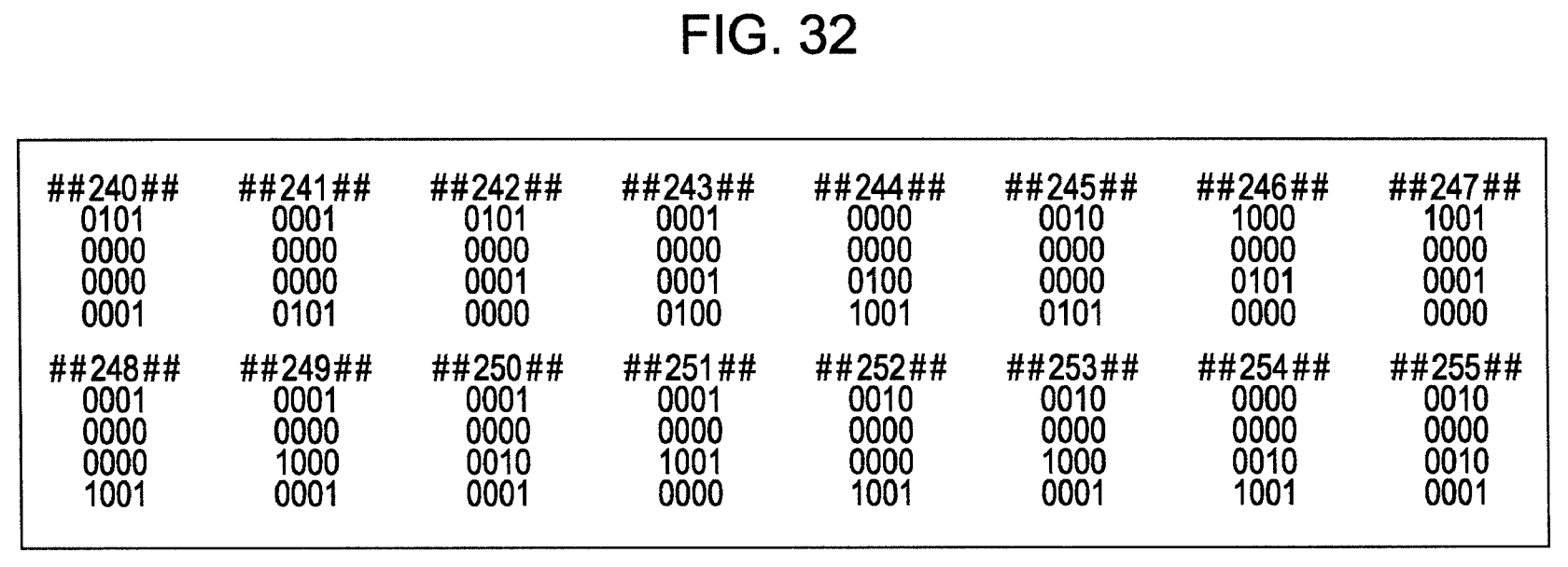

FIG. 32 is a diagram illustrating an example of the encoding/decoding table according to the mapping technique according to the second embodiment (7/7);

FIG. 34 is a diagram illustrating a distribution (at the time of straight mapping, at the time of mapping according to the first and second embodiments) of Hamming distance between data patterns corresponding to a set of block data of which the Hamming distance is 2;

DESCRIPTION OF THE PREFERRED EMBODIMENTS

Modes for carrying out the present invention (hereafter, referred to as embodiments) will be described below. Note that description will be made in accordance with the following sequence.

1. Premised LLR Computation Technique
1-1. Configuration of Hologram Recording/Reproducing Device
1-2. Sparse Code
1-3. Outline of LDPC Encoding/Decoding
1-4. Specific LLR Computation Technique
1-4-1. Basic Concept
1-4-2. Example of LLR Computation Technique
1-5. Processing Procedure
1-6. Simulation Results
2. First Embodiment
2-1. Mapping Technique Serving as First Embodiment
2-2. Processing Procedure
2-3. Configuration for Realizing Data Modulation Serving as Embodiment
2-4. Validity of Technique According to First Embodiment
3. Second Embodiment
3-1. Mapping Technique Serving as Second Embodiment
3-2. Processing Procedure
3-3. Validity of Technique According to Second Embodiment
4. Modifications

1. Premised LLR Computation Technique

1-1. Configuration of Hologram Recording/Reproducing Device

First, before describing a mapping technique serving as an embodiment, description will be made regarding an LLR (Log Likelihood Ratio) computation technique suitable for a case where balance code is used as recorded modulation code.

Figure 1:
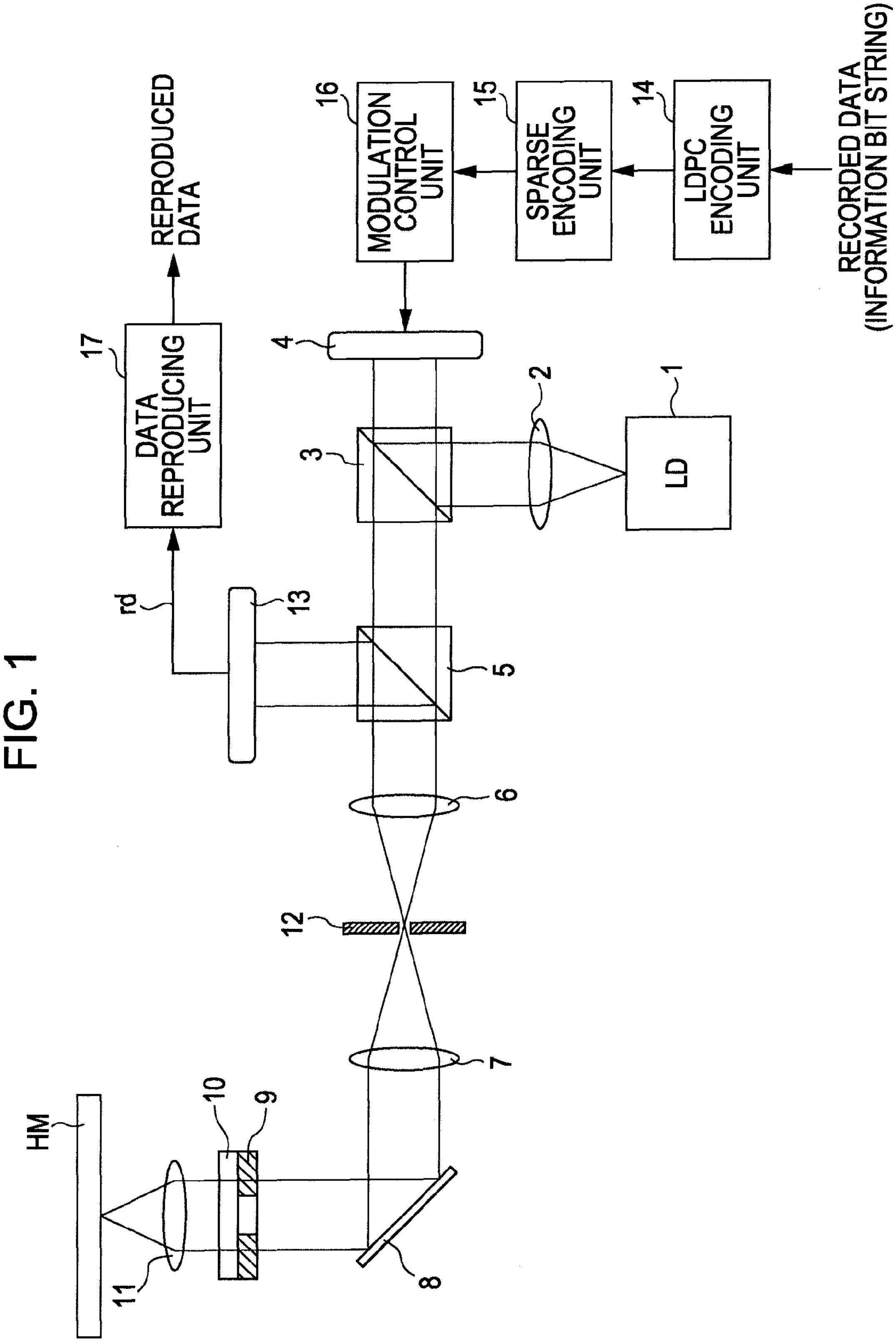
FIG. 1 is a diagram illustrating the internal configuration of a recording/reproducing device according to an embodiment.

FIG. 1 is a diagram illustrating the internal configuration of a recording/reproducing device for realizing the above LLR computation technique. Hereafter, the hologram recording/reproducing device will also be simply referred to as a recording/reproducing device.

In FIG. 1, first, a hologram recording medium HM in the drawing is a recording medium where recording of information is executed with an interference pattern between signal light and reference light.

With regard to this hologram recording medium HM, a material such as photopolymer or the like is selected as a recording material thereof, whereby recording of information can be executed by change in the refractive index corresponding to an intensity distribution of illumination light being caused, and thus, recording of information is executed with an interference pattern between signal light and reference light. Also, the hologram recording medium HM in this case is a reflection-type recording medium including a reflection film.

The hologram recoding medium HM is held by a spindle motor not shown in the drawing within the recording/reproducing device shown in FIG. 1 in a manner capable of rotary driving. With the recording/reproducing device, light for recording/reproducing of a hologram (recording/reproducing light) with a laser diode (LD) 1 in the drawing as a light source is irradiated on the hologram recording medium HM in such a held state.

In the drawing, an optical pickup including an optical system for irradiating the above recording/reproducing light is illustrated by being surrounded with a dashed line. Specifically, within the pickup, there are provided a laser diode 1, a collimation lens 2, a polarized beam splitter 3, an SLM 4, a polarized beam splitter 5, a relay lens 6, an aperture 12, a relay lens 7, a mirror 8, a partial diffraction element 9, a quarter-wave plate 10, an objective lens 11, and an image sensor 13.

The above laser diode 1 outputs, for example, a violet-blue laser beam of wavelength $\lambda$=405 nm or so as hologram recording/reproducing light. The laser beam emitted from this laser diode 1 is input to the polarized beam splitter 3 via the collimation lens 2.

The polarized beam splitter 3 transmits, of orthogonal linear polarized components of the input laser beam, one of the linear polarized component, and reflects the other linear polarized component. For example, in this case, an arrangement is made wherein a p polarized component is transmitted, and an s polarized component is reflected. Accordingly, of the laser beam input to the beam splitter 3, only the s polarized component thereof is reflected, and is guided to an SLM 4.

The above SLM 4 is configured so as to include, for example, a reflection-type liquid crystal element serving as FLC (Ferroelectric Liquid Crystal), and is configured so as to control the polarization direction in increments of pixels as to incident light (hereafter, also referred to as "incoming beam").

This SLM changes the polarization direction of the incoming beam 90 degrees for each pixel in response to the driving signal from a later-described modulation control unit 16, or subjects the incoming beam to spatial light modulation so as to stabilize the polarization direction of incident light. Specifically, an arrangement is made wherein polarization direction control is executed in increments of pixels according to the driving signal so that the angle variation in the polarization direction is 90 degrees regarding a pixel of which the driving signal is turned on, and is 0 degree regarding a pixel of which the driving signal is turned off.

As shown in the drawing, the outgoing beam from the SLM (the beam reflected at the SLM 4) is input to the polarized beam splitter 3 again.

Here, the recording/reproducing device shown in FIG. 1 executes spatial light intensity modulation (referred to as light intensity modulation or simply intensity modulation) in increments of pixels by taking advantage of polarization direction control in increments of pixels by the SLM, and the selective transmission/reflection property of the polarized beam splitter 3 according to the polarization direction of the incoming beam.

Figure 2A:
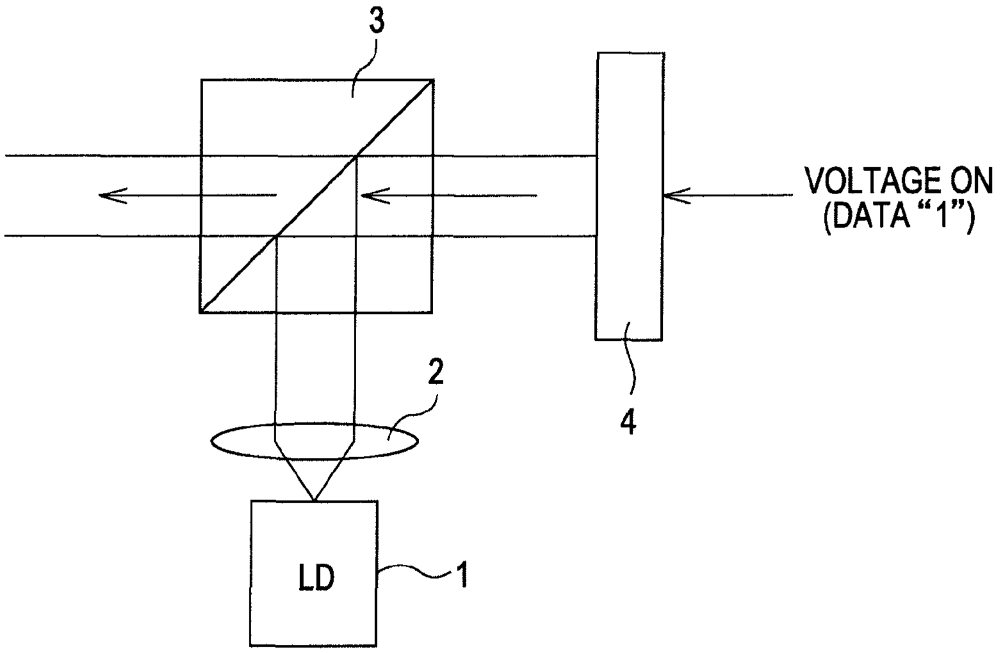
FIGS. 2A and 2B are diagrams for describing intensity modulation realized with a combination of a polarization direction control type spatial light modulator and a polarization beam splitter.
Figure 2B:
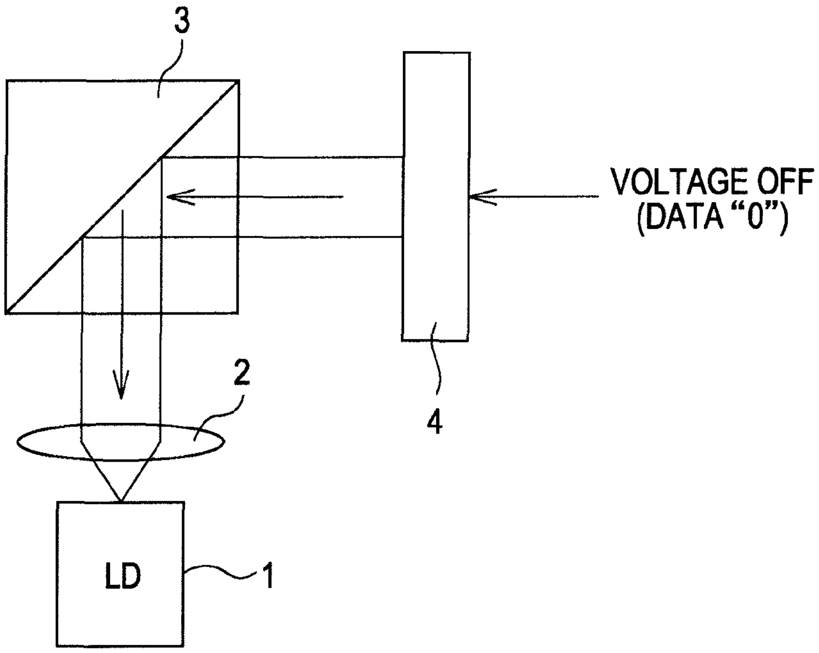

FIGS. 2A and 2B conceptually illustrate intensity modulation realized by a combination of such an SLM 4 and polarized beam splitter 3. FIG. 2A schematically illustrates a light beam state regarding ON pixel light, and FIG. 2B schematically illustrates a light beam state regarding OFF pixel light.

As described above, the polarized beam splitter 3 transmits p-polarized light, and reflects s-polarized light, and accordingly, the s-polarized light is input to the SLM 4.

Based on this premise, the light of a pixel of which the polarization direction is changed 90 degrees by the SLM 4 is input to the polarized beam splitter 3 with the p-polarized light. Thus, the ON pixel light at the SLM 4 transmits the polarized beam splitter 3, and is guided to the hologram recording medium HM side (FIG. 2A).

On the other hand, the light of a pixel of which the driving signal is off, and the polarization direction is not changed, is input to the polarized beam splitter 3 with the s-polarized light. That is to say, the OFF pixel light at the SLM 4 is reflected at the polarized beam splitter 3, and is not guided to the hologram recording medium HM side (FIG. 2B).

Thus, an intensity modulating unit for subjecting light intensity modulation in increments of pixels is made up of a combination of the SLM 4 serving as a spatial light modulator by polarization direction control, and the polarized beam splitter 3.

Here, the recording/reproducing device according to the embodiment uses the coaxial method as the hologram recording/reproducing method. That is to say, with this method, signal light and reference light are disposed on the same optical axis, and both of these are irradiated on a hologram recording medium disposed in a predetermined position via a shared projective lens, thereby executing recording of data by formation of a hologram, and at the time of reproducing, the reference light is irradiated on the hologram recording medium via the objective lens to obtain the reproduced image of a hologram, thereby executing reproducing of data.

Figure 3:
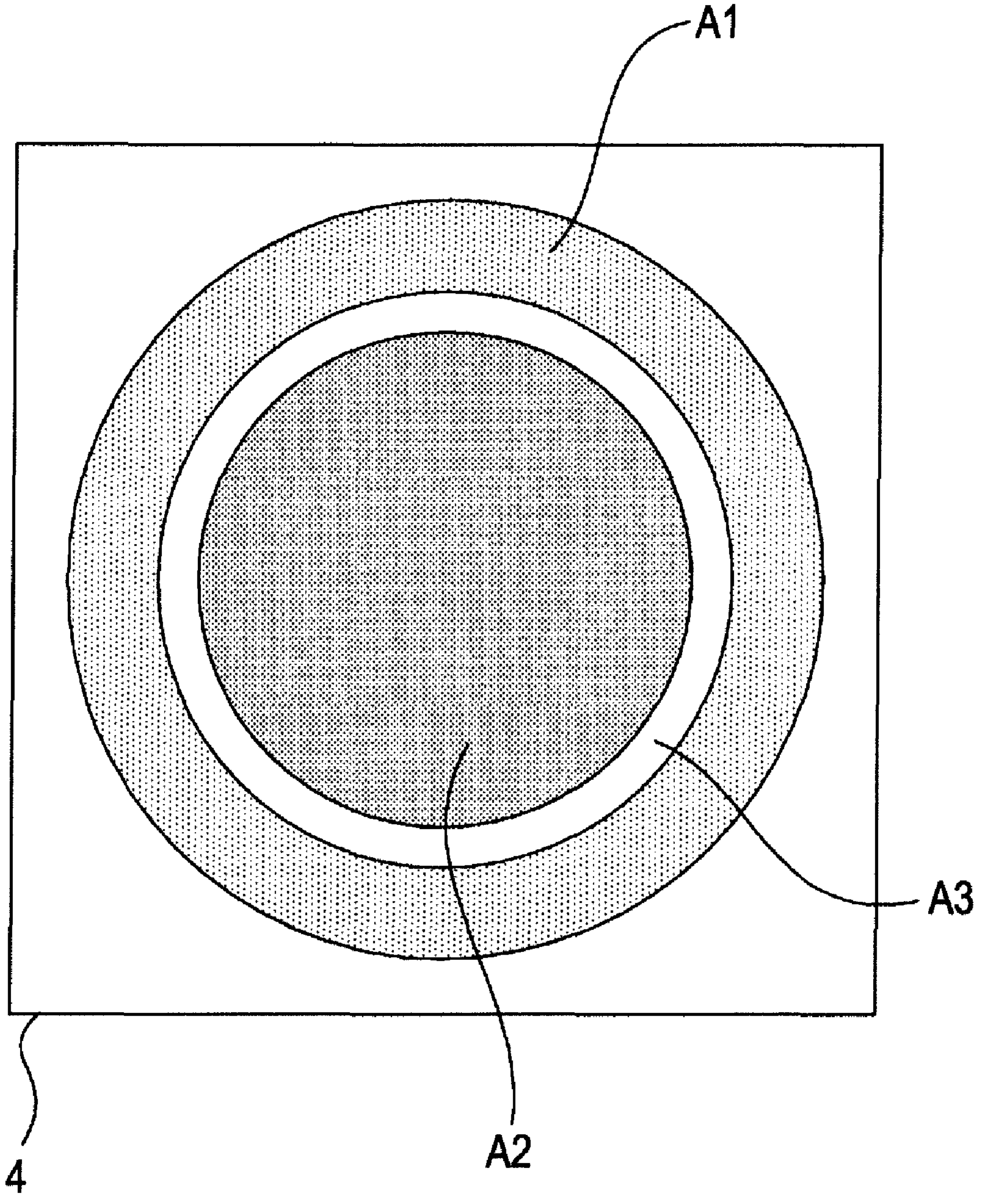
FIG. 3 is a diagram for describing each area of a reference light area, a signal light area, and a gap area, which are set in the spatial light modulator.

In the case of using the coaxial method, signal light and reference light are disposed on the same optical axis at the SLM 4, and consequently, each area such as shown in FIG. 3 is set.

As shown in FIG. 3, with the SLM 4, the circular area of a predetermined range including the center thereof (matched with the optical axis center) is set as a signal light area A2. Subsequently, a ring-shaped reference light area A1 is set on the outer side of this signal light area A2 across a gap area A3.

According to settings of the signal light area A2 and the reference light area A1, signal light and reference light can be irradiated so as to be disposed on the same optical axis.

Note that the above gap area A3 is determined to be a region for preventing the reference light generated on the reference light area A1 from leaking to the signal light area A2 to generate noise as to the signal light.

It should be noted that the pixel shape of the SLM 4 is rectangular, and accordingly, the signal light area A2 does not become a strict circle. Similarly, the reference light area A1 and the gap area A3 do not have a strict ring shape. In this sense, the signal light area A2 becomes an approximate circular area, and the reference signal area A1 and the gap area A3 each become an approximate ring-shaped area.

In FIG. 1, the modulation control unit 16 executes driving control as to the SLM 4, thereby generating signal light and reference light at the time of recording, and generating reference light alone at the time of reproducing.

Here, data in increments of blocks (data with one block of vertical multiple bits×horizontal multiple bits as increments) generated at a later-described sparse encoding unit 15 is input to the modulation control unit 16 as input data at the time of recording. Specifically, the sparse encoding unit 15 in this case executes recorded modulation encoding with a block of vertical 4 bits×horizontal 4 bits as the minimum increments such as described later, and accordingly, block-shaped data made up of such 4 bits×4 bits is input to the modulation control unit 16.

At the time of recording, the modulation control unit 16 lays out the block-shaped data thus supplied from the sparse encoding unit 15 within the signal light area A2 in accordance with a predetermined recording format (referred to as page mapping). Thus, the driving pattern (on/off pattern) of each pixel within the signal light area A2 of the SLM 4 is obtained. A predetermined on/off pattern is set to the pixels within the reference light area A1, and also a pattern for turning off is set to all of pixels other than the signal light area A2 and the reference light area A1, and driving patterns regarding all the pixels of the SLM 4 are obtained.

The modulation control unit 16 carries out driving control of each pixel of the SLM 4 based on the driving pattern thus obtained. Thus, at the time of recording, signal light and reference light disposed so as to each have the same center (optical axis) are obtained as the emission light from the polarized beam splitter 3.

Also, at the time of reproducing, the modulation control unit 16 generates driving patterns so as to set the pixels within the reference light area A1 to the above predetermined on/off pattern, and set all the pixels other than those to off, and carries out driving control of each pixel of the SLM 4 based on the driving patterns. Thus, at the time of reproducing, the reference light alone is obtained as the emission light from the polarized beam splitter 3.

Now, the number of blocks that can be laid out within the signal light area A2 is determined with a recording format beforehand. Thus, a data increment to be laid out at one time as to the signal light area A2 is called a hologram page. At the time of recording, the modulation control unit 16 executes laying out of data in increments of blocks supplied from the sparse encoding unit 15 sequentially in increments of such a hologram page, and driving control of the SLM 4 based on the generated driving patterns. Thus, data is sequentially recorded in the hologram recording medium HM in increments of such a hologram page.

Note that, such as shown in FIG. 1, data for carrying information to be recorded (recorded data in the drawing) is input to the sparse encoding unit 15 via encoding by the LDPC (Low Density Parity Check) encoding unit 14. That is to say, in this case, the recorded data is further subjected to sparse encoding after LDPC encoding, and is recorded.

Figure 40A:
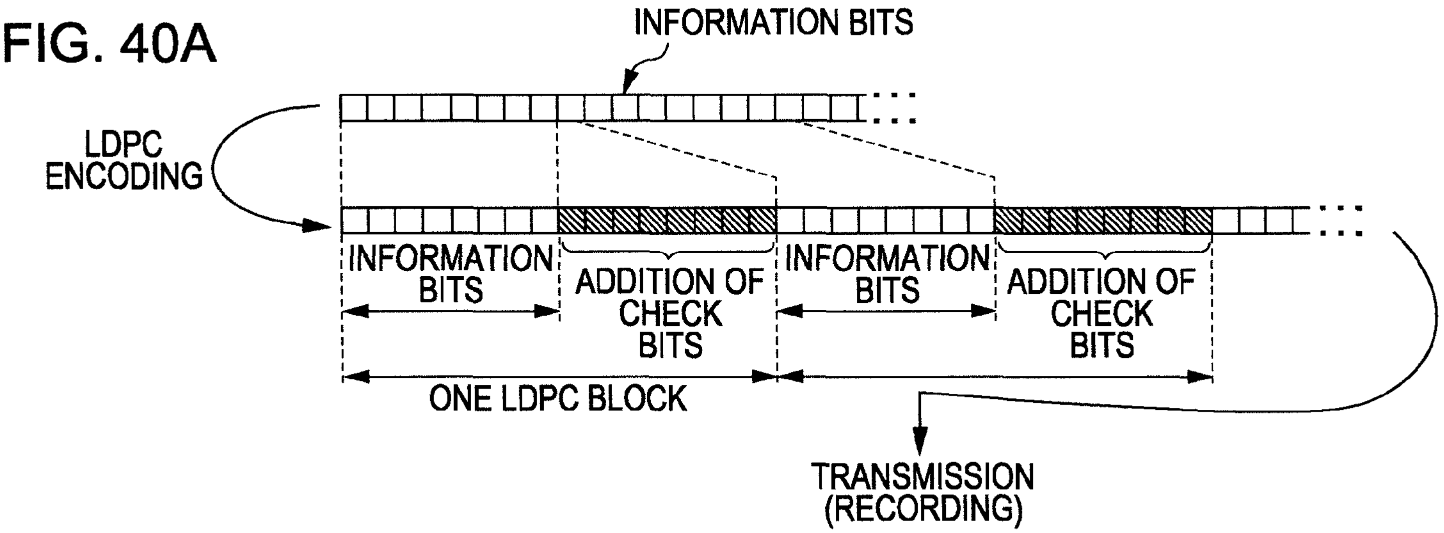
FIGS. 40A and 40B are diagrams for describing an outline of LDPC encoding/decoding.
Figure 40B:
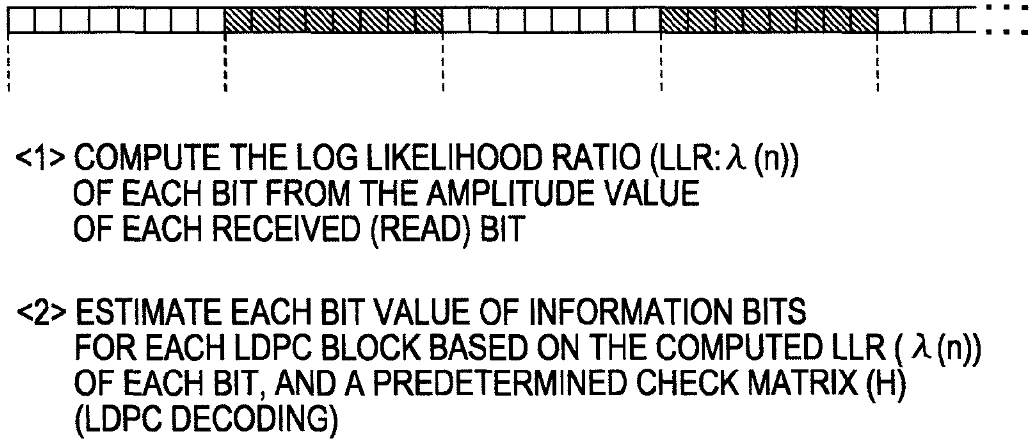
Figure 41:
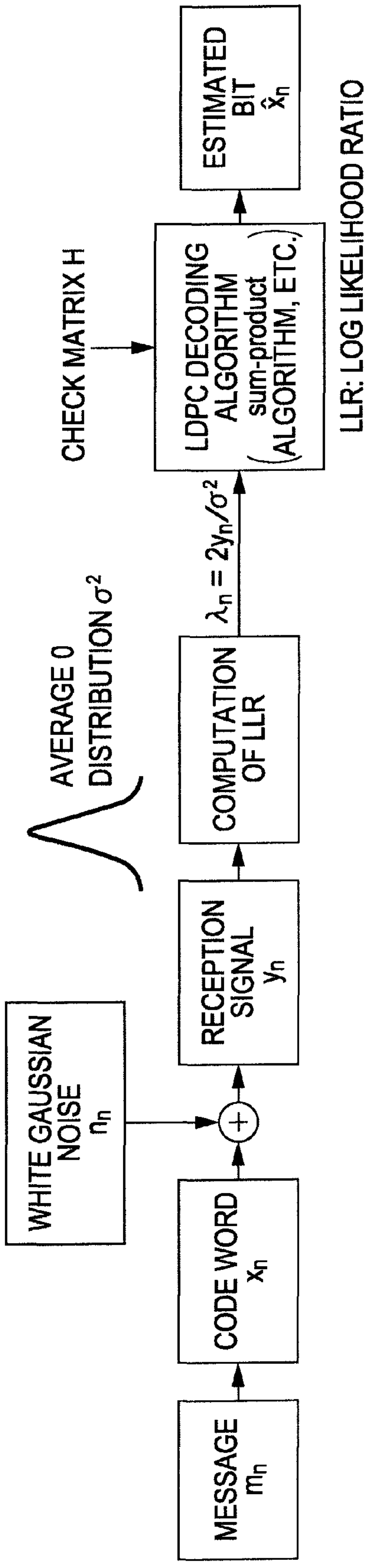
FIG. 41 is a diagram exemplifying LDPC encoding and decoding models in the case of assuming a common AWGN (Addition White Gaussian Noise) communication path.
Figure 42:
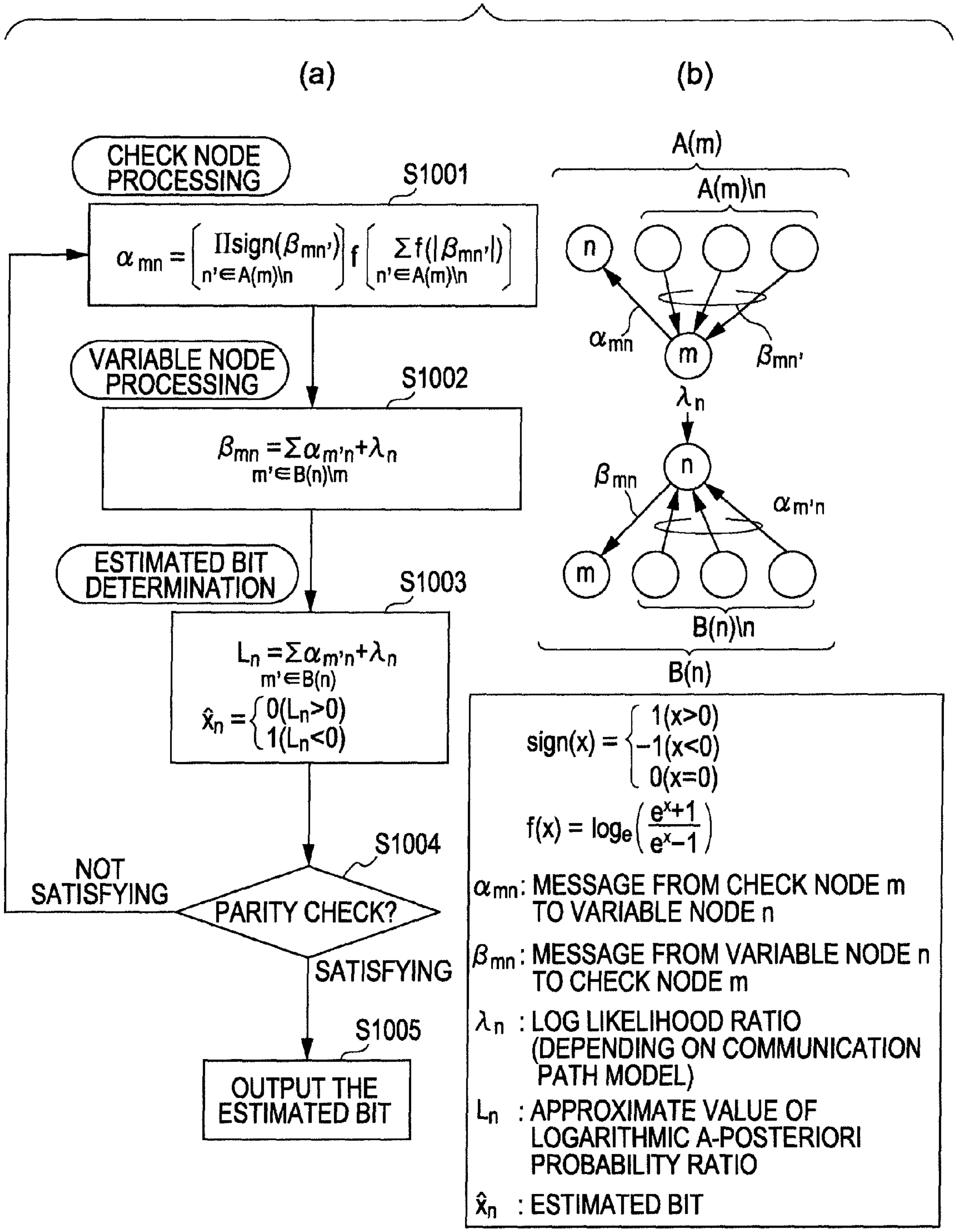
FIG. 42 is a diagram illustrating the content of LDPC decoding processing according to a sum-product algorithm in a simplified manner.

Now, the LDPC encoding processing that the LDPC encoding unit 14 executes is the same as the LDPC encoding processing according to the related art, and detailed description thereof will be omitted here. As the outline of this processing, such as previously described in FIG. 40A, generation/addition of a check bit is executed for each predetermined increment of an input information bit string (this is equivalent to the recorded data in the drawing), thereby obtaining an LDPC code string. Note that sparse encoding processing that the sparse encoding unit 15 executes will be described later.

The laser beam subjected to intensity modulation at the intensity modulating unit made up of the polarized beam splitter 3 and the SLM 4 is input to the polarized beam splitter 5. This polarized beam splitter 5 is also configured so as to transmit p-polarized light and reflect s-polarized light, and accordingly, the laser beam emitted from the intensity modulating unit (the light that transmitted the polarized beam splitter 3) transmits this polarized beam splitter 5.

The laser beam that transmitted the polarized beam splitter 5 is input to a relay lens system made up of the relay lens 6 and the relay lens 7. The aperture 12 is inserted between the relay lens 6 and the relay lens 7 with this relay lens system.

As shown in the drawing, according to the relay lens 6, the laser beam flux that transmitted the polarized beam splitter 5 is condensed in a predetermined focal position, and according to the relay lens 7, the above laser beam flux serving as diffused light after condensing is converted into parallel beams. The aperture 12 is provided in the focal position (Fourier surface: frequency flat surface) by the relay lens 6, and is configured so as to transmit light within a predetermined range with the optical axis as the center, and shield light other than that.

According to the aperture 12, the size of a hologram page to be recorded in the hologram recording medium HM is restricted, and improvement in the recording density of a hologram (i.e., data recording density) is realized. Also, as also described later, at the time of reproducing, the reproduced image from the hologram recording medium HM is guided to the image sensor 13 via the above relay lens system, but at this time, according to the aperture 12, most of the diffused light emitted from the hologram recording medium HM along with the above reproduced image is shielded, the amount of the diffused light guided to the image sensor 13 is markedly reduced. That is to say, the aperture 12 takes on both of a hologram recording density improvement function at the time of recording, and a SN ratio (S/N) improvement function by scattered-light suppression at the time of reproducing.

With the laser beam which has passed through the relay lens 7, the optical axis thereof is bent 90 degrees by the mirror 8, and is guided to the objective lens 11 via the partial diffraction element 9 and the quarter-wave plate 10.

The partial diffraction element 9 and the quarter-wave plate 10 are provided to prevent reference light reflected (reflected reference light) at the hologram recording medium HM at the time of reproducing from being guided to the image sensor 13 to become noise as to reproduced light. Suppression operation of the reflected reference light by the partial diffraction element 9 and the quarter-wave plate 10 will be described later.

The laser beam input to the objective lens 11 is irradiated on the hologram recording medium HM so as to be condensed. Note that though omitted from the drawing, with the objective lens 11, the position in the focus direction or tracking direction is controlled by an actuator such as a so-called biaxial mechanism or the like. Thus, control regarding the spot position or focal position of the laser beam can be executed.

Now, as described above, at the time of recording, signal light and reference light are generated according to intensity modulation by the intensity modulating unit (SLM 4 and polarized beam splitter 3), and the signal light and reference light are irradiated on the hologram recording medium HM through the route described above. Thus, a hologram in which recorded data is reflected with an interference pattern between the signal light and the reference light is formed, thereby realizing recording of data.

Also, at the time of reproducing, only reference light is generated by the intensity modulating unit, and is irradiated on the hologram recording medium HM through the above route. Thus, the reference light is irradiated, whereby the reproduced image (reproduced light) corresponding to the hologram formed at the time of recording is obtained as reflected light. This reproduced image is returned to the device side via the objective lens 11.

Now, the reference light irradiated on the hologram recording medium HM at the time of reproducing (referred to as outbound reference light) is input to the partial diffraction element 9 by the p-polarized light according to operation of the intensity modulating unit. As described later, the partial diffraction element 9 is configured so as to transmit all of the outbound light, and accordingly, the outbound reference light by the p-polarized light is passed through the quarter-wave plate 10. Thus, the outbound reference light by the p-polarized light via the quarter-wave plate 10 is converted into circular polarized light in a predetermined rotational direction, and is irradiated on the hologram recording medium HM.

The reference light thus irradiated is reflected at a reflection film provided in the hologram recording medium HM, and is guided to the objective lens 11 as reflected reference light (inbound reference light). At this time, according to reflection at the reflection film, the circular polarized light rotational direction of the inbound reference light is converted into the rotational direction opposite to the predetermined rotational direction, and accordingly, the inbound reference light is converted into s-polarized light via the quarter-wave plate 10.

Now, while considering transition of such a polarized light state, the suppression operation of the reflected reference light by the partial diffraction element 9 and the quarter-wave plate 10 will be described.

The partial diffraction element 9 is configured by a polarized light selection diffraction element having a selection diffraction property according to the polarized light state of linear polarized light (one of the linear polarized light components is diffracted, and the other linear polarized light component is transmitted), for example, such as a liquid crystal diffraction element or the like being formed in a region to which the reference light is input (region excluding the center portion). Specifically, in this case, the polarized light selection diffraction element included in the partial diffraction element 9 is configured so as to transmit p-polarized light and diffract s-polarized light. Thus, the outbound reference light transmits the partial diffraction element 9, and the inbound reference light alone is diffracted (suppressed) at the partial diffraction element 9.

Consequently, a situation can be prevented wherein the reflected reference light serving as inbound light is detected as a noise component as to a reproduced image, and S/N ratio deteriorates.

It should be noted that the region where the signal light at the partial diffraction element 9 is input (region where a reproduced image is input) is, for example, made up of a transparent material or a hole portion, and is configured so as to transmit both of outbound light and inbound light. Thus, signal light at the time of recording, and a reproduced image at the time of reproducing, are arranged to transmit this partial diffraction element 9.

Now, as can be understood from the above description, with the hologram recording/reproducing system, reference light is irradiated on the recorded hologram to obtain a reproduced image by taking advantage of diffraction phenomena, but the diffraction efficiency at this time is commonly as high as several percent to as low as less than one percent. Thus, the reference light returned to the device side as reflected light has markedly great intensity as to the reproduced image. That is to say, the reference light serving as the above reflected light becomes a noise component that is not negligible at the time of detecting a reproduced image.

Accordingly, suppression of the reflected reference light is realized by the partial diffraction element 9 and the quarter-wave plate 10, thereby realizing extensive improvement of an S/N ratio.

As described above, the reproduced light obtained at the time of reproducing transmits the partial diffraction element 9. The reproduced light transmitted through the partial diffraction element 9 is reflected at the mirror 8, and is then input the polarized beam splitter 5 via the relay lens 7, aperture 12, and relay lens 6. As can be understood from the above description, the reflected light from the hologram recording medium HM is converted into s-polarized light via the quarter-wave plate 10, and accordingly, the reproduced light thus input to the polarized beam splitter 5 is reflected at this polarized beam splitter 5, and is guided to the image sensor 3.

The image sensor 13 is configured to include an imaging device, for example, such as a CCD (Charge Coupled Device) sensor or CMOS (Complementary Metal Oxide Semiconductor) sensor or the like, receives the reproduced light from the hologram recording medium HM thus guided, and converts this into an electric signal to obtain an image signal. The image signal thus obtained is an signal in which the on/off pattern given to the signal light (i.e., data pattern of “0”/“1”) at the time of recording is reflected. That is to say, the image signal thus detected at the image sensor 13 becomes the read signal of data recorded on the hologram recording medium (channel data).

The read signal of channel data obtained by the image sensor 13 (hereafter, referred to as “read signal rd”) is supplied to the data reproducing unit 17.

The data reproducing unit 17 reproduces recorded data (information bit string) based on the above read signal rd, and outputs this as reproduced data in the drawing.

Note that the internal configuration of this data reproducing unit 17, and the content of the specific reproducing processing, will be described later again.

1-2. Sparse Code

The sparse code is one type of the above-described balance code. That is to say, this code is code such that of m bits making up a block made up of vertical×horizontal=multiple bits×multiple bits, l bit is “1”, and the remaining m−l bits are “0”.

This sparse code also represents a data pattern by a combination between a position where bit “1” is disposed and a position where bit “0” is disposed within a block.

Now, let us say that the parameters of sparse code are represented by E (m, l, k)

where m: the number of bits making up one sparse code (one block)

l: the number of “1” within one block k: the number of bits of input data to be converted into one block.

That is to say, in the case of being represented by the above E(m, l, k), this means that an input data string is converted into a block of m bits where the number of “1” is restricted to l.

In the case of the present embodiment, let us say that the parameters of sparse code are set to, for example, E(16, 3, 8).

At this time, m=16 and l=3, and accordingly, the number of data patterns that can be represented with sparse code is 560 by 16C3. On the other hand, the number of data patterns that can be represented with 8 bits of an input data string is 256 kinds by $2^8$.

Here, if we consider that the data patterns that can be represented with 9-bit data is 512 kinds by $2^9$, according to sparse code of m=16 and l=3 wherein 560 kinds of data patterns can be represented as described above, up to k=9 bits can be handled.

However, as described above, with the hologram recording/reproducing system, encoding parameters E(m, l, k) are intentionally set so as to generate a redundant pattern.

This is for enabling the following.

1) Reduction of check errors is realized by narrowing down patterns to be used for encoding to patterns of which the similarity of mutual patterns is low.

2) Only patterns where "1" does not continue horizontally and vertically within the block are used for encoding to reduce the low-frequency component of special frequency within a read signal (image).

As described above, of 560 kinds of patterns that can be represented with m=16 and l=3, 256 kinds are selected, and an example where these are correlated to each data pattern that can be represented with k=8 bits is shown in FIGS. 4 through 10.

Note that, in FIGS. 4 through 10, with regard to 8-bit data patterns, the decimal expressions thereof are represented by being enclosed with ###.

With the examples in FIGS. 4 through 10, patterns satisfying a condition that "1" does not continue horizontally and vertically within the block are selected. In practice, there have been 276 kinds satisfying this condition, but 256 kinds are arrayed in the ascending order of values represented with 16-bit binaries assuming that the upper left edge is as LSB, and the lower right edge is as MSB.

Now, let us say that, such data mapping for correlating block data to each of k-bit data patterns will be referred to as "straight mapping" with the present Specification.

Encoding to sparse code is executed, for example, based on correspondence information (data conversion table) between a k-bit data pattern and an m-bit data pattern (block) thus determined.

That is to say, the sparse encoding unit 15 shown in FIG. 1 converts k bits of a data string (LDPC code string) input from the LDPC encoding unit 14 into m-bit block data using predetermined data conversion table, thereby executing sparse encoding.

Now, with the following description, data in increments of one block obtained with such sparse encoding will be referred to as "one sparse code block".

Also, it should be noted that a later-described mapping technique serving as the present embodiment is a technique for optimizing data mapping within a data conversion table used for encoding (and decoding) to sparse code. The mapping pattern of a data conversion table to be set based on the mapping technique of the present embodiment will be described later, and hereafter, within the item of "1. Premised LLR Computation Technique", let us say that, with a data conversion table, table information according to straight mapping such as shown in FIGS. 4 through 10 is used.

1-3. Outline of LDPC Encoding/Decoding

Here, as can be understood from the above description, with the hologram recording/reproducing system, channel data to be written/read becomes data according to a two-dimensional array. Balance code represented with sparse code is used as the code of channel data (recorded modulation code).

Figure 43:
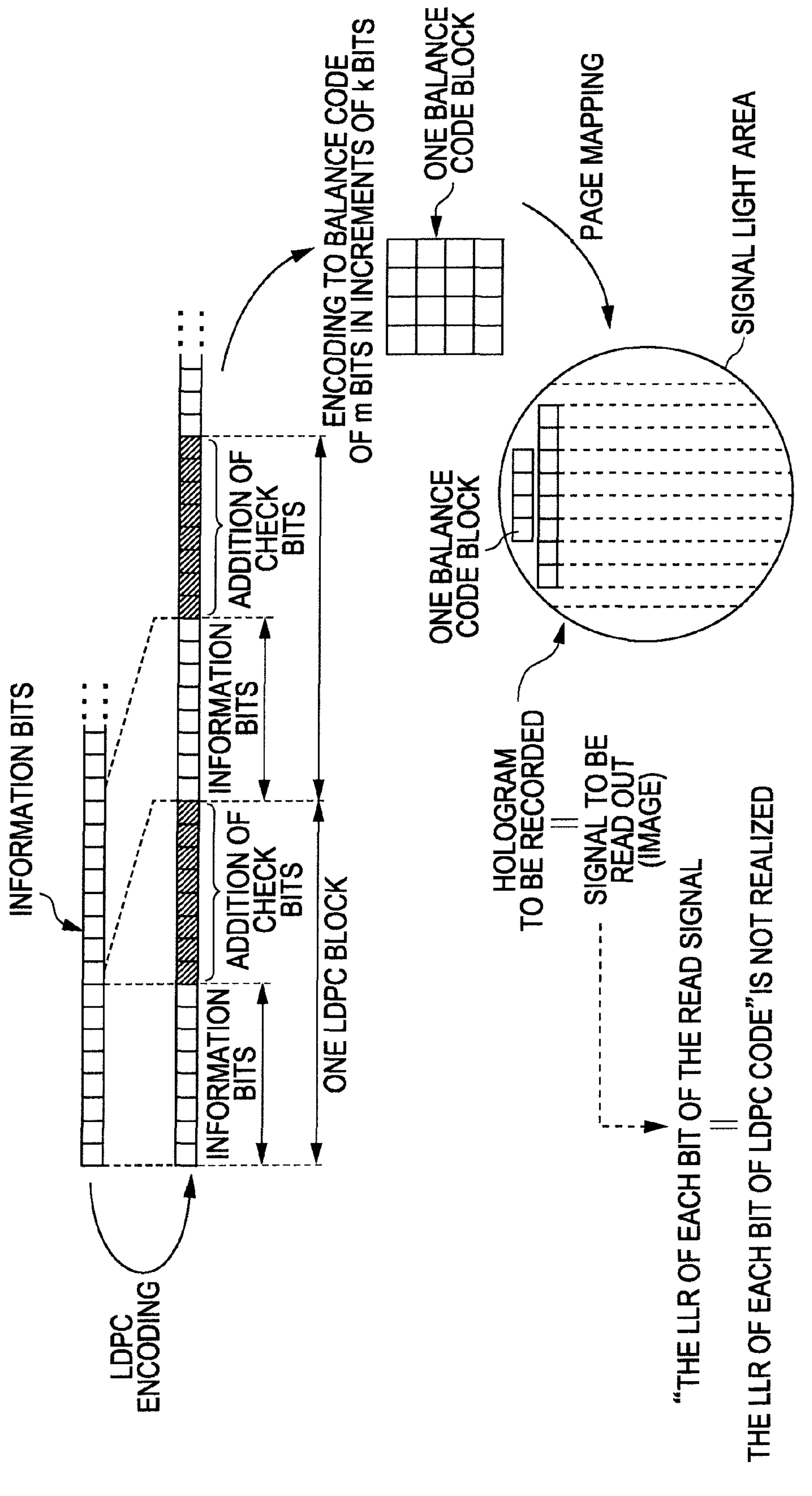
FIG. 43 is a diagram for describing a problem in the case of executing error correction processing according to LDPC with the hologram recording/reproducing system.

Thus, in the case that an error correction function according to LDPC is added to the hologram recording/reproducing system for finally converting data to be recorded into balance code, as described with reference to FIG. 43, the log likelihood ratio (LLR) to be computed from a read signal for decoding of LDPC code is not readily computed with the same technique as the LLR computation technique according to the related art.

Description will be made below regarding an example of a technique suitable for computing an LLR regarding each bit of a LDPC code string from a read signal with the hologram recording/reproducing system wherein balance code is used as recorded modulation code.

First, description will be made regarding outline of LDPC encoding/decoding with the hologram recording/reproducing system with reference to the schematic diagram in FIG. 11.

As can be understood from the above description, data to be recorded is converted into an LDPC code string such as the drawing by the LDPC encoding unit 14. As shown in the drawing, an LDPC code string is made up of information bits and check bits. Check bits to be added to information bits are generated based on the information bits, which is a generally recognized fact, and a predetermined check matrix (H), and data increments according to "information bits+check bits" become "one LDPC block" serving as the minimum increments of LDPC encoding/decoding.

An LDPC code string according to "information bits+check bits" such as described above is input to the sparse encoding unit 15 shown in FIG. 1 from the LDPC encoding unit 14, and this LDPC code string is subjected to sparse encoding.

As also described above, sparse encoding is executed, whereby k bits of a LDPC code string are converted into m-bit sparse code.

Now, thus, k-bit data increments of an LDPC code string to correspond to one sparse code block will be defined as "one unit".

As described above, m-bit block data obtained by sparse encoding is mapped within the signal light area A2. Reference light is irradiated on the hologram recoding medium HM along with such signal light, and accordingly, a hologram page is recorded.

At the time of reproducing, a read signal rd with the sparse code block such as described above as the minimum increments is obtained along with the reproduced image regarding the hologram page thus recorded being received by the image sensor 13.

As described above, the data reproducing unit 17 shown in FIG. 1 computes the LLR of each bit of LDPC code based on the above read signal rd input from the image sensor 13.

Now, it should be noted that for example, information used for LDPC decoding processing such as represented with the sum-product algorithm is only the check matrix (H), and the LLR of each bit of LDPC code (see FIGS. 40A through 42).

The check matrix H is information first determined at the time of LDPC system design, and is known information. Accordingly, at the time of reproducing, the LLR of each bit of LDPC code has to be obtained from a read signal. That is to say, decoding processing based on the LDPC decoding algorithm such as the above sum-product algorithm or the like is executed based on this LLR and the known (i.e., predetermined) check matrix H, whereby information bits (recorded data) can be reproduced.

Figure 11:
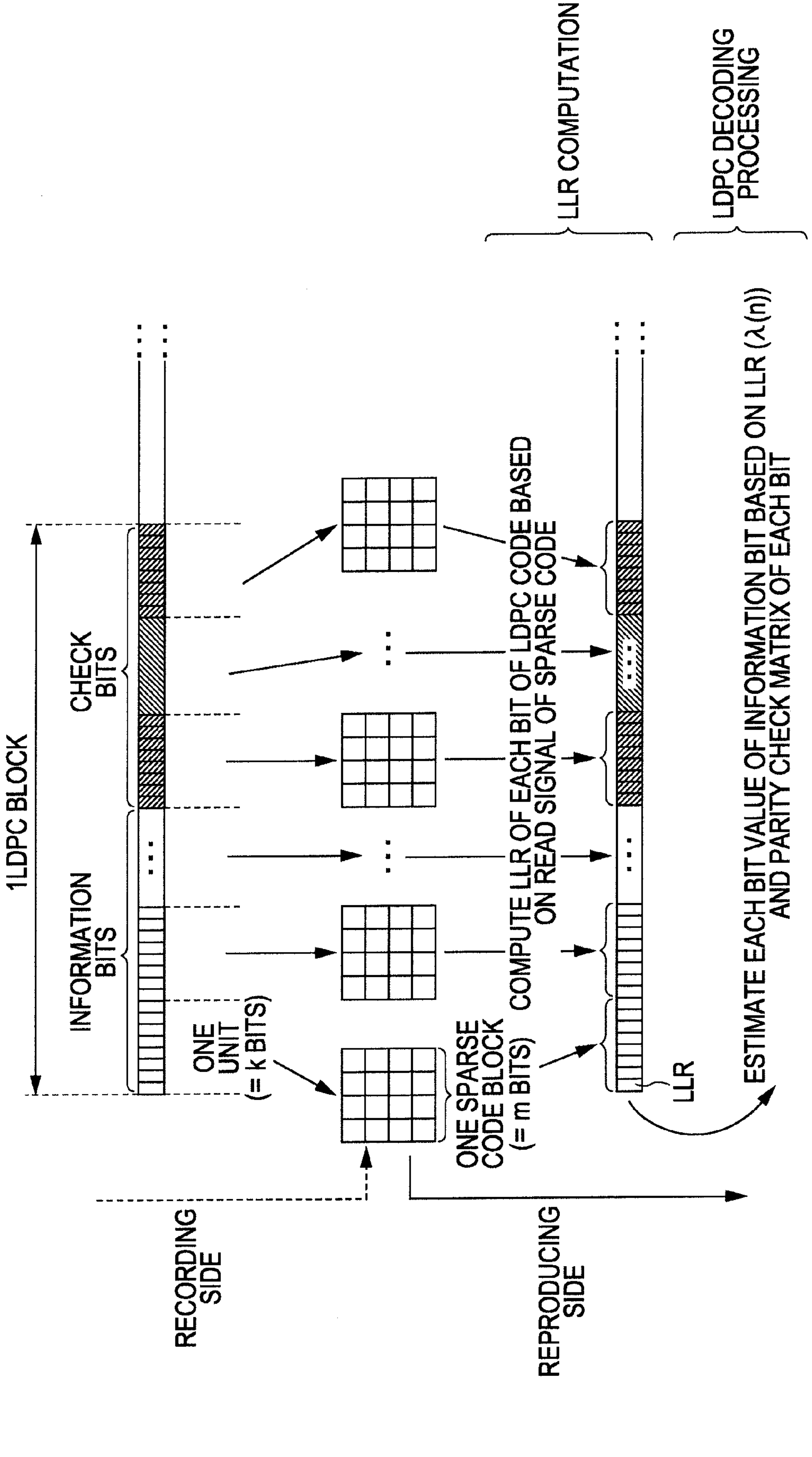
FIG. 11 is a diagram schematically illustrating an outline of LDPC encoding/decoding of a hologram recording/reproducing system.

Now, as can be understood with reference to FIG. 11, in the case of the hologram recording/reproducing system using balance code as recorded modulation code, a procedure used for decoding LDPC code is roughly classified into the following two procedures.

Figure 12:
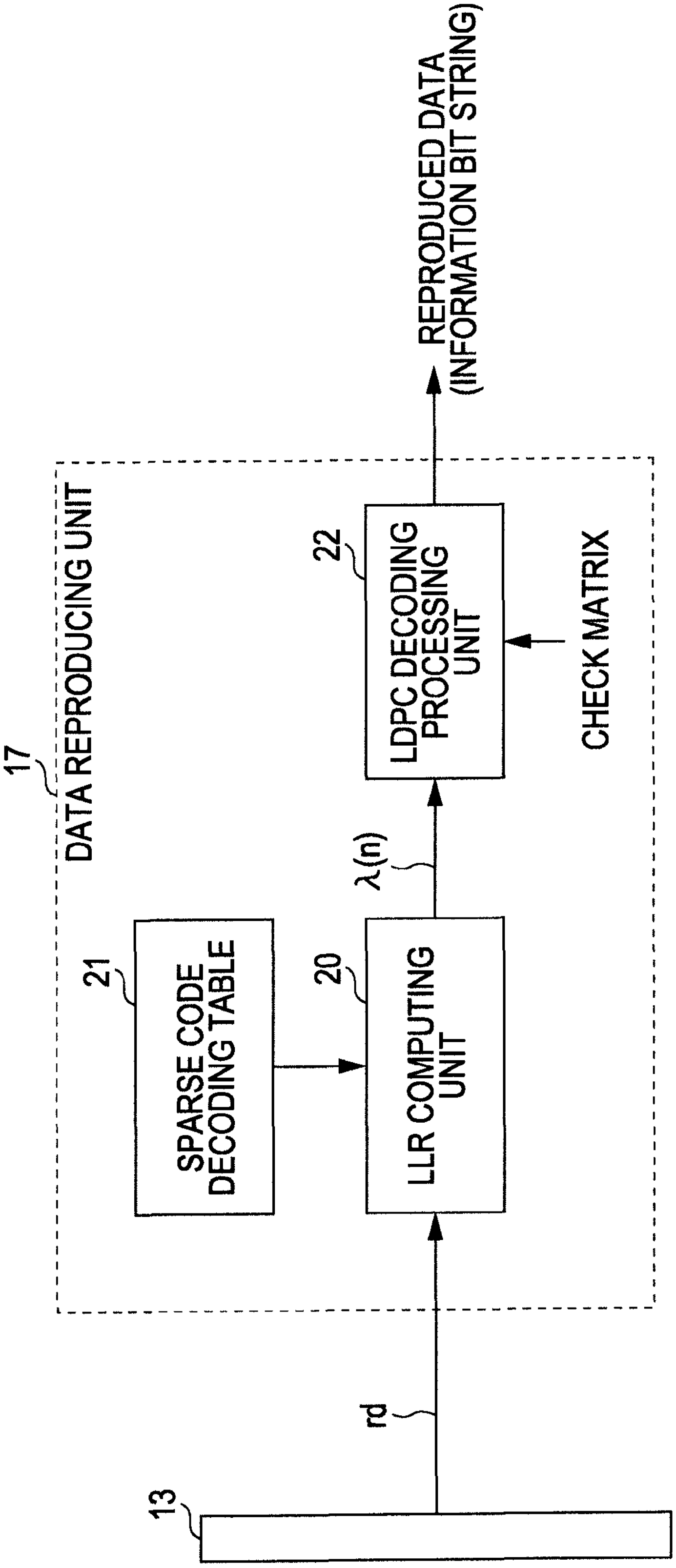
FIG. 12 is a diagram illustrating the internal configuration of a data reproducing unit.

1) LLR computation procedure for computing the LLR of each bit of LDPC code for the read signal rd of sparse code 2) LDPC decoding procedure for executing decoding processing in accordance with the LDPC decoding algorithm based on the value of an LLR determined in the LLR computation procedure and the check matrix H FIG. 12 is a diagram illustrating the internal configuration of the data reproducing unit 17 for executing LDPC decoding processing (reproducing processing of information bits) by the LLR computation procedure and the LDPC decoding procedure such as described above.

Note that this FIG. 12 illustrates the image sensor 13 shown in FIG. 1 together with the internal configuration of the data reproducing unit 17.

As shown in this FIG. 12, the data reproducing unit 17 includes an LLR computing unit 20, a sparse encoding/decoding table 21, and an LDPC decoding processing unit 22.

The sparse encoding/decoding table 21 is, such as shown in the previous FIGS. 4 through 10, table information representing the correspondence relation of an m-bit block (one sparse code block) as to each of k-bit data patterns. Such table information is used, whereby decoding of sparse code (conversion to LDPC code) can be executed.

The LLR computing unit 20 computes the LLR of each bit of an LDPC code string based on the read signal rd from the image sensor 13, and the sparse encoding/decoding table 21.

Now, hereafter, the LLR of each bit of an LDPC code string will be represented with "λ(n)". In this case, "n" represents the n'th bit within one LDPC block.

The LDPC decoding processing unit 22 executes LDPC decoding processing in accordance with the LDPC decoding algorithm based on the LLR(λ(n)) obtained by the LLR computing unit 20, and the check matrix H, thereby reproducing the information bits thereof for each one LDPC block. Thus, reproduced data regarding recorded data is obtained.

Figure 13:
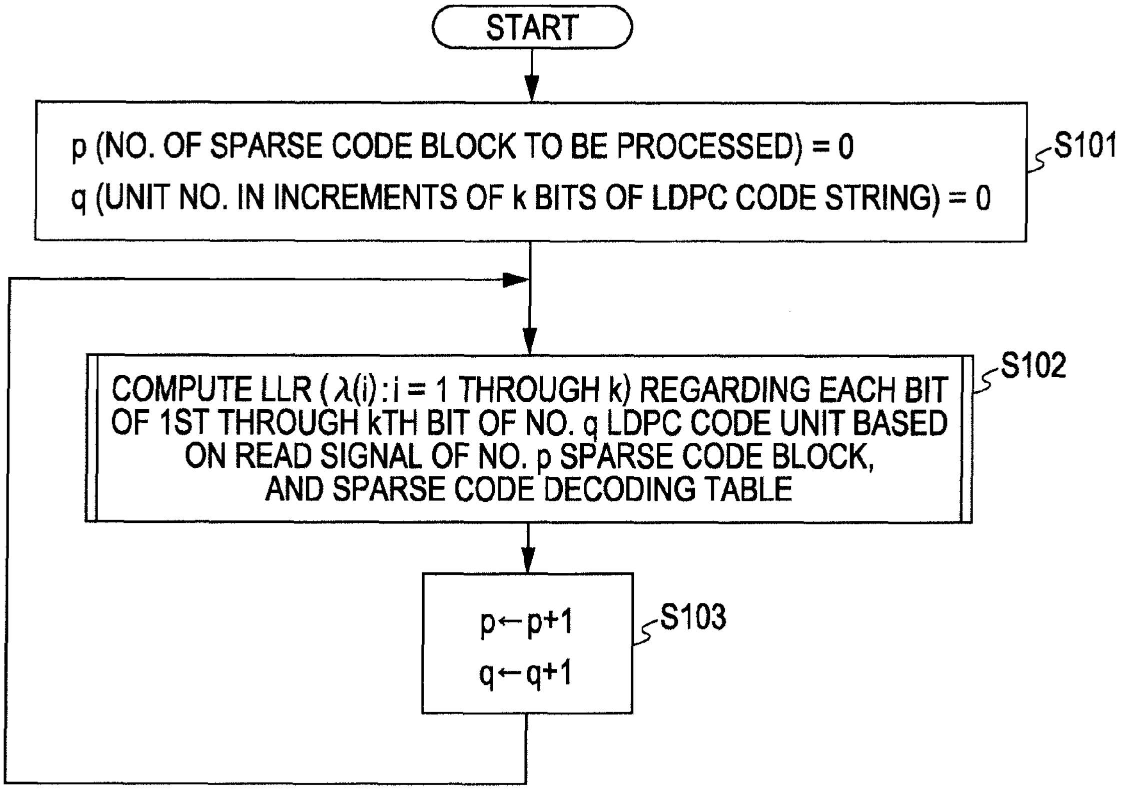
FIG. 13 is a flowchart illustrating an outline of processing by an LLR computing unit.
Figure 14:
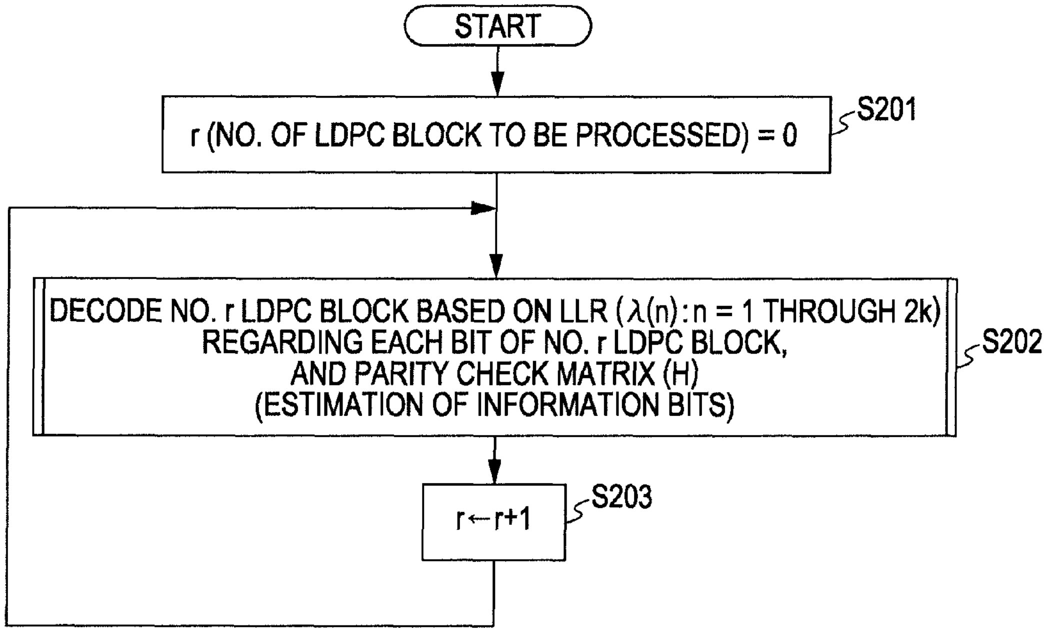
FIG. 14 is a flowchart illustrating an outline of processing by an LDPC decoding processing unit.

The flowcharts in FIGS. 13 and 14 illustrate an outline of processing by the LLR computing unit 20, and an outline of processing by the LDPC decoding processing unit 22, respectively.

First, in FIG. 13, in step S101 the LLR computing unit 20 resets to p=0, and q=0. Here, p represents No. of sparse code block to be processed, and q represents No. of unit of k-bit increments of an LDPC code string.

Subsequently, in step S102, LLR(λ(i): i=1 through k) regarding each bit of 1st through k'th of the LDPC code unit of No. q is computed based on the read signal rd of the sparse code block of No. p, and the sparse code decoding table 21.

In the next step S103, the values of p and q are incremented respectively (p←p+1, q←q+1). Subsequently, the flow returns to the above step S102.

Thus, with the LLR computing unit 20, for every one sparse code block, the LLR(λ(i)) of each bit regarding k-bit LDPC code string (unit) corresponding to this sparse code block is sequentially computed.

Here, the LLR(λ(i)) computed at the LLR computing unit 20 as described above represents the LLR of each bit within the unit of k-bit increments of LDCP code. On the other hand, with the LDPC decoding algorithm, one LDPC block is taken as the smallest increment of decoding, and accordingly, the LLR used in the LDPC decoding processing has to be represented as λ(n) that represents the LLR of each bit within one LDPC block.

For example, in the case of assuming that one LDPC block is made up of two units, λ(i=1 through k) computed regarding No. 1 unit is equivalent to λ(n=1 through k), and λ(i=1 through k) computed regarding No. 2 unit is equivalent to λ(n=k+1 through 2k). Thus, the computed λ(i) is assigned to each bit within one LDPC block in order, and is taken as λ(n).

The LDPC decoding processing in the case of the hologram recording/reproducing system includes the LLR computation processing in step S102 in FIG. 13. The details of the LLR computation processing according to step S102 will be described again in the later-described "1-4. LLR Specific LLR Computation Technique".

Subsequently, in FIG. 14, in step S201 the LDPC decoding processing unit 22 resets r to 0. Here, r represents the number of the LDPC block to be processed.

In the next step S202, the LDPC decoding processing unit 22 decodes No. r LDPC block based on the LLR(λ(n)) of each bit of No. r LDPDC block, and the parity check matrix. That is to say, the LDPC processing unit 22 executes decoding processing in accordance with a predetermined LDPC decoding algorithm, for example, such as the sum-product algorithm or the like to estimate the value of each information bit within No. r LDPC block to be processed.

Note that as the LDPC decoding processing in step S202, processing in accordance with a LDPC decoding algorithm in general use, for example, such as the sum-product algorithm should be executed, and the technique thereof is not restricted to any particular one here.

For example, the min-sum algorithm has been commonly used as the LDPC decoding algorithm, and this may be used.

Also, the LDPC decoding algorithm is not restricted to algorithms already proposed at this time, and accordingly, an algorithm to be proposed in the future may be used.

With regard to the detailed content of the LDPC decoding processing, it is recommended to refer to the above "Practical Configuration Method of LDPC Code (First)", NIKKEI ELECTRONICS, Aug. 15, 2005, pp 126-130, and "Practical Configuration Method of LDPC Code (Second)", NIKKEI ELECTRONICS, Aug. 29, 2005, pp 127-132, and the like, for example.

After executing reproducing of information bits in accordance with the LDPC decoding algorithm in step S202, in step S203 the LDPC decoding processing unit 22 increments the value or r (r←r+1), and then returns to step S202.

Thus, according the LDPC decoding processing unit 22, estimation (reproduction) of information bits is executed in order in increments of LDPC blocks, and results thereof are output as reproduced data shown in FIGS. 1 and 12.

1-4. LLR Specific LLR Computation Technique 1-4-1. Basic Concept

Now, let us consider how to compute an LLR from a read signal rd with the hologram recording/reproducing system using sparse code as recorded modulation code.

Figure 15:
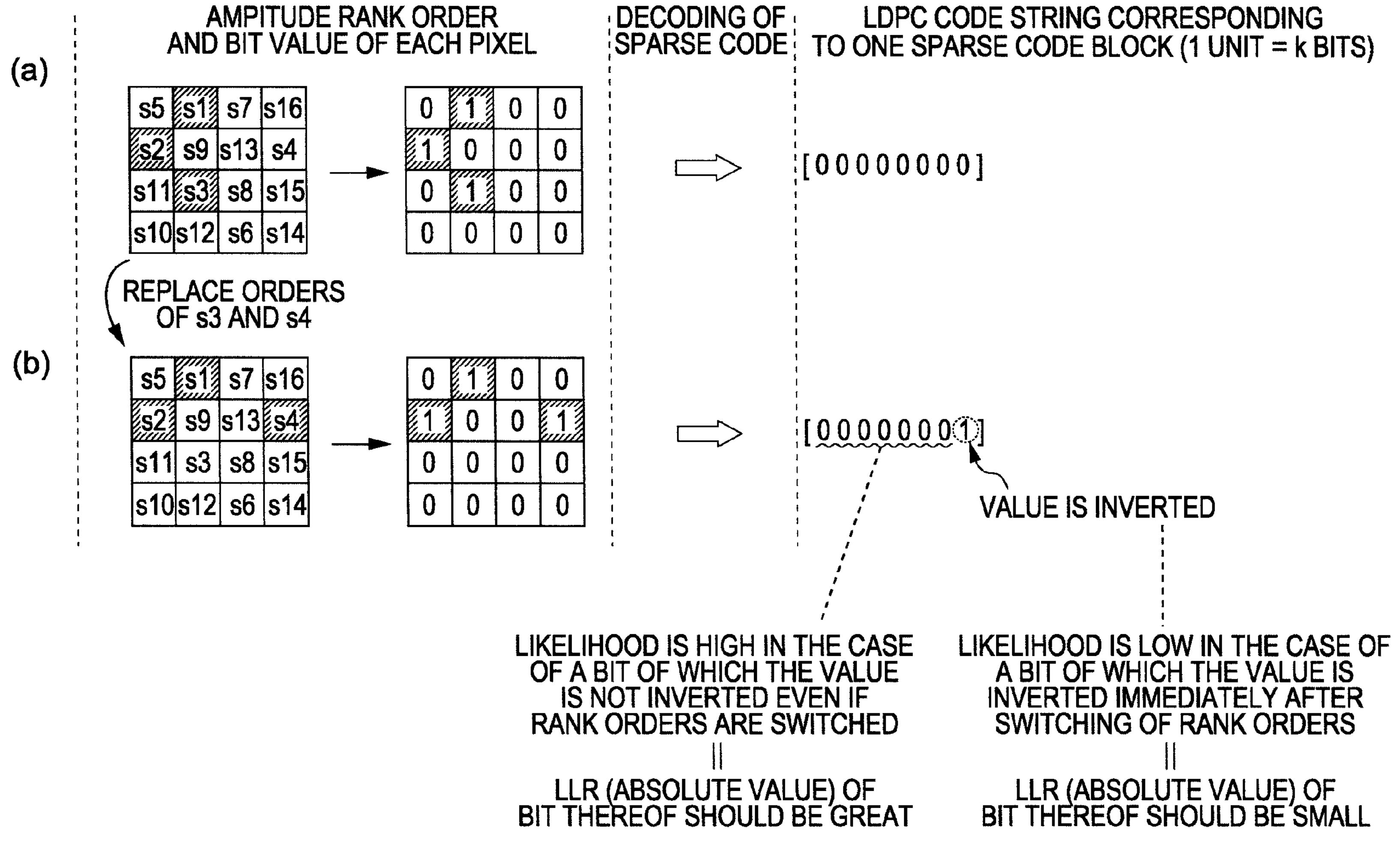
FIG. 15 is a diagram considering an LLR computation technique in the case of the hologram recording/reproducing system.

FIG. 15 is a diagram exemplifying relationship between the amplitude rank order of the read signal rd regarding one space code block of m bits and the bit value of each pixel (data identification results), and relationship between this one sparse code block and a k-bit LDPC code string serving as decoding results thereof as a diagram for considering the LLR computation technique with the hologram recording/reproducing system.

First, let us say that the read signal rd according to amplitude rank order such as shown in FIG. 15A has been obtained. Hereafter, the rank order of each pixel within the block will be referred to as "s". In the case of this example, according to m=16, the rank orders are s1 through S16.

Data identification by sorting check is executed regarding such a read signal rd, whereby the bit value of each pixel is identified such as shown in the drawing.

Subsequently, let us say that the decoding results of the sparse code corresponding to this data identification results are "00000000" such as shown in the drawing.

Now, the LLR (log likelihood ratio) used for the LDPC decoding processing is information representing the likelihood of each bit value as the name thereof implies. However, as described above, the likelihood information used for the LDPC decoding processing is likelihood information regarding each bit of an LDPC code string, and in order to compute this from the read signal rd regarding a sparse code block, an LLR computation technique different from the technique according to the related art has to be used.

Therefore, in the case of the hologram recording/reproducing system, at the time of obtaining an LLR regarding each bit of an LDPC code string from the read signal rd, a technique is used wherein switching of the amplitude rank order of the read signal rd is repeated, and the sparse code decoding results thereof and the sparse code decoding results before rank order switching are compared to determine a bit of which the value have been inverted, and consequently, an LLR of which the absolute value is smaller is given to a bit of which the value has been inverted with the initial switching of rank order, and an LLR of which the absolute value is greater is given to a bit of which the value has not been inverted even if switching of rank order is repeated.

Specifically, FIG. 15B illustrates an example of the amplitude rank order in the case of switching s3 and s4 from the amplitude rank order in FIG. 15A, the data identification result of each pixel, and sparse code decoding results. At this time, let us say that the decoding results after switching of rank order are "00000001" such as shown in the drawing.

Thus, with regard to the read signal rd in increments of sparse code block, upon switching of the amplitude rank order thereof being executed, bit values of decoding results can be changed along with the data identification results by sorting check changing.

At this time, with regard to a bit of which the value has been inverted of decoding results, the likelihood thereof can be estimated to be low. That is to say, for example, such as the example shown in FIG. 15, with regard to a bit of which the value has been inverted with one-time switching of rank order, the likelihood thereof can be estimated to be markedly low. Thus, with regard to a bit of which the value is inverted immediately after switching of amplitude rank order, the LLR (absolute value) thereof has to be set small.

Conversely, with regard to a bit of which the value has not been inverted even if switching of rank order is repeated, the likelihood thereof can be estimated to be high. That is to say, with regard to a bit of which the value has not been inverted by switching of rank order, the likelihood thereof is high, and the LLR (absolute value) of the bit thereof has to be set great.

1-4-2. Example of LLR Computation Technique

As described above, with the LLR computation technique in the case of the hologram recording/reproducing system, with regard to the read signal rd in increments of sparse code block, ranking of amplitudes thereof→sparse decoding →switching of amplitude rank order→sparse decoding and so on are repeated, and a bit of which the value has been inverted of decoding results is determined for each switching of rank order. At this time, such as described above, the earlier a bit of which the value has been inverted according to switching of rank order, the smaller the absolute value of the LLR thereof is set, and conversely, with regard to a bit of which the value has not been inverted even if switching of rank order is repeated, the absolute value of the LLR thereof is set great, whereby the LLR of each bit of a LDPC code string can be computed suitably from the read signal rd.

Now, in the case of using such a technique, it has to be clarified how to specifically compute an LLR to be set small/great according to the number of times of switching of rank order such as described above. With regard to a specific computation technique of an LLR to be set small/great according to the number of times of switching of rank order, a technique that the present assignee has proposed will be described below as an example thereof.

FIG. 16 is a diagram for describing a specific computation technique of an LLR according to a proposal made by the present assignee (hereafter, simply referred to as "LLR computation technique of this example").

In FIG. 16, "sorting count (j)" in the leftmost column represents sorting count regarding amplitude rank order to be executed as to the read signal rd in increments of one sparse code block.

Also, "rank order after sorting" in the drawing indicates the rank order of each pixel along with the j'th sorting having been executed. In this case as well, "s" represents the amplitude rank order of each pixel (i.e., the rank order of each pixel at the first sorting of j=1).

Also, the right column of the above "rank order after sorting" represents "the absolute value (EVA(j)) of an LLR candidate value at the time of the j'th sorting". The absolute value (EVA(j)) of an LLR candidate value is a value to be computed/updated each time sorting is executed.

As shown in FIG. 16, with the LLR computation technique of this example, how to determine the rank order of each pixel at the time of the j'th sorting, and further, the computational expression of the absolute value (EVA(j)) of an LLR candidate value to be computed at the time of the j'th sorting is determined beforehand.

That is to say, as the processing in this case, first each pixel of the read signal rd is sorted in accordance with information of a predetermined j'th "rank order after sorting", sorting check (data identification) in accordance with the amplitude rank order thereof is executed, and then decoding of sparse code is executed.

For example, in response to at the time of sorting of j=2 (at the time of the first switching of rank order), sorting order information of "s1, s2, s4, s3, s5, s6, s7, s8-s16" is determined beforehand wherein the rank order of a pixel of which the first sorting order of j=1 (at the time of the first ranking) is s3, and the rank order of a pixel of which the first sorting order of j=1 is s4 are switched. Accordingly, at the time of j=2nd sorting, ranking is updated in accordance with such pixel sorting order information, data identification (sorting check) is executed wherein the upper l pixel thereof is set to "1", and others are set to "0", and then decoding of sparse code is executed based on this data identification results.

Note that, as can be understood from this description, with the present Specification, the term "sorting" is used with meaning equivalent to "ranking", and does not necessarily mean that actual pixel sorting is executed.

At this time, according to FIG. 16, at the time of the first sorting of j=1, the absolute value (EVA(j)) of an LLR candidate value is set to "1". Subsequently, when executing switching of rank order at j=2nd and thereafter, the absolute value (EVA(j)) of an LLR candidate value is computed in accordance with the computational expression correlated to the sorting count j thereof.

For example, when executing switching of rank order of j=2, EVA(j) is computed in accordance with a predetermined computational expression "s3-s4". Alternatively, when executing switching of rank order of j=7, EVA(j) is computed in accordance with a predetermined computational expression "s3-s4".

Sorting Priority

The LLR computation technique of this example shown in FIG. 16 has principally two features. One is sorting priority.

Specifically, with this example, the following technique is used. Sorting is executed so that a sorting order (sorting pattern) that causes the value of sum of the rank order at the time of the first ranking of the upper l pixels after sorting to become smaller is used preferentially as the initial sorting order.

In FIG. 16, the column on the right of "sorting count (j)" shows the value of sum of the top three (M). It should be noted that i is 3 with this example. The above "M" is a value defined as "sum of rank order at the time of the first ranking of the upper l pixels".

Thus, with this example, switching of the rank order of each pixel is executed so that sorting order where the value of M is small is prioritized. In other words, sorting order where the value of M is smaller is used as the sorting order at the time of the initial sorting where the value of j is smaller.

However, as can be clearly seen from the drawing, there is a case where there are multiple sorting orders wherein the value of M is the same. Thus, in the case that there are multiple sorting orders wherein the value of M is the same, these priorities may be set such as the following, for example.

1) The rank order (s) of a pixel, disposed on the upper side at the time of the first sorting due to switching of rank order, is prioritized in descending order.

2) The rank order (s) of a pixel, disposed on the upper side at the time of the first sorting due to switching of rank order, is prioritized in ascending order.

In the case of using either technique of 1) and 2), substantial change is caused in the LDPC decoding results.

As shown in FIG. 16, with this example, sorting orders are set for each j'th sorting in accordance with the above technique of 2).

Computation Technique of Absolute Value EVA(j) of LLR Candidate Value

The other feature comparable to the feature of sorting priority such as described above is the computation technique of the absolute value EVA(j) of an LLR candidate value.

Now, before understanding the computation technique of EVA(j), first, we have to understand how the value of this EVA(j) is used with the technique of this example.

As described with reference to FIG. 15, with this example, with regard to the read signal rd in increments of sparse code block, ranking of amplitudes thereof→sparse decoding→switching of amplitude rank order→sparse decoding and so on are repeated, and a bit of which the value has been inverted of decoding results is determined for each switching of rank order.

It should be noted that FIG. 16 represents (defines), with the process of such repetitive processing, correspondence relation between the sorting order at the time of the j'th sorting, and the value of EVA(j) to be computed at the time of this j'th sorting.

Based on such a premise, the LLR computation processing of this example is generally executed as described in the following procedure.

1) At the time of the first sorting of j=1, after obtaining the decoding results of sparse code, the absolute value EVA(j) of the LLR candidate value of each bit of a LDPC code string (1 through k) is updated to "1" serving as the minimum value, for example.

2) At the time of the second sorting of j=2 and thereafter (at the time of switching of rank order), after obtaining the decoding results of sparse code, these latest decoding results and the first decoding results (decoding results first obtained regarding the read signal of one sparse code block to be processed) are compared to determine a bit of which the value has been inverted.

At this time, with regard to a bit of which the value has been inverted, the value of the LLR thereof is determined to be a value based on the absolute value EVA(j) of the (latest) LLR candidate value held as the updated value at that time (the j'th time). On the other hand, with regard to a bit of which the value has not been inverted, the absolute value EVA(j) of the LLR candidate value is updated in accordance with the computational expression at a predetermined j'th time.

Thus, processing is repeated, such as switching of rank order, decoding of sparse code, identifying a bit of which the value has been inverted, determining the LLR of a bit of which the value has been inverted to be a value based on the updated value EVA(j) at that time, and updating the EVA(j) of a bit of which the value has not been inverted to a value in accordance with a predetermined computational expression, thereby determining the value of the LLR of each bit in order.

At this time, with this example, sorting to all the assumed sorting orders is not executed, and the sorting count j may be limited. Specifically, in the case of this example, such as shown in FIG. 16, the sorting count is restricted to j=16.

Here, in the case of limiting the sorting count to a certain value jMAX, there is no guarantee that all the bit values will be inverted during repetitive sorting up to this jMAX time. Therefore, with this example, with regard to the value of the LLR of a bit of which the value has not been inverted even if sorting is repeated up to j=jMAX, the value of the LLR is determined to be a value based on EVA(j) serving as the updated value at the time of j=jMAX.

Thus, the LLR of each bit of a LDPC code string (1 through k) to be processed can be computed (determined).

Thus, the sorting count j is limited to j=jMAX, i.e., a technique for quitting sorting at a certain count is used, whereby drastic reduction of processing load can be realized as compared to a case where sorting to all the assumed sorting orders is executed. That is to say, the circuit scale for LLR computation (the circuit scale of the LLR computing unit 20) can be reduced so as to be a smaller scale.

As can be understood from the above description, EVA(j) computed with this example is, at the time of determining the value of the final LLR, used as the candidate value thereof.

It should be noted that LLR(λ(n)) used for the LDPC decoding processing is a value having a positive/negative sign according to the bit value thereof. Specifically, the LLR regarding a bit of "0" takes a positive value, and the LLR regarding a bit of "1" takes a negative value.

According to this, when determining the value of an LLR from EVA(j), a calculation such as $$\text{“}(1-2\times d(i))EVA(j)\text{”}$$

actually intervenes. With the above expression, d(i) indicates, of each bit (i=1 through k'th) of an LDPC code string to be processed, the value of a bit serving as the determined object of an LLR (0 or 1). Note that, as can be understood from this, EVA(j) is a value to be computed as an absolute value.

Based on the above premise, with this example, the value of EVA(j) to be computed (updated) for each j'th sorting is predetermined beforehand such as shown in FIG. 16.

That is to say, first, EVA(j) at the time of the first sorting of j=1 is updated to "1" (minimum value) as described above.

Here, the minimum value of EVA(j) to be given in response to at the time of the first sorting of j=1, is not restricted to "1". The minimum value of EVA(j) should be a small value excluding "0" according to the number of bits of A/D conversion.

Based on the above, EVA(j) to be computed after the second sorting of j=2 and thereafter is computed as a value based on the amplitude difference between certain predetermined pixels, and specifically, is computed based on the amplitude difference between pixels of which the rank orders have been switched.

However, in the case that sorting orders are assigned for each j'th time in accordance with the sorting priority described above, such as shown in FIG. 16, when the sorting count increases and the value of M reaches a certain value, there is a case where the number of pixels to be switched becomes not 2 but 4. For example, with the example in the drawing, as sorting orders satisfying M=10, there are "a pattern for switching s6 and s2", "a pattern for switching s7 and s3", "a pattern for switching s5 and s1", and also "a pattern for switching s4 and s2, and s5 and s3".

Thus, in the case that there are four pixels to be switched, of the four pixels to have been switched, EVA(j) is computed as the difference between the sum of amplitudes of two pixels of which the rank orders after switching are on the upper side, and the sum of amplitudes of two pixels of which the rank orders after switching are on the lower side.

According to the above, with this example, in the case that the number of pixels to be subjected to switching of rank order is two, EVA(j) is computed as the amplitude difference between the pixels of which the rank order has been switched, and in the case that the number of pixels to be subjected to switching of rank order is four, EVA(j) is computed as the difference between the sum of amplitudes of two pixels of which the rank orders after switching are on the upper side, and the sum of amplitudes of two pixels of which the rank orders after switching are on the lower side.

It should be noted that EVA(j) is an absolute value. In the drawing, as an EVA(j) computational expression in the case that the number of pixels to be switched are two, for example, such as "s3-s4", a pixel of which the rank order is low (amplitude is small) is subtracted from a pixel of which the rank order is high (amplitude is great), but it goes without saying that these may be switched, wherein a pixel of which the rank order is high may be subtracted from a pixel of which the rank order is low.

Also, in the case that the number of pixels to be switched is four, if we say that these four pixels are ss1, ss2, ss3, and ss4 in order from the upper side, EVA(j) is computed as follows.

$$\text{"}(ss1+ss2)-(ss3+ss4)\text{"}$$

which is equivalent to $$\text{"}(ss1-ss3)+(ss2-ss4)\text{"},$$

accordingly, it goes without saying that such a computation technique is included in the category of a technique for computing "a value based on the amplitude difference between certain predetermined pixels" described above.

According to such an EVA(j) computation technique, and the above determining technique of the LLR of each bit, a condition is generally satisfied wherein the earlier a bit of which the value is inverted according to switching of rank order, the smaller the LLR thereof, and the later a bit of which the value is inverted according to switching of rank order, the greater the LLR thereof.

That is to say, according to the LLR computation technique described so far, with the hologram recording/reproducing system using balance code as recorded modulation code, the LLR of each bit of a LDPC code string can suitably be computed from the read signal rd.

Thus, the LLR of each bit can suitably be computed, and accordingly, decoding of LDPC code can suitably be executed based on this LLR and a predetermined check matrix H.

Handling When Decoding Error Occurs

Incidentally, with the LLR computation technique described above, a sorting check technique is used for data identification of sparse code. As described above, sorting check is an easy-to-use data identifying technique regarding balance code, and is effective for realizing alleviation of processing load, or reduction in circuit scale.

However, sorting check is a technique wherein 1 pixel of which the amplitude is simply great is identified as "1", and other pixels are identified as "0", and accordingly, identification results that are not code words may be output. That is to say, a block data pattern not included in a table used for decoding of sparse code such as shown in FIGS. 4 through 10 may be obtained as an identification result, and consequently, decoding of sparse code may result in an error.

Here, when a decoding error is caused due to an unsuccessful sorting check, the reliability of the read signal rd can be estimated to be low. In particular, in the case that an error occurs during decoding of sparse code from the first sorting where switching of rank order is not executed, the reliability of the read signal rd can be estimated to be markedly low.

With the above LLR computation technique, the value of EVA(j) to be computed for obtaining the LLR of each bit is computed based on the amplitude value of the read signal rd. Accordingly, in the case that the reliability of the read signal rd is low, the computed EVA(j) and LLR are also low in reliability thereof.

Thus, in the case that an LLR having low reliability is used for the LDPC decoding processing without change, the load at the LDPC decoding processing increases. Specifically, this case causes increase in the repetitive count at the LDPC decoding processing (round count until parity check passes). Also, this case sometimes induces an LDPC decoding error.

With the LLR computation technique described so far, thus, a case is not taken into consideration at all wherein the reliability of the read signal rd is low.

Therefore, further adjustment processing of EVA(j) such as the following is executed based on the LLR computation technique described above, thereby preventing problems accompanying occurrence of read errors such as described above can be prevented.

First, in order to estimate the reliability of the read signal rd, at the time of the first sorting, determination is made regarding whether or not decoding of sparse code has caused an error. In the case that no decoding error has occurred, as described above, EVA(j) is updated in accordance with the j'th EVA(j) computational expression ("1" in the case of j=1).

On the other hand, in the case that a decoding error has occurred at the time of the first sorting, gain g (offset: likelihood ratio adjustment coefficient) for decreasing the value of EVA(j) to be updated at the time of sorting of j=2 and thereafter is set. Setting of the gain g serving as such a likelihood ratio adjustment coefficient adjusts the value of EVA(j) to be updated for each sorting time so as to be smaller as compared to the normal time (i.e., in the case that no decoding error has not occurred at the time of the first sorting time, and the reliability of the read signal rd is determined to be high).

With this example, adjustment of EVA(j) based on such a gain g is executed by providing the inverse number of the gain g to EVA(j). That is to say, adjustment of the value of EVA(j) is executed by letting a calculation according to EVA(j)/g intervene.

It should be noted that at the time of determining the value of the LLR from EVA(j) serving as the absolute value of an LLR candidate value, according to the above-described calculation $$(1-2\times d(i))EVA(j),$$

a positive or negative sign according to the value "0" or "1" of a bit to be processed is added to EVA(j). Based on this point, in the case of executing adjustment according to the gain g such as described above, the determination value of the LLR becomes a value represented with $$(1-2\times d(i))EVA(j)/g.$$

Also, with this example, determination regarding whether or not there is occurrence of a decoding error is not executed only at the time of the first sorting, and determination is also made regarding that even at the time of sorting after the first sorting, and in the case that a decoding error continuously occurs at the time of sorting after the first sorting time, setting is executed so as to increase the offset amount (amount to be set small) of EVA(j) according to the gain g. Specifically, each time a decoding error continuously occurs from the first sorting time, the value of the gain g is incremented.

As for the LLR computation technique of this example, an arrangement may be made wherein, to deal with a case where a sparse code decoding error has been detected at the time of the first sorting and the reliability of the read signal rd has been determined to be low, adjustment is executed so that the value of EVA(j) computed at the time of subsequent sorting becomes smaller than that at the normal time.

Thus, this technique is used wherein in the case that the reliability of the read signal rd is low, the value of the LLR is reduced, the load at the LDPC decoding processing of the subsequent stage can be reduced as compared to a case where the LLR computed normally regardless of the reliability of the read signal rd. That is to say, reduction in the repetitive count (average value) at the LDPC decoding processing can be realized. Further, suppression of an LDPC decoding error (improvement in reproducing performance) can also be realized.

Now, it can also be conceived to use a technique wherein in the case that a decoding error occurs at the first decoding time, the read signal thereof is regarded as the reading signal lacking in reliability at all, and having no value to be used, the subsequent repetitive updating processing is not executed, and the value of the LLR of each bit is all determined to be 0 (i.e., computation of an LLR is given up). However, in the case of using such a technique, it is clearly seen that there is a high possibility that suitable LDPC decoding results may not be obtained.

On the other hand, according to the technique for executing adjustment of an LLR such as described above, even in the case that the reliability of the read signal rd is low, a tentative EVA(j) based on the actual obtained amplitude value can be computed while adjusting EVA(j) serving as an LLR candidate value. In this point, a more reliable LLR can be computed as compared to a case where computation of an LLR is given up such as described above.

That is to say, reduction in repetitive count at the LDPC decoding processing, and further suppression of an LDPC decoding error can be realized as compared to a technique wherein the value of an LLR is all set to "0" according to occurrence of a decoding error.

Also, with the above technique of this example, determination is made regarding whether or not a decoding error continuously occurs even at the first sorting and thereafter, and each time a decoding error continuously occurs at the first time and thereafter, the value of the gain g is set again so that the value of EVA(j) to be computed is greater than the offset amount. Thus, the offset amount of EVA(j) can be adjusted in phases according to the lowness of reliability of the read signal rd, and adjustment of the offset amount with higher precision according to the lowness of reliability of the read signal rd can be executed. Thus, further reduction in LDPC repetitive count, and further suppression of LDPC decoding errors, can be realized.

Now, it should be noted that if the LDPC repetitive count can be reduced, reduction in the circuit scale of the LDPC decoding processing unit 22 can be realized. Also, with this example, the inverse number of the gain g is given to EVA(j), thereby offsetting the value of EVA(j).

Thus, the inverse number of the gain g is given, whereby adjustment of the offset amount can be realized by incrementing the value of the gain g, and just for the worth thereof the circuit configuration for adjusting the offset amount can be simplified.

1-5. Processing Procedure

The procedure of processing to be executed for realizing the LLR computation technique serving as this example described above will be described with reference to the flowchart in FIG. 17.

Figure 17:
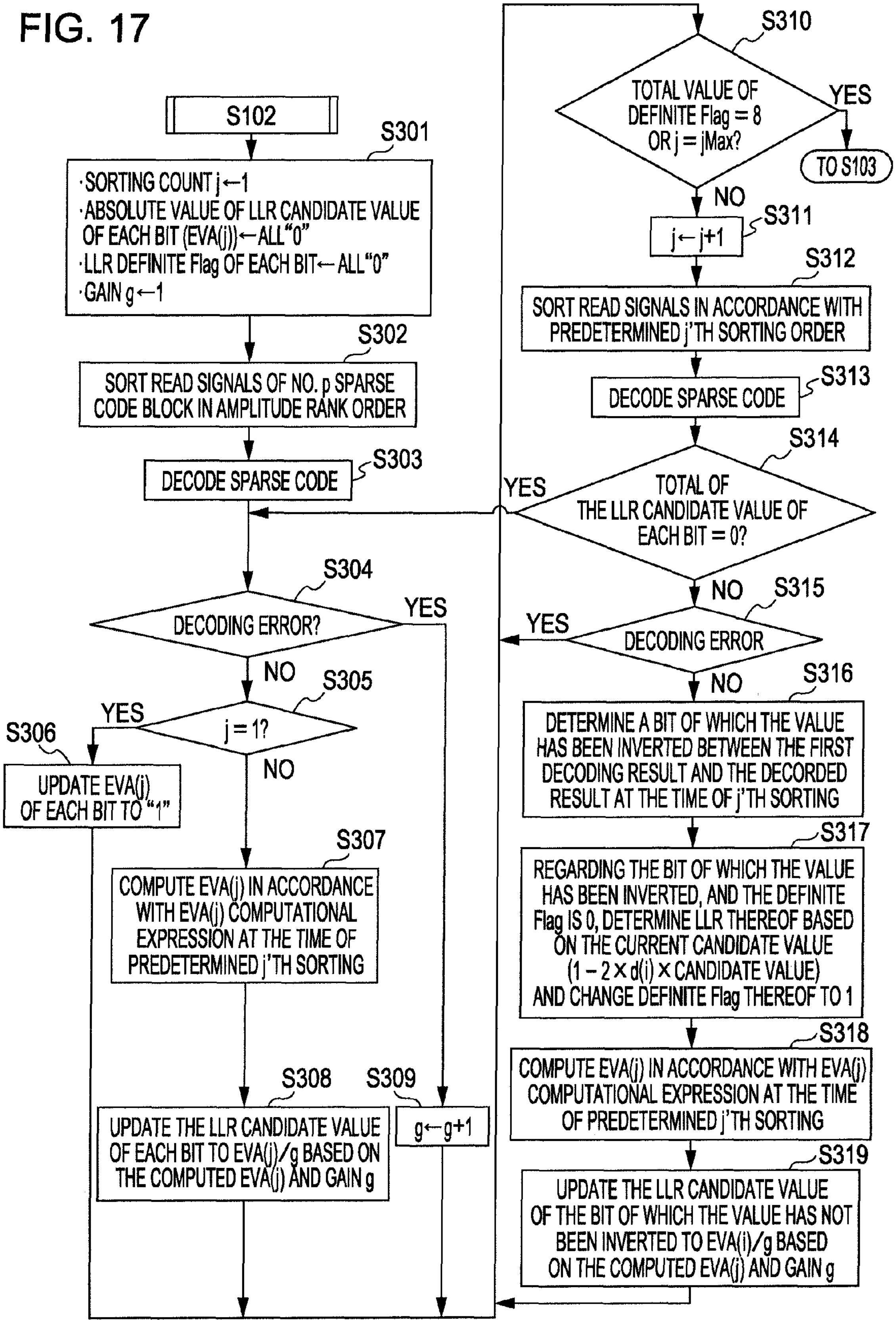
FIG. 17 is a flowchart illustrating a processing procedure for realizing the LLR computation technique premised with the present embodiment.

It should be noted that the series of processing shown in FIG. 17 is processing that the LLR computing unit 20 shown in FIG. 12 performs as the processing in step S102 in FIG. 13.

Also, as can be understood from the above description in FIG. 13, the LLR computation processing shown in FIG. 17 is processing for obtaining from the read signal rd of No. p sparse code block the LLR of each bit with No. q unit in increments of k bits corresponding thereto.

In FIG. 17, first, in step S301, each value of sorting count j, the absolute value (EVA(j)) of the LLR candidate value of each bit, and the gain g is initialized. Specifically, these are set to j←1, EVA(j)←All "0", determining Flag←All "0", and gain g←1, respectively.

Here, the determining Flag of the LLR of each bit is a flag for determining whether or not the value of the LLR is determined for each bit within a unit in increments of k bits, the determining Flag=0 represents undetermined, and Flag=1 represents determined. As shown in the drawing, the determining Flag is set to Flag=1 in a later-described step S317 along with determination of the LLR.

In the subsequent step S302, the read signal of No. p sparse code block is sorted in the amplitude rank order. As can be understood from the above description in FIG. 16, at the time of the first sorting, the amplitude value (read signal rd) of each pixel of No. p sparse code block to be processed is sorted (ranked) in ascending order of amplitudes in the same way as normal sorting check.

Subsequently, in the next step S303, as sparse code decoding processing, data identification (sorting check) in accordance with the rank order given to each pixel in step S302, and decoding of sparse code based on this data identification result are executed. That is to say, with regard to each pixel sorted in step S302, data identification is executed wherein the bit values of the upper l pixels of which the amplitudes are great are set to "1", and the bit values of pixels other that those are set to "0", and also decoding of sparse code is executed based on the block data pattern determined with this data identification, and the sparse code decoding table 21 shown in FIG. 12.

In the subsequent step S304, as determination processing regarding whether or not there is occurrence of a decoding error, determination is made regarding whether or not decoding in step S303 results in an error.

In the case that a positive result to the effect that a decoding error occurs is obtained in step S304, the processing proceeds to step S309, where the value of the gain g is incremented (g←g+1), and then the processing proceeds to step S310.

According to such processing in step S304→S309, in the case that a decoding error occurs at the time of the first sorting, the value of the gain g can be incremented each time a decoding error occurs continuously at the time of sorting after the first sorting.

On the other hand, in the case that a negative result to the effect that no decoding error occurs is obtained in step S304, the processing proceeds to step S305, where determination is made regarding whether or not j=1, i.e., whether or not this sorting is the first sorting. In the case that a positive result to the effect that j=1 is obtained in step S305, in step S306 each bit of EVA(j) is updated to "1" (minimum value), and then the processing proceeds to a later-described step S310.

Also, in the case that a negative result to the effect that j is not equal to 1 is obtained in step S305, the processing proceeds to step S307, where EVA(j) is computed in accordance with a predetermined EVA(j) computational expression at the time of the j'th sorting. That is to say, such as shown in FIG. 16, EVA(j) of each bit (i=1 through k) is computed in accordance with a predetermined computational expression corresponding to the j'th sorting time.

In the subsequent step S308, based on the computed EVA (j) and the gain g, the LLR candidate value of each bit is updated to EVA(j)/g.

Here, the processing in step S304→S305→S307→S308 described above is processing for computing EVA(j) to update an LLR candidate value when succeeding in sparse decoding for the first time at the time of sorting after the first sorting.

Subsequently, in step S310, determination is made regarding whether or not either one condition of the total value of the determining Flag=8, and j=jMAX, has been satisfied. That is to say, determination is made regarding whether or not either one condition of the LLR of each bit of i=1 through k all being determined, and the sorting count becoming the upper limit value jMAX, has been satisfied.

As shown in the drawing, in the case that a positive result to the effect that any one of these conditions is satisfied is obtained, the LLR computation processing serving as step S102 ends. That is to say, the computation processing regarding the LLR(λ(i)) of each bit with the No. q unit ends.

On the other hand, in the case that a negative result to the effect that any of the above two conditions is not satisfied is obtained, the processing proceeds to step S311, where the value of j is incremented (j←j+1).

Subsequently, in the next step S312, the read signals (the read signal rd of each pixel) are sorted in accordance with a predetermined j'th sorting, and then in step S313, decoding of sparse code is executed.

In the subsequent step S314, determination is made regarding whether or not the total of the LLR candidate value of each bit=0. Specifically, this is equivalent to that determination is made regarding whether or not the LLR candidate value of each bit of i=1 through k is in a state of not being updated from the initial value "0" at all.

Here, that the LLR candidate value of each bit has not been updated from the initial value "0" at all represents that the LLR candidate value of each bit is in a state of not succeeding in decoding of sparse code.

In the case that determination is made in step S314 that the total of the LLR of each bit=0 (not succeeding in decoding of sparse code), the processing proceeds to step S304 described above.

Thus, in the case that a negative result is obtained in step S314, the processing proceeds to step S304, and thus, according to the above processing in step S304→S309, the value of the gain g can be incremented each time a decoding error occurs continuously from the first sorting time in the case that a decoding error occurs at the first sorting time.

Also, in the case that a negative result to the effect that the total of the LLR of each bit is not equal to 0 (i.e., decoding of sparse code has been achieved and the candidate value has already been updated in step S306 or step S308) is obtained in step S314, the processing proceeds to step S315.

Processing in step S315 through step S319 is processing to be executed after decoding of sparse code is achieved and the first decoding result is obtained, and also subsequently, in step S311 the value of j is incremented, and decoding of sparse code regarding the next sorting order is attempted (S312 and S313).

In step S315, determination is made regarding whether or not a decoding error occurs. That is to say, determination is made regarding whether or not decoding of sparse code executed in step S313 results in an error.

In the case that a positive error to the effect that a positive result to the effect that a decoding error occurs is obtained in step S315, the processing returns to step S310 described above such as shown in the drawing.

Here, thus, in response to a decoding error being detected again after decoding of sparse code is achieved once, the processing returns to step S310 as is. That is to say, increment of the gain g in step S309 is not executed, different from the case of step S304 (in the case of a decoding error occurring at the first sorting time, and in the case of a decoding error continuously occurring from the first sorting time).

That is to say, as can be understood from this, with the technique of this example, adjustment of the LLR candidate value according to a likelihood ratio adjustment coefficient is not executed unless a decoding error occurs at the time of the first sorting.

Also, in the case that a negative result to the effect that a decoding error does not occur is obtained in step S315, the processing proceeds to step S316, where bits of which the values have been inverted with the first decoding results, and the decoding results at the time of the j'th sorting are determined.

Based on the above, in the next step S317, the following processing is executed as to bits of which the values have been inverted and the determining Flag is 0.

Determine the LLR thereof based on the current candidate value

The determining Flag is changed to 1

Here, with regard to determination of an LLR, if we say that a bit of which the value has been inverted and also the determining Flag is 0 is a bit di, as to the current LLR candidate value (EVA(j)/g) of this bit di, using d(i) that is the bit value of this bit di, $$\text{LLR candidate value} \times (1-2\times d(i))$$

is computed, and this is determined as the LLR of the bit di.

In the subsequent step S318, EVA(j) is computed in accordance with a predetermined EVA(j) computational expression at the time of the j'th sorting.

Subsequently, in the next step S319, based on the computed EVA(j) and the gain g, the LLR candidate value of each bit is updated to "EVA(j)/g".

After the processing in step S319 is executed, the processing returns to the previous step S310.

1-6. Simulation Results

In order to verify the validity of the LLR computation technique serving as the technique of this example described above, simulation has been executed regarding bER (bit error rate) and the repetitive count of the LDPC decoding processing. The results thereof will be shown in FIGS. 18A and 18B.

Figure 18A:
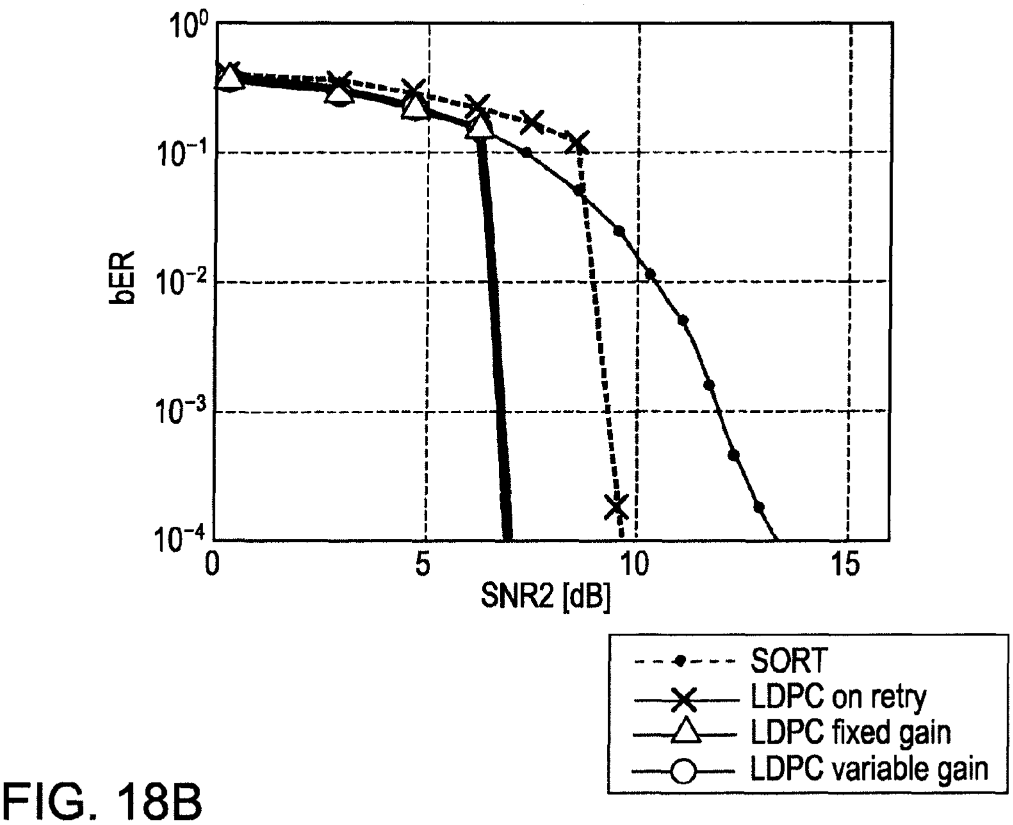
FIGS. 18A and 18B are diagrams illustrating simulation results (bER, LDPC repetitive count) for proving validity of the LLR computation technique premised with the present embodiment.
Figure 18B:
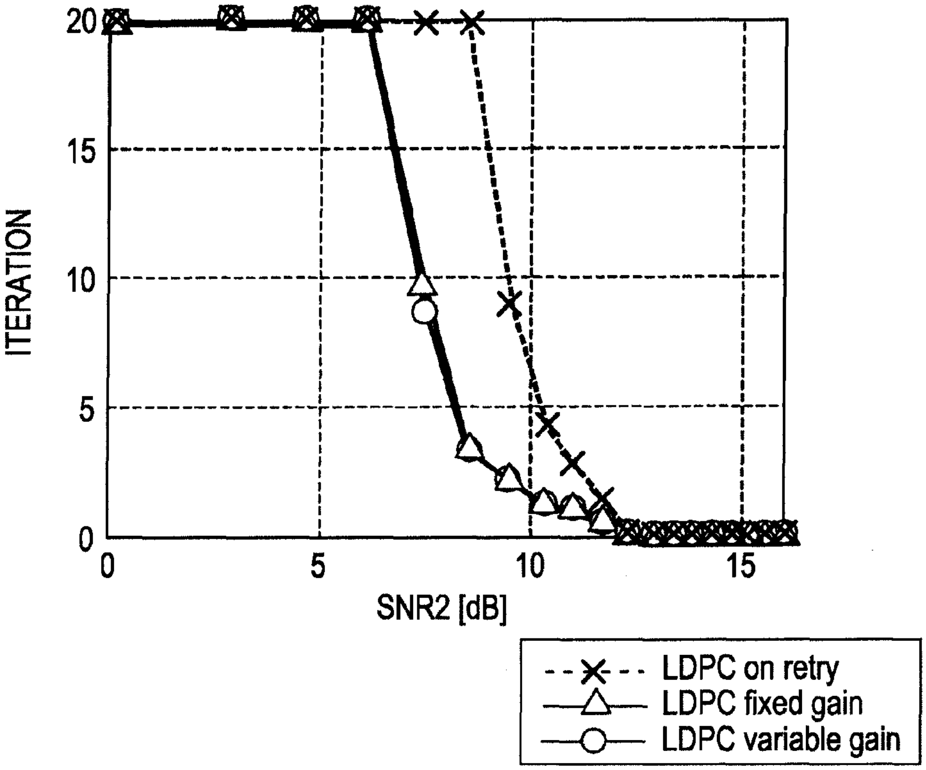

In FIGS. 18A and 18B, FIG. 18A illustrates simulation results regarding bER, and FIG. 18B illustrates simulation results regarding the repetitive count of the LDPC decoding processing.

Specifically, FIG. 18A is results obtained by simulating change in bER when gradually applying white Gauss noise as noise, where SNR is taken as the horizontal axis, and bER is taken as the vertical axis. Also, FIG. 18B is results obtained by simulating change in the repetitive count similarly when gradually applying white Gauss noise as noise, where SNR is taken as the horizontal axis, and the repetitive count is taken as the vertical axis.

Here, the repetitive count is an average value when executing decoding processing regarding 13 LDPC blocks.

Note that the simulation results regarding the technique of this example are indicated with a combination between a solid line and white circular marks serving as "LDPC variable gain" in the drawing, as the common items of FIGS. 18A and 18B. Also, in FIGS. 18A and 18B, simulation results regarding the following are also illustrated together in comparison.

"LDPC no retry" . . . a technique for determining the LLR to be "0" when a decoding error occurs (a combination between a dashed line and an x mark)

"LDPC fixed gain" . . . a technique for fixing the gain g with "1" (a combination between a solid line and a triangle mark)

Also, in particular, in FIG. 18A, as reference, bER regarding the decoding results of sparse code using sorting check is also illustrated with "SORT" (solid line and black circle).

Note that, with simulation, E(16, 3, 8) are taken as sparse encoding parameters. Also, with regard to LDPC code, parity is computed using regular code wherein code length is 4947, check code count is 2497, column weight is 3, and row weight is 6, as LDPC.

First, in FIG. 18A, with "SORT" wherein error correction according to LDPC has not been executed, while an error remains until SNR is 12.5 dB, with this example ("LDPC variable gain") wherein error correction according to LDPC is executed, "LDPC no retry", and "LDPC fixed gain", errors disappear with SNR>7.0 dB, and effects according to LDPC appear markedly.

Also, in FIG. 18A, comparing this example and "LDPC no retry" shows error free SNR to be 7.0 dB or so in the case of this example, and 9.5 dB or so in the case of "LDPC no retry", and accordingly, it can clearly found that this example is superior with regard to bER.

Also, in FIG. 18A, comparing this example and "LDPC fixed gain", confirms that this example is slightly superior in reproducing performance. However, in this case, in the sense of error free SNR, both are generally the same 7.0 dB or so.

According to the results in FIG. 18A, if we use a technique for adjusting an LLR candidate value at the time of occurrence of a decoding error such as this example, it can be found that this is advantageous with regard to bER (reproducing performance).

Also, with regard to the repetitive count in FIG. 18B, first, comparing this example and "LDPC fixed gain", confirms that this example is apt to be slightly less. In particular, in the neighborhood of SNR=7.0 dB which is error free, this example exhibits a smaller repetitive count.

Also, with comparison as to "LDPC no retry", it can be clearly confirmed that this example exhibits a smaller repetitive count.

According to the results in FIG. 18B, it can be understood that this example is the most superior as compared to both techniques of "LDPC fixed again" and "LDPC no retry" with regard to repetitive count, as well.

2. First Embodiment 2-1. Mapping Technique Serving as First Embodiment

Now, the LLR computation technique described above is only an example regarding a suitable LLR computation technique in the case of applying LDPC with the hologram recording/reproducing system. As can be understood from the description so far, in the case that sparse code (balance code) is used as recorded modulation code such as the hologram recording/reproducing system, at the time of obtaining the LLR of each bit of an LDPC code string from the read signal, at least the following technique should be used.

Specifically, a technique is used wherein with regard to the read signal in increments of block data, switching of amplitude rank order to obtain the decoding results thereof is repeated, and at the process thereof, the computation of an LLR is executed so that a smaller (absolute) value is given as an LLR to a bit of which the value has been inverted at the time of initial switching of amplitude rank order, and a greater (absolute) value is given as an LLR to a bit of which the value has not been inverted even if switching of amplitude rank order is repeated.

Now, in the case of using such a technique, as described in FIG. 15, it is ideal that the number of bits of which the values are inverted of decoding results when executing one-time switching of rank order is "1" (i.e., the Hamming distance of the decoding results is 1). That is to say, thus, difference can be generated as to the likelihood of each bit, and consequently, a more suitable LLR value can be obtained.

Figure 19:
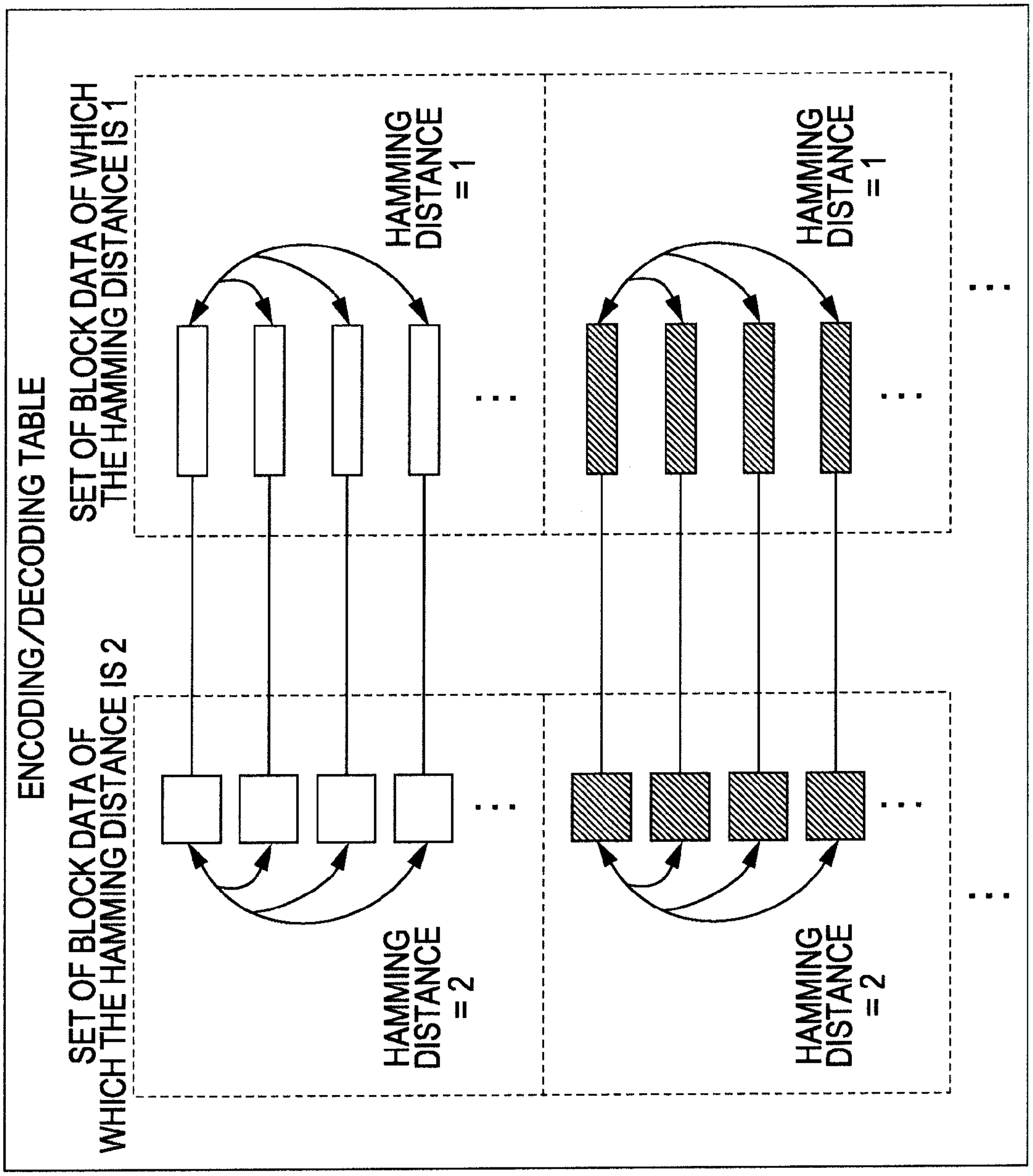
FIG. 19 is a diagram exemplifying correspondence relation between a set of block data having a relationship of "Hamming distance is 2" within an encoding/decoding table of balance code, and a set of k-bit data patterns having a relationship of "Hamming distance is 1"

Thus, in order to obtain "1" as the number of bits of which the values are inverted of decoding results when executing one-time switching of rank order, for example, such as shown in FIG. 19, a set of k-bit data patterns having a relationship of "the Hamming distance being 1" should be correlated to a set of block data having a relationship of "the Hamming distance being 2" within a balance code encoding/decoding table.

It should be noted that with block data serving as sparse (balance) code, the number of bits "1" is restricted to 1. Accordingly, along with one-time switching of amplitude rank order, two bits necessarily differ between block data before switching and block data after switching, and accordingly, the Hamming distance between block data is necessarily "2".

Here, as described above, in the case of executing sparse encoding according to E(16, 3, 8), of all the block data patterns, patterns satisfying a condition that "1" does not continue vertically and horizontally are 276 kinds. Of 276 kinds, block data used for actual sparse encoding (i.e., block data used as code words) is 256 kinds by $2^8$.

Let us consider a combination of block data having a relationship of "the Hamming distance being 2" regarding 256 block data groups used for encoding.

For example, as an example of a data conversion table according to straight mapping shown in FIGS. 4 through 10, when viewing block data

"1001
0100
0000
0000"

corresponding to "##2##", in FIG. 4, as block data having a relationship of "the Hamming distance being 2" as to the block data of this "##2##", there are "##1##", "##3##", "##10##", "##13##", "##15##", "##17##", and "##26##", Similarly, for example, when viewing "##5##", in FIG. 4, as block data having a relationship of "the Hamming distance being 2" as to the block data, there are "##0##", "##4##", "##6##", "##8##", "##19##", "##28##", "##32##", and "##34##".

Thus, with regard to each piece of block data with the 256 block data groups used for encoding, block data having a relationship of "the Hamming distance being 2" as to the block data thereof is checked. That is to say, all the sets of block data having a relationship of "the Hamming distance being 2" with the 256 block data groups are checked. Thus, all the assumable combinations of block data having a relationship of "the Hamming distance being 2" according to switching of amplitudes can be found.

Note that, for example, in the case of using the straight mapping table shown in FIGS. 4 through 10, when checking the total number of the sets of block data having a relationship of "the Hamming distance being 2" of all, the number thereof is 5598.

Now, with regard to a case wherein "1" is arranged to be obtained as the number of bits of which the values are inverted of decoding results when executing one-time switching of rank order, it is ideal to correlate a set of data patterns having a relationship of "the Hamming distance being 1" to all the sets of block data having a relationship of "the Hamming distance being 2". However, in the case of considering a practical encoding ratio, this is very difficult.

Therefore, in practice, a solution is to correlate a set of data patterns having a relationship of "the Hamming distance being 1" to sets of block data having a relationship of "the Hamming distance being 2" as much as possible.

Thus, in order to correlate a set of data patterns having a relationship of "the Hamming distance being 1" to sets of block data having a relationship of "the Hamming distance being 2" as much as possible, with the present embodiment, according to a technique such as the following, mapping for determining the correspondence relation of "$2^k$ pieces of block data" as to "$2^k$ data patterns" is executed.

That is to say,

1) Mapping for correlating each of $2^k$ pieces of block data to each of $2^k$ data patterns is repeated multiple times so as to obtain different mapping patterns to be generated for each mapping, thereby generating multiple mapping patterns.

2) An evaluated value for integrating each Hamming distance of a set of k-bit data patterns correlated to each of sets of block data of which "the Hamming distance is 2" with $2^k$ block data groups used for the mapping thereof is computed for each generated mapping pattern, and a mapping pattern where this evaluated value is the minimum is selected.

Specifically, with the first embodiment, as "an evaluated value" in the above 2), "Sum of each Hamming distance of a set of k-bit data patterns correlated to each of sets of block data of which "the Hamming distance is 2" with $2^k$ block data groups used for the mapping" is computed.

Here, "sets of block data of which "the Hamming distance is 2" with $2^k$ block data groups used for the mapping" indicate sets of block data having a relationship of "the Hamming distance being 2" with 256 data block data groups under k=8 being set such as this example. That is, we will say that for example, in the case of generating mapping patterns according to straight mapping such as shown in FIGS. 4 through 10, there are the above 5598 kinds of sets.

As described above, with the present embodiment, sum of each Hamming distance of a set of k-bit data patterns correlated to each of "sets of block data of which "the Hamming distance is 2" with $2^k$ block data groups used for the mapping" is calculated as an evaluated value regarding each generated mapping pattern. This evaluated value can be restated as being the "sum of Hamming distance between k-bit data patterns corresponding to a set wherein the Hamming distance between block data is 2".

Here, correlating many more "sets of data patterns of which the Hamming distance is "1"" to "sets of block data of which "the Hamming distance is 2" with $2^k$ block data groups used for the mapping", with regard to the above evaluated value to be computed as "sum of Hamming distance between k-bit data patterns corresponding to a set wherein the Hamming distance between block data is 2", shows the value thereof to become small.

Conversely, correlating many more sets of data patterns of which the Hamming distance is great to "sets of block data of which "the Hamming distance is 2" with $2^k$ block data groups used for the mapping", the value of the above evaluated value becomes great.

Thus, the above evaluated value computed with the present embodiment becomes, according to the size thereof, a value representing the size of the number of "sets of data patterns of which the Hamming distance is "1"" correlated to "sets of block data of which "the Hamming distance is 2" with $2^k$ block data groups used for the mapping".

Thus, according to the technique of the present embodiment for selecting a mapping pattern where the above evaluated value becomes the minimum such as described above, of the generated multiple mapping patterns, a mapping pattern with the most sets of data patterns having a relationship of "the Hamming distance being 1" as to sets of block data having a relationship of "the Hamming distance being 2" can be selected.

That is to say, thus, the number of cases can be maximally increased wherein the number of bits of which the value are inverted of decoding results when executing switching of rank order is "1", and accordingly, improvement in the reliability of the value of an LLR to be computed can be realized. That is to say, consequently, further improvement in LDPC decoding performance can be realized.

2-2. Processing Procedure

A specific processing procedure for realizing the mapping technique serving as the first embodiment described above will be described with reference to the flowchart in FIG. 20.

Figure 20:
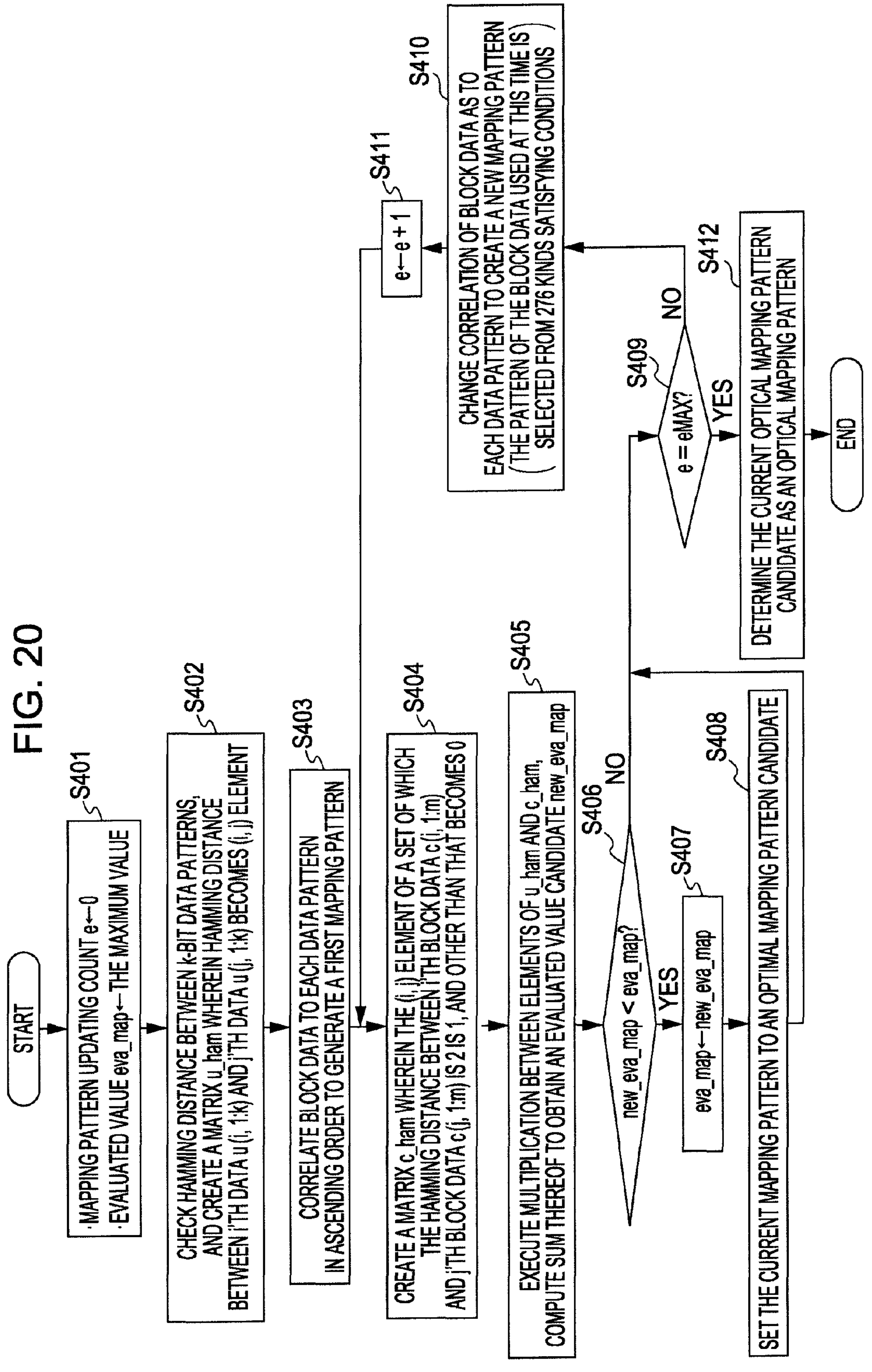
FIG. 20 is a flowchart illustrating a processing procedure for realizing a mapping technique serving as a first embodiment.

In FIG. 20, first, in step S401, the following is set.

Updating count e of the mapping pattern←0

Evaluated value eva_map←the maximum value

The updating count e of the mapping pattern is a value to be incremented each time a mapping pattern is newly created, and is a value representing the updating count of the mapping pattern.

Also, the evaluated value eva_map is an evaluated value serving as the first embodiment described above. In step S401, the maximum value is set as the initial value of the above evaluated value eva_map. As for the maximum value, a value is set which is so great that it is incomputable with the evaluated value computation technique (e.g., $10^{10}$).

In the subsequent step S402, the Hamming distance between k-bit data patterns is checked, and a matrix u_ham is created wherein the Hamming distance between i'th data u(i, 1:k) and j'th data u(j, 1:k) becomes an (ij) element.

Specifically, in the case of k=8 such as the case of this example, a matrix u_ham is created as follows wherein the Hamming distance between i'th data u(i, 1:k) and j'th data u(j, 1:k) becomes an (ij) element.

$$u\_ham(ij)=sum(xor(u(i,1{:}8),u(j,1{:}8)))$$

where xor represents exclusive OR, and sum represents the sum.

In the next step S403, block data is correlated to each data pattern in ascending order, thereby creating the first time mapping pattern. Specifically, $2^k$ pieces of block data are extracted from (276) block data groups satisfying a condition (a rule of recorded modulation code) that “1” does not continue vertically and horizontally, and these are correlated to each of $2^k$ data patterns in ascending order, thereby creating the first time mapping pattern.

In the next step S404, a matrix c_ham is created wherein the (ij) element of sets of which the Hamming distance between i’th block data c(i, 1:m) and j’th block data c(j, 1:m) is 1, and others are 0.

Here, the block data in the case of this example is two-dimensional array data made up of 4×4=16 bits, and accordingly, i’th block data is represented by c(i, 1:4, 1:4). Similarly, j’th block data is represented by c(j, 1:4, 1:4).

Specifically, in step S404, a matrix c_ham is created as follows wherein the (ij) element of sets of which the Hamming distance between i’th block data c(i, 1:4, 1:4) and j’th block data c(j, 1:4, 1:4) is 1, and others are 0.

*c*_ham(*ij*)=(sum(sum(xor(*c*(*i*, 1:4, 1:4), *c*(*j*, 1:4, 1:4)))) ==2)

where “==” represents match comparison for each element.

In the subsequent step S405, multiplication for each element between u_ham and c_ham is executed, and the sum thereof is computed as an evaluated value candidate new_eva_map.

In the case of this example, the evaluated value new_eva_map is computed as follows.

new_eva_map=sum(sum(*c*_ham(1:256, 1:256)***u*_ham))

where “*” represents multiplication for each element.

In the next step S406, determination is made regarding whether or not the evaluated value candidate new_eva_map is smaller than the current evaluated value eva_map.

Specifically, determination is made regarding whether or not, with regard to a mapping pattern newly generated in the previous step S403 (or later-described S410), the value of the evaluated value candidate new_eva_map newly computed in step S405 is smaller than the current evaluated value eva_map held at the execution point in step S406.

In the case that a negative result to the effect that the evaluated value candidate new_eva_map is not smaller than the current evaluated value eva_map is obtained in step S406, the processing proceeds to later-described step S409.

On the other hand, in the case that a positive result to the effect that the evaluated value candidate new_eva_map is smaller than the current evaluated value eva_map is obtained in step S406, the processing proceeds to step S407, where the evaluated value eva_map is updated to the evaluated value candidate new_eva_map (eva_map←new_eva_map). That is to say, hereafter, the value of the “current” evaluated value eva_map is replaced with the value of the latest evaluated value candidate new_eva_map computed in step S405.

Subsequently, in step S408, the current mapping pattern is determined to be an optical mapping pattern candidate, and then the processing proceeds to step S409.

In step S409, determination is made regarding whether or not the updating count e of the mapping pattern has reached a predetermined updating count upper limit value eMAX.

In the case that a positive result to the effect that the updating count e of the mapping pattern has reached the upper limit value eMAX is obtained in step S409, such as shown in the drawing, the processing proceeds to step S412, where the current optical mapping pattern candidate is determined to be the optimal mapping pattern, and the processing shown in the drawing ends.

Note that, as can be understood from this, with the processing in FIG. 20, at the time of repeating creation of a mapping pattern a predetermined number of times, a mapping pattern of which the evaluated value is the minimum is determined to be an optical mapping pattern.

On the other hand, in the case that a negative result to the effect that the updating count e of the mapping pattern has not reached the upper limit value eMAX is obtained, the processing proceeds to step S410, where a new mapping pattern is created by changing the correlation of block data as to each data pattern. At this time, let us say that a pattern of block data to be used is selected from 276 kinds satisfying a condition that “1” does not continue vertically and horizontally. Specifically, 256 block data groups used at the time of updating of the mapping pattern in step S410 are not fixed to the 256 block data groups selected at the time of creating the first time mapping pattern by the previous step S403, but each block data to be correlated to each data pattern is selected from 276 kinds satisfying the above condition.

In the subsequent step S411, the updating count e is incremented (e←e+1).

Subsequently, after the updating count e is incremented, the processing returns to the previous step S404. Thus, with regard to the new mapping pattern generated in step S410, computation of the evaluated value candidate new_eva_map by steps S404 and S405 is executed.

Thus, according to the processing shown in FIG. 20, updating (creation is eMAX+1 times) of the mapping pattern is repeated by eMAX times that are the upper limit value of the updating count e, of which a mapping pattern where the evaluated value eva_map is the minimum is determined (selected) as the optimal mapping pattern.

Thus, a mapping pattern can be selected as a mapping pattern of the data conversion table for encoding (and decoding) sparse code, whereby the number of cases can be increased wherein the number of bits of which the values are inverted of decoding results when executing switching of rank order becomes “1”.

2-3. Configuration for Realizing Data Modulation Serving as Embodiment

Figure 21:
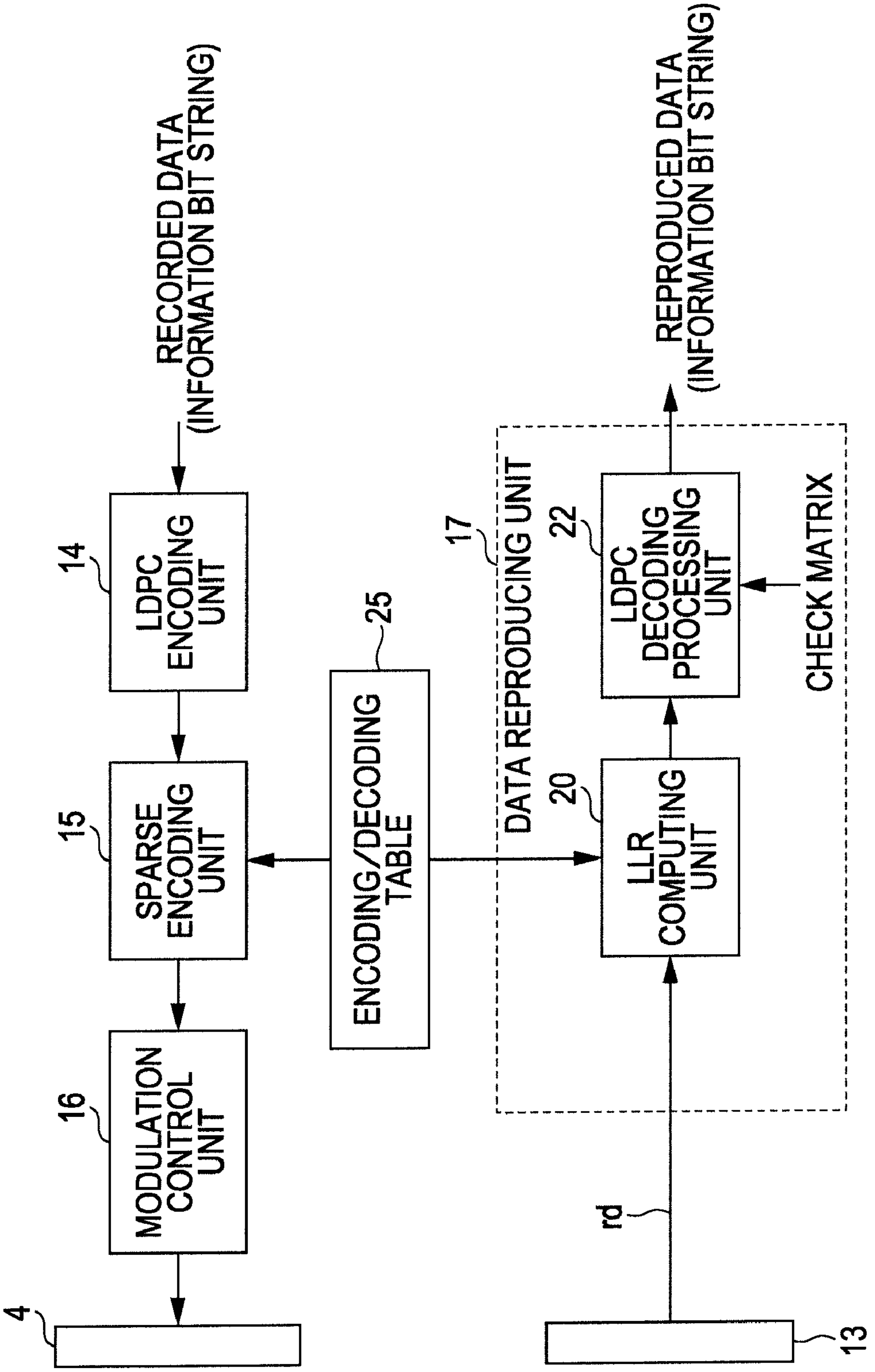
FIG. 21 is a block diagram illustrating a configuration for realizing data modulation serving as the first embodiment.

FIG. 21 is a block diagram illustrating a configuration for executing data modulation (and demodulation) based on the mapping pattern selected by the above technique.

It should be noted that with the present embodiment as well, the whole configuration of the recording/reproducing device is the same as that shown in FIG. 1. In FIG. 21, of the whole configuration of the recording/reproducing device shown in FIG. 1, the configuration of a portion excluding an optical pickup shown with a dashed line is extracted and illustrated. Note that in FIG. 21, the portions that have already been described in FIG. 1 will be denoted with the same reference numerals, and description thereof will be omitted.

As shown in the drawing, in this case as well, recorded data is input to the sparse encoding unit 15 via encoding by the LDPC encoding unit 14. The sparse encoding unit 15 in this case executes sparse encoding of the LDPC code string input from the LDPC encoding unit 14 based on an encoding/decoding table 25.

With the encoding/decoding table 25, the mapping pattern thereof (correspondence relation of each block data as to each k-bit data pattern) is the mapping pattern obtained by the optimal mapping pattern selecting processing serving as the first embodiment such as described in FIG. 20 for example.

The block data obtained by the sparse encoding unit 15 executing sparse encoding based on the encoding/decoding table 25 is supplied to the modulation control unit 16. As described above, at the time of recording, the modulation control unit 16 drive-controls the SLM 4 based on the block data input from the sparse encoding unit 15, thereby generating signal light and reference light.

Also, as described above, the read signal rd from the image sensor 13 is input to the data reproducing unit 17. In this case as well, the same LLR computing unit 20 and LDPC decoding processing unit 22 as those shown in FIG. 12 are provided within the data reproducing unit 17.

In this case, the LLR computing unit 20 executes decoding of sparse code to be executed at the process of the LLR computation processing based on the encoding/decoding table 25.

Thus, with the recording/reproducing device of the present embodiment, encoding/decoding of sparse code is executed using the encoding/decoding table 25 where mapping has been executed so that many more sets of data patterns having a relationship of "the Hamming distance being 1" as to a set of block data having a relationship of "the Hamming distance being 2" as much as possible. Thus, with the LLR computation at the time of recording, the number of cases can be increased as much as possible wherein the number of bits of which the values are inverted of decoding results when executing switching of rank order is "1", and as a result thereof, a more suitable value can be obtained as the value of an LLR, and improvement in LDPC decoding performance can be realized.

2-4. Validity of Technique According to First Embodiment

Subsequently, the validity of the technique of the first embodiment described above will be described with reference to FIGS. 22 through 25.

FIG. 22 is a diagram illustrating a distribution of the Hamming distance between data patterns corresponding to a set of block data of which the Hamming distance is 2, in a table format. In FIG. 22, as the Hamming distance distribution, along with the distribution in the case of the first embodiment, a distribution in the case of having executed straight mapping ("straight" in the drawing) is also illustrated as comparison.

It should be noted that, as described above, the evaluated value of the first embodiment is defined as "sum of each Hamming distance of a set of k-bit data patterns correlated to each of sets of block data of which "the Hamming distance is 2" with $2^k$ block data groups used for the mapping". That is to say, the evaluated value of the first embodiment is equivalent to a value obtained by totaling all the values obtained by multiplying the value of a degree for each of Hamming distances of 1 through 8 by the Hamming distance thereof.

It can be found in FIG. 22 that, in the case of straight mapping, while the number of sets of which the Hamming distance between k-bit data patterns is 1 is 556, in the case of the first embodiment, the number thereof is 1100, i.e., around twice.

Also, in the case of straight mapping, while the number of sets of data patterns of which the Hamming distance is 8 is 18, in the case of straight mapping, the number of sets is 0. Similarly, even in the case of viewing the number of sets of data patterns of which the Hamming distance becomes relatively great 4 through 7, it can be confirmed that the number of sets in the first embodiment is all below the number of sets in the case of straight mapping.

According to these, can be found that the technique of the first embodiment is effective with regard to a different likelihood being given to each bit.

Note that, when totaling the degrees of each Hamming distance of 1 through 8 in FIG. 22, the total is 5598 in the case of straight mapping, and is 5432 in the case of the first embodiment. This is derived from the selecting method in the case of the first embodiment wherein, as also described in step S410, at the time of creating a mapping pattern candidate, a block data pattern is selected from 276 kinds of block data patterns that satisfy a predetermined condition without using the fixed 256 block data groups. That is to say, due to this point, 256 pieces of block data used for straight mapping is not identical to 256 pieces of block data used for the optimal mapping pattern selected with the technique of the first embodiment.

Figure 23A:
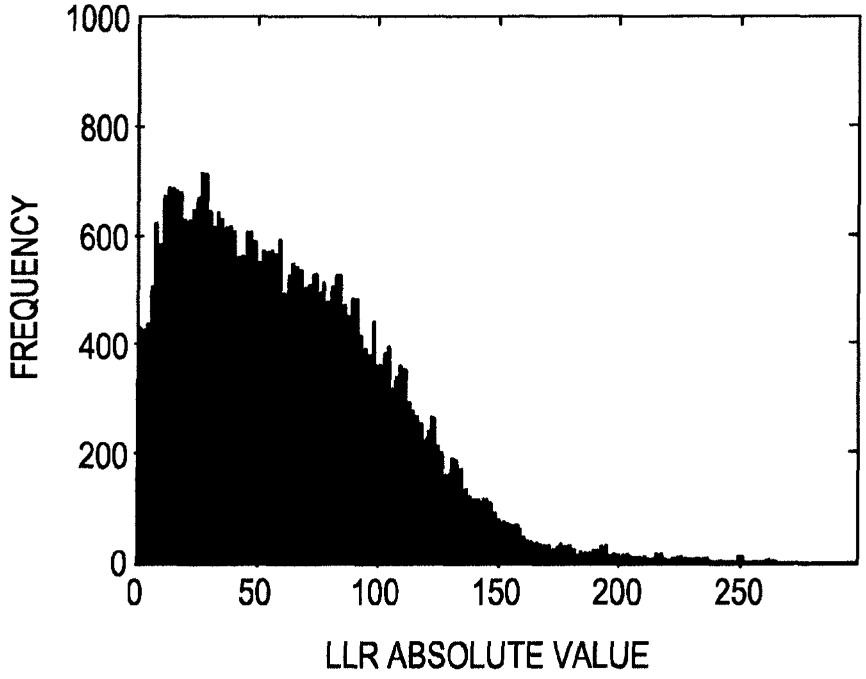
FIGS. 23A and 23B are diagrams illustrating a histogram (at the time of straight mapping, at the time of mapping according to the first embodiment) of an LLR absolute value.
Figure 23B:
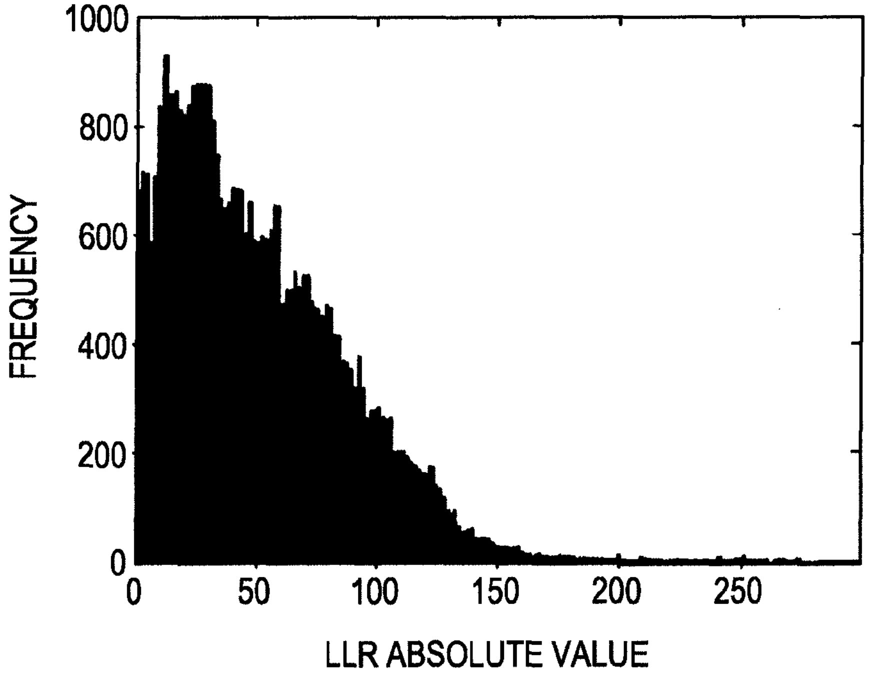

FIGS. 23A and 23B illustrate histograms of LLR absolute values. FIGS. 23A and 23B illustrate a distribution of LLR absolute values in the case of executing LLR computation by applying white Gauss noise (AWGN) so that SNR becomes 6 dB, wherein FIG. 23A illustrates results in the case of using the mapping pattern selected in the first embodiment, and FIG. 23B illustrates results in the case of using the mapping pattern according to straight mapping, respectively.

In the case of the straight mapping shown in FIG. 23B, it can be confirmed that LLR absolute values are concentrated on 30 or less, and the histogram has a steep peak shape. On the other hand, in the case of the first embodiment shown in FIG. 23A, it can be confirmed that up to 80 of the slope made up of LLR absolute values is not steep.

According to this result, it can be found that likelihood information where an absolute value is greater is provided to a reliable bit, and likelihood information where an absolute value is smaller is provided to an unreliable bit, by using the mapping pattern selected by the technique of the first embodiment.

Figure 24A:
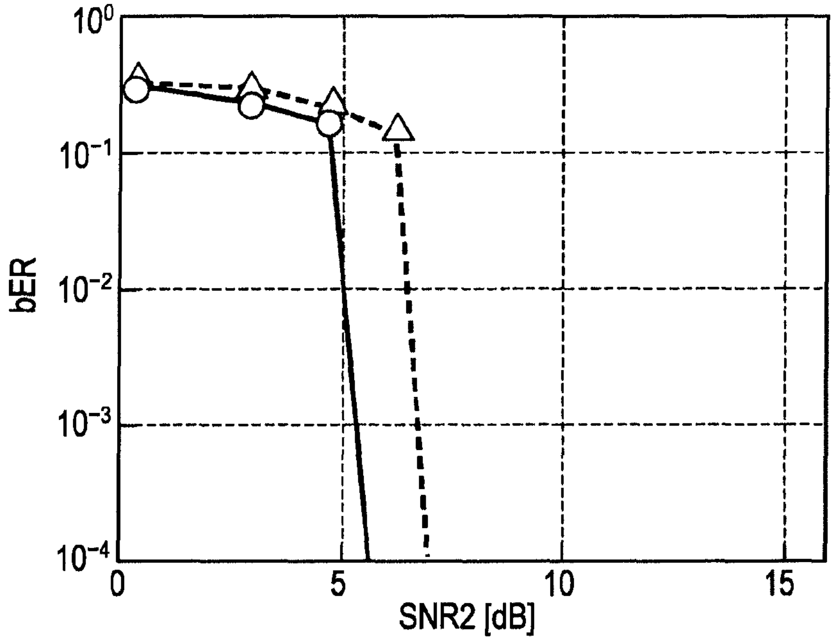
FIGS. 24A and 24B are diagrams illustrating simulation results of change property of bER, LDPC repetitive count as to noise addition in the case of executing mapping according to the first embodiment.
Figure 24B:
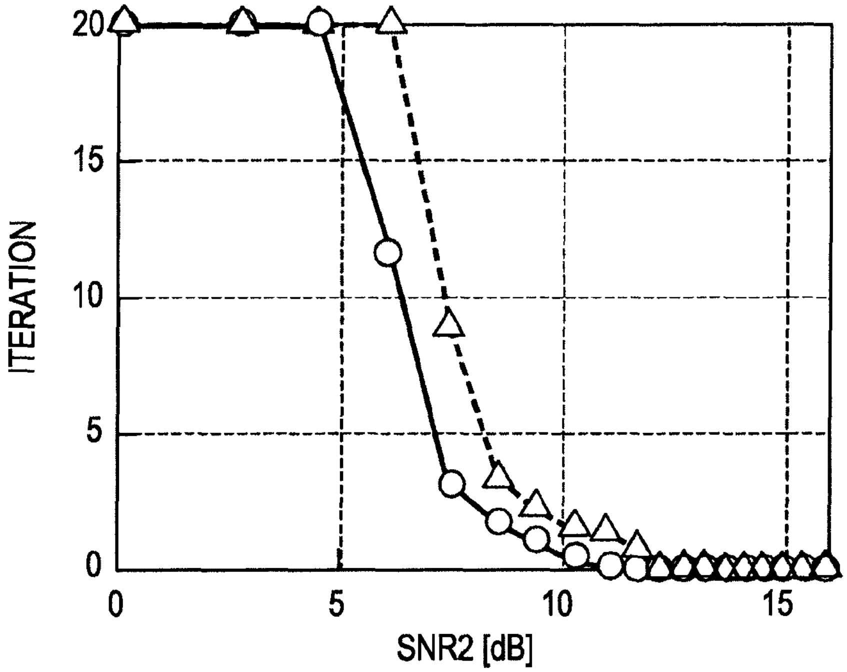

Also, FIGS. 24A and 24B illustrate simulation results regarding the property of bER as to SNR (noise addition) (FIG. 24A), and the property of the repetitive count of the LDPC decoding processing (FIG. 24B).

In FIGS. 24A and 24B, the results in the case of the first embodiment are illustrated with a combination of a solid line and white circular marks, and a combination of a dashed line and triangle marks illustrate the results shown in FIGS. 18A and 18B ("LDPC variable gain", i.e., in the case of straight mapping) as comparison.

Note that, in this case as well, a condition set with simulation is the same that in the case of FIGS. 18A and 18B.

First, with regard to bER in FIG. 24A, while an error remains up to around 7.0 dB in the case of straight mapping, an error can be corrected up to around 5.5 dB in the case of the first embodiment.

According to this result, in the case of using the mapping pattern selected with the technique of the first embodiment, it can be clearly understood that decoding performance (reproducing performance) improves as compared to the case of using the mapping pattern according to straight mapping.

Also, even when viewing the repetitive count in FIG. 24B, it can be clearly understood that the repetitive count in the case of the first embodiment is less than that in the case of straight mapping.

In particular, at the time of SNR=6 dB, while the repetitive count in the case of straight mapping reaches 20 times of the upper limit, the repetitive count in the case of the first embodiment stops at 11.4 times.

Figure 25:
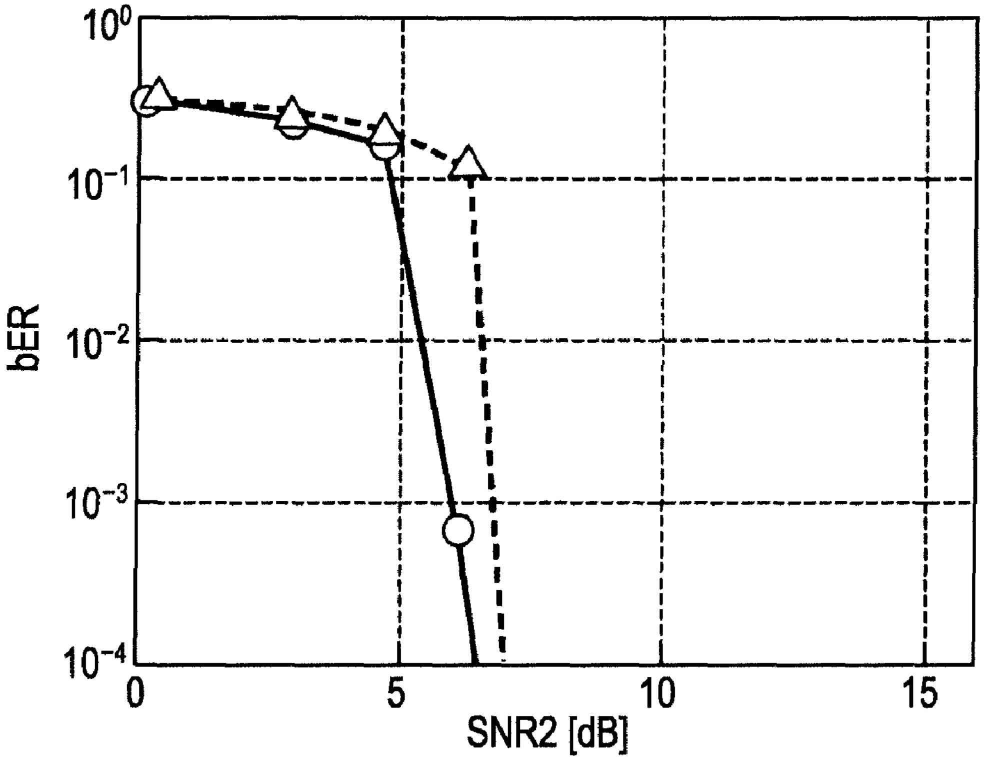
FIG. 25 is a diagram illustrating simulation results of change property of bER as to noise addition in the case of fixing block data patterns used for updating of mapping to 256 kinds.

Also, FIG. 25 illustrates the simulation results of bER when block data used at the time of updating of the mapping pattern (S410) is fixed to 256 kinds, as comparison, as described above, in the case of selecting the optical mapping pattern with the "sum of each Hamming distance of a set of k-bit data patterns correlated to each of sets of block data of which "the Hamming distance is 2" with $2^k$ block data groups used for the mapping" as an evaluated value.

Note that, in FIG. 25 as well, results indicated with a combination of a dashed line and triangle marks show results in the case of straight mapping. As shown in FIG. 25, even in the event that block data used at the time of updating of the mapping pattern is fixed to 256 kinds, improvement in decoding performance is realized as compared to the case of executing straight mapping.

However, it can be confirmed that decoding performance is somewhat inferior to the technique serving as the first embodiment shown in FIG. 24A (selecting block data to be used at the time of updating from 276 kinds satisfying the condition).

That is to say, in other words, in the event that block data to be used at the time of updating of the mapping pattern is selected from 276 kinds such as described in FIG. 20, improvement in decoding (reproducing) performance is realized correspondingly.

3. Second Embodiment 3-1. Mapping Technique Serving as Second Embodiment

Next, a second embodiment will be described. The second embodiment is to compute an evaluated value used at the time of selecting the optimal mapping pattern using a technique different from the case of the first embodiment. Specifically, with the second embodiment, an evaluated value computed as the "sum of each Hamming distance of a set of k-bit data patterns correlated to each of sets of block data of which "the Hamming distance is 2" with $2^k$ block data groups used for the mapping" is computed as the "sum of squares of each Hamming distance of a set of k-bit data patterns correlated to each of sets of block data of which "the Hamming distance is 2" with $2^k$ block data groups used for the mapping".

Note that, with the second embodiment as well, the configuration of the recording/reproducing device is the same as in the case of the first embodiment, and accordingly, redundant description thereof will be omitted. However, with the recording/reproducing device of the second embodiment, the content (mapping pattern) of the encoding/decoding table 25 shown in FIG. 21 differs from the case of the first embodiment.

Now, as reference, an example of the mapping pattern (encoding/decoding) obtained by the technique of the second embodiment for executing selection of the optical mapping pattern using an evaluated value serving as "sum of squares of Hamming distances" as described above will be shown in FIGS. 26 through 32.

3-2. Processing Procedure

Figure 33:
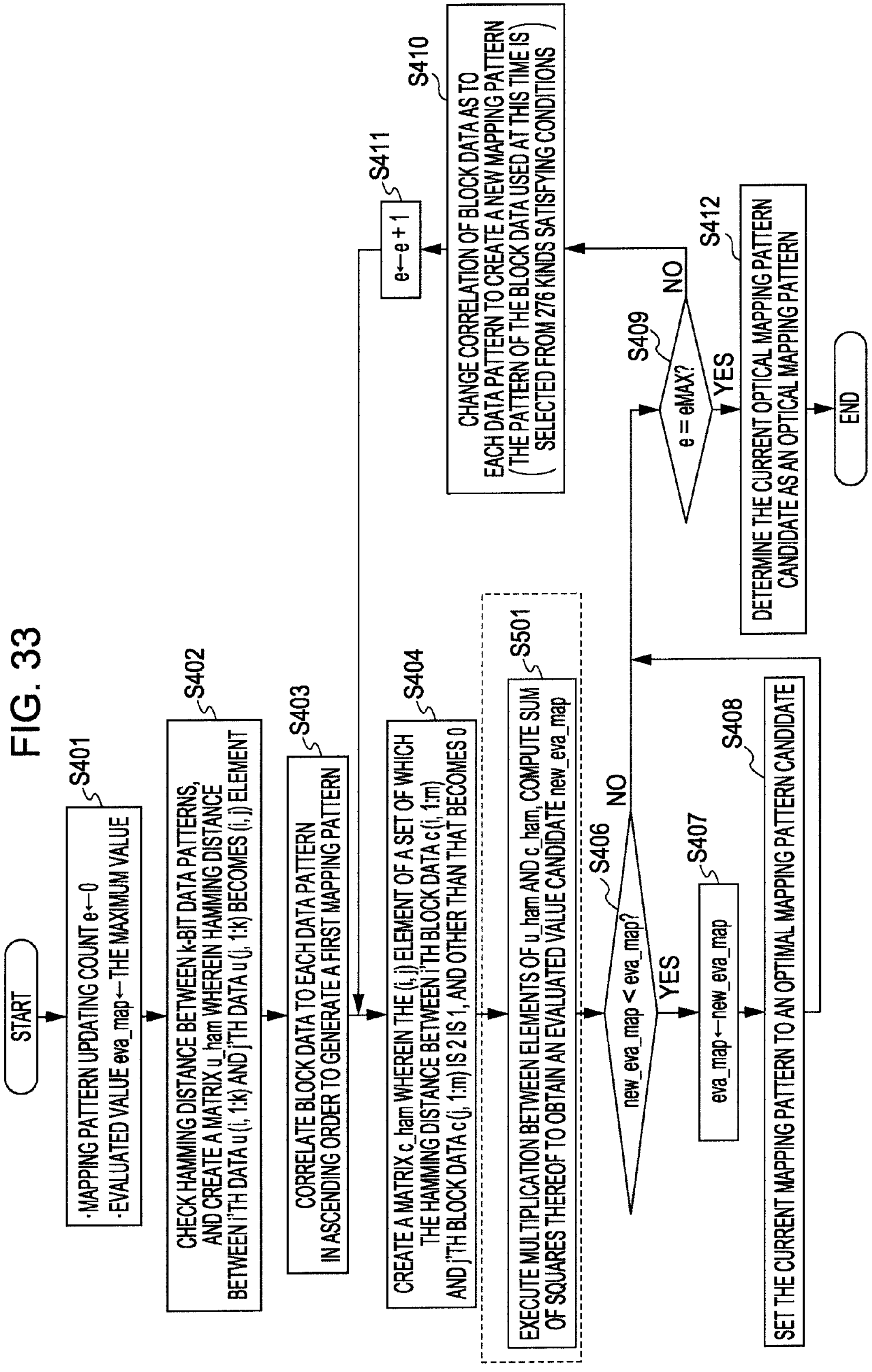
FIG. 33 is a flowchart illustrating a processing procedure for realizing the mapping technique serving as the second embodiment.

The flowchart in FIG. 33 illustrates the procedure of selection processing of the optical mapping pattern serving as the second embodiment (specific processing procedure for realizing the mapping technique serving as the second embodiment).

As can be understood by comparing FIGS. 33 and 20, the selection processing procedure of the optimal mapping pattern of the second embodiment is obtained by modifying the processing content in step S405 in FIG. 20, and other processing is the same as in the case of the first embodiment.

Specifically, with the second embodiment, instead of the processing in step S405, processing in step S501 in the drawing is executed. In step S501, processing is executed wherein multiplication for each element between u_ham and c_ham is executed, and the sum of squares thereof is computed to obtain an evaluated value candidate new_eva_map.

Specifically, the evaluated value candidate new_eva_map in this case is computed as follows.

new_eva_map=sum(sum(*c*_ham(1:256, 1:256) **u*_ham2))

where *u*_ham2=*u*_ham**u*_ham.

3-3. Validity of Technique According to Second Embodiment

FIG. 34 is, in the same way as with FIG. 22, a diagram illustrating a distribution of the Hamming distance between data patterns corresponding to a set of block data of which the Hamming distance is 2, in a table format. In FIG. 34, along with the distribution in the case of executing straight mapping, and the distribution in the case of the first embodiment, a distribution in the case of the second embodiment is illustrated.

As can be clearly seen from FIG. 34, in the case of using the technique of the second embodiment for computing an evaluated value using "sum of squares of Hamming distances", the number of sets of which the Hamming distance between k-bit data patterns becomes 1 increases as compared to the case of using straight mapping or the technique of the first embodiment. Specifically, the number thereof becomes 1162.

Also, when viewing the number of sets of data patterns of which the Hamming distance is four or more, it can be found that the number thereof in the case of the second embodiment is further below that in the case of the first embodiment. Specifically, while the total of sets of which the Hamming distance is four or more is 790 (648+122+18+2+0) in the case of the first embodiment, the total of sets in the case of the second embodiment is 702 (572+90+40+0+0), which is much less than the case of the first embodiment.

According to the results in FIG. 34, comparing the first embodiment and the second embodiment, shows that, with the second embodiment, the total of sets of which the Hamming distance is three or less is greater, and the total of sets of which the Hamming distance is four or more is smaller.

From this point, with regard to the likelihood information having a different size being given to each bit, it can be said that the technique of the second embodiment is superior to the technique in the case of the first embodiment.

Note that, when totaling the degree of each Hamming distance of 1 through 8 regarding the distribution of the second embodiment in the drawing, the value thereof is 5490, which differs from 5432 in the case of the first embodiment. This is quite natural when considering that the mapping patterns selected as the optimal mapping pattern differ between the first embodiment and the second embodiment. That is to say, with both of the first and second embodiments, 256 pieces of block data are selected from the 276 kinds at the time of generating a mapping pattern candidate, and accordingly, with the mapping pattern finally selected, a combination of 256 pieces of block data may differ between both.

Figure 35:
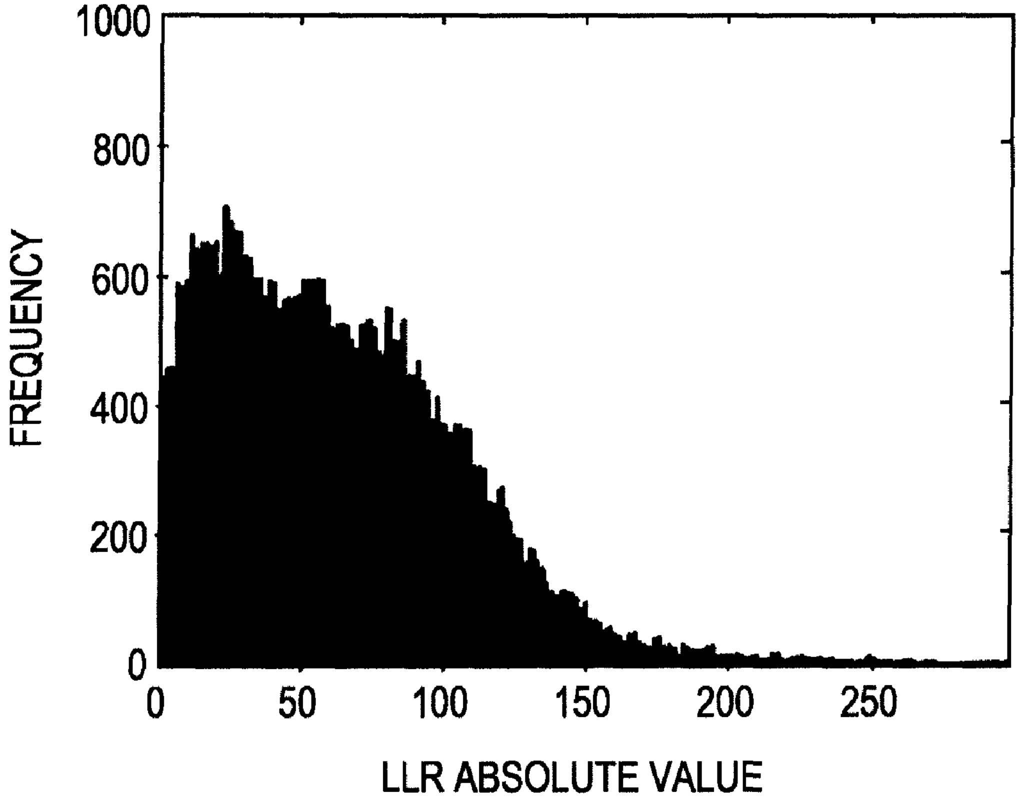
FIG. 35 is a diagram illustrating a histogram (at the time of mapping according to the second embodiment) of an LLR absolute value.

Also, FIG. 35 illustrates a histogram of LLR absolute values in the case of executing LLR computation using the mapping pattern selected by the technique of the second embodiment.

FIG. 35 also illustrates, in the same way as with FIGS. 23A and 23B, a distribution of LLR absolute values in the case of executing LLR computation by applying white Gauss noise (AWGN) so that SNR becomes 6 dB.

When comparing this with FIG. 23A, in the case of the second embodiment as well, it can be found that up to 80 of the slope made up of LLR absolute values is not steep, and generally the same results as with the first embodiment are obtained.

Figure 36A:
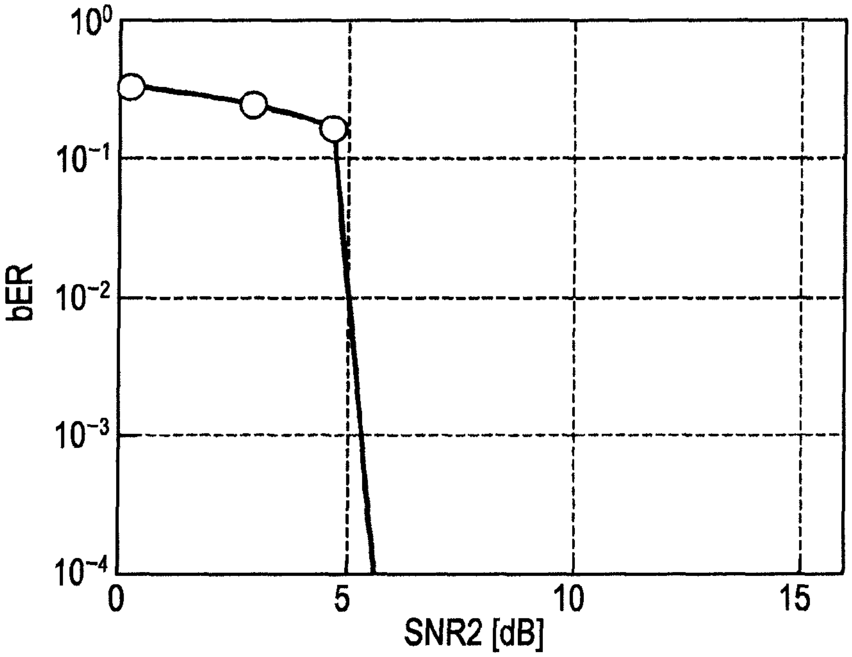
FIGS. 36A and 36B are diagrams illustrating simulation results of change property of bER, LDPC repetitive count as to noise addition in the case of executing mapping according to the second embodiment.
Figure 36B:
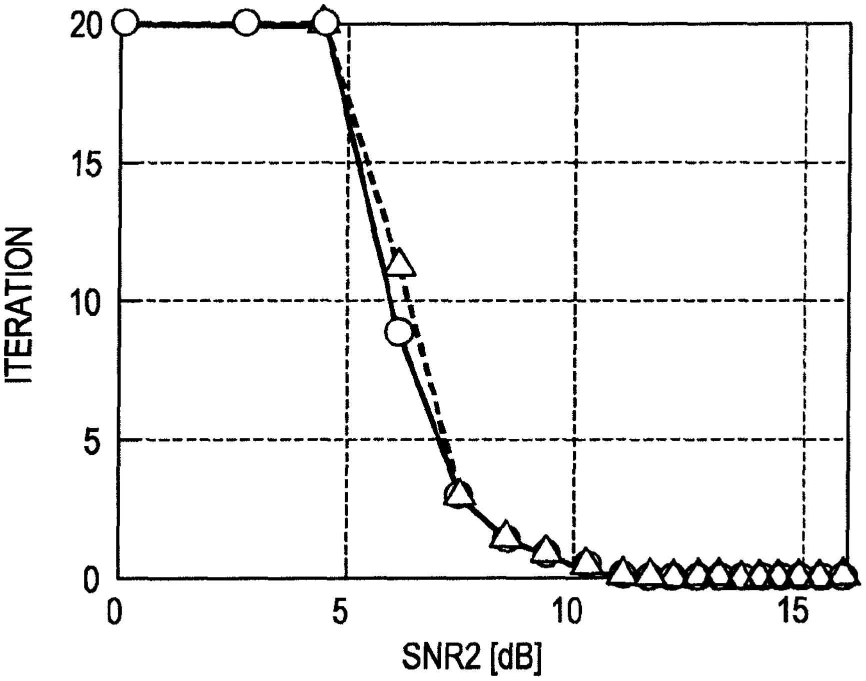

Also, FIGS. 36A and 36B illustrate, in the same way as with FIGS. 18A, 18B, 24A, and 24B, simulation results regarding the property of bER as to SNR (noise addition) (FIG. 36A), and the property of the repetitive count of the LDPC decoding processing (FIG. 36B).

Note that, in FIGS. 36A and 36B, the results in the case of the second embodiment are indicated with a set between a solid line and white circular marks. Also, in FIG. 36B, a set between a dashed line and triangle marks in the drawing indicates the results in the case of the first embodiment shown in FIG. 24B as comparison. In this case as well, the condition set for simulation is the same as the condition in the case of FIGS. 18A and 18B.

Comparing FIG. 24A and FIG. 36A, it can be confirmed that generally the same property is obtained regarding bER in both cases of the first and second embodiments. On the other hand, when viewing the repetitive count in FIG. 36B, it can be found that the repetitive count in the case of the second embodiment is less than that in the case of the first embodiment.

In particular, at the time of SNR=6 dB, the repetitive count in the case of the first embodiment is 11.4 times, but in the case of the second embodiment, the repetitive count is reduced to 9.4 times.

Thus, it can be found that according to the second embodiment, reduction in the repetitive count with the LDPC decoding processing is realized, and improvement in LDPC decoding performance is realized, as compared to the first embodiment.

4. Modifications

The embodiments of the present invention have been described so far, but the present invention should not be restricted to the embodiments described so far.

For example, with the above description, as an evaluated value at the time of selecting the optimal mapping pattern, "an evaluated value for integrating each Hamming distance of a set of k-bit data patterns correlated to each of sets of block data of which "the Hamming distance is 2" with $2^k$ block data groups used for mapping" is computed. Specifically, a case of computing "sum of each Hamming distance of a set of k-bit data patterns correlated to each of sets of block data of which "the Hamming distance is 2" with $2^k$ block data groups used for mapping" (first embodiment), or "sum of squares of each Hamming distance of a set of k-bit data patterns correlated to each of sets of block data of which "the Hamming distance is 2" with $2^k$ block data groups used for mapping" (second embodiment), has been exemplified.

However, "an evaluated value for integrating each Hamming distance" should not be restricted to these "sum of each Hamming distance" and "sum of squares of each Hamming distance", and as to "sets of block data of which "the Hamming distance is 2" with $2^k$ block data groups used for mapping", in the case that many more sets of data patterns of which the Hamming distance is small are correlated, the value thereof becomes small, and in the case that many more sets of data patterns of which the Hamming distance is great are correlated, another evaluated value may be used.

Alternatively, the technique for deriving the optimal mapping pattern is not restricted to the exemplified techniques, and as a mapping pattern to be used with a data conversion table for balance encoding (and decoding), at least "a mapping pattern mapped so that a set of data patterns of which the Hamming distance is 1 is correlated to a set of block data of which the Hamming distance is 2" may be used.

Also, various types of parameters relating to data modulation at the time of recording, exemplified with the above description (such as E(m, l, k) that are sparse code parameters, and the like) have been shown only for example, and should not be restricted to the exemplified parameters.

Also, with regard to the configuration of the recording/reproducing device shown in FIG. 1 as well, the present invention should not be restricted to this, and for example, a modification of the configuration may be made according to an actual embodiment as appropriate, for example, such as using an optical system compatible with a transparent-type hologram recording medium having no reflection film, or the like.

Also, with the above description, a case has been exemplified to simplify the description wherein recorded data is subjected to LDPC encoding as is, and the LDPC code string obtained from this is subjected to sparse encoding as is. That is to say, a case has been exemplified wherein modulation processing as to recorded data is made up of only the LDPC encoding processing and the sparse encoding processing.

However, in practice, it can be conceived to insert processing other than those LDPC encoding processing and sparse encoding processing as modulation processing as to recorded data.

Figure 37:
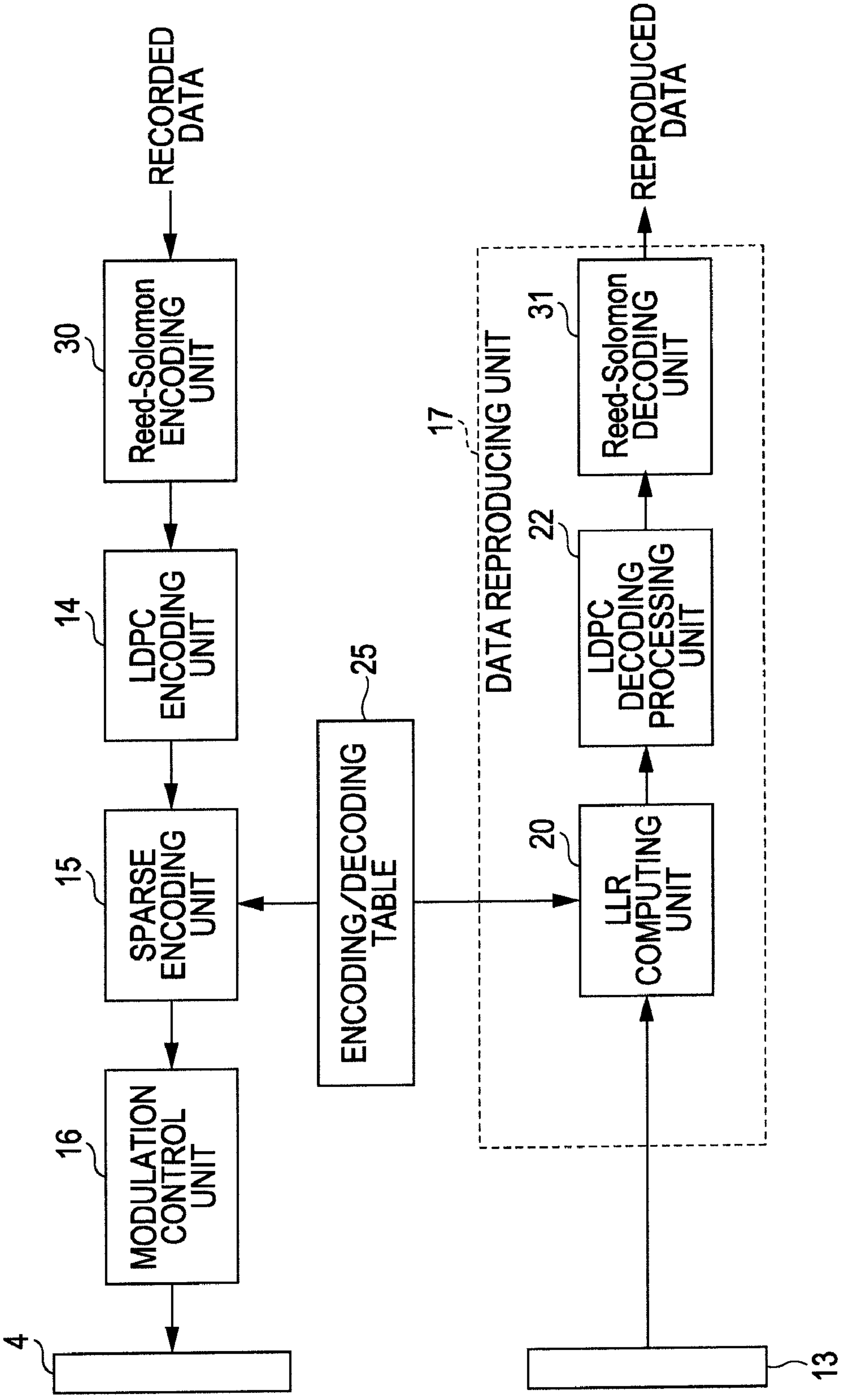
FIG. 37 is a diagram illustrating a configuration serving as a modification for executing error correction using LDPC code, and also error correction using Reed-Solomon code.
Figure 38:
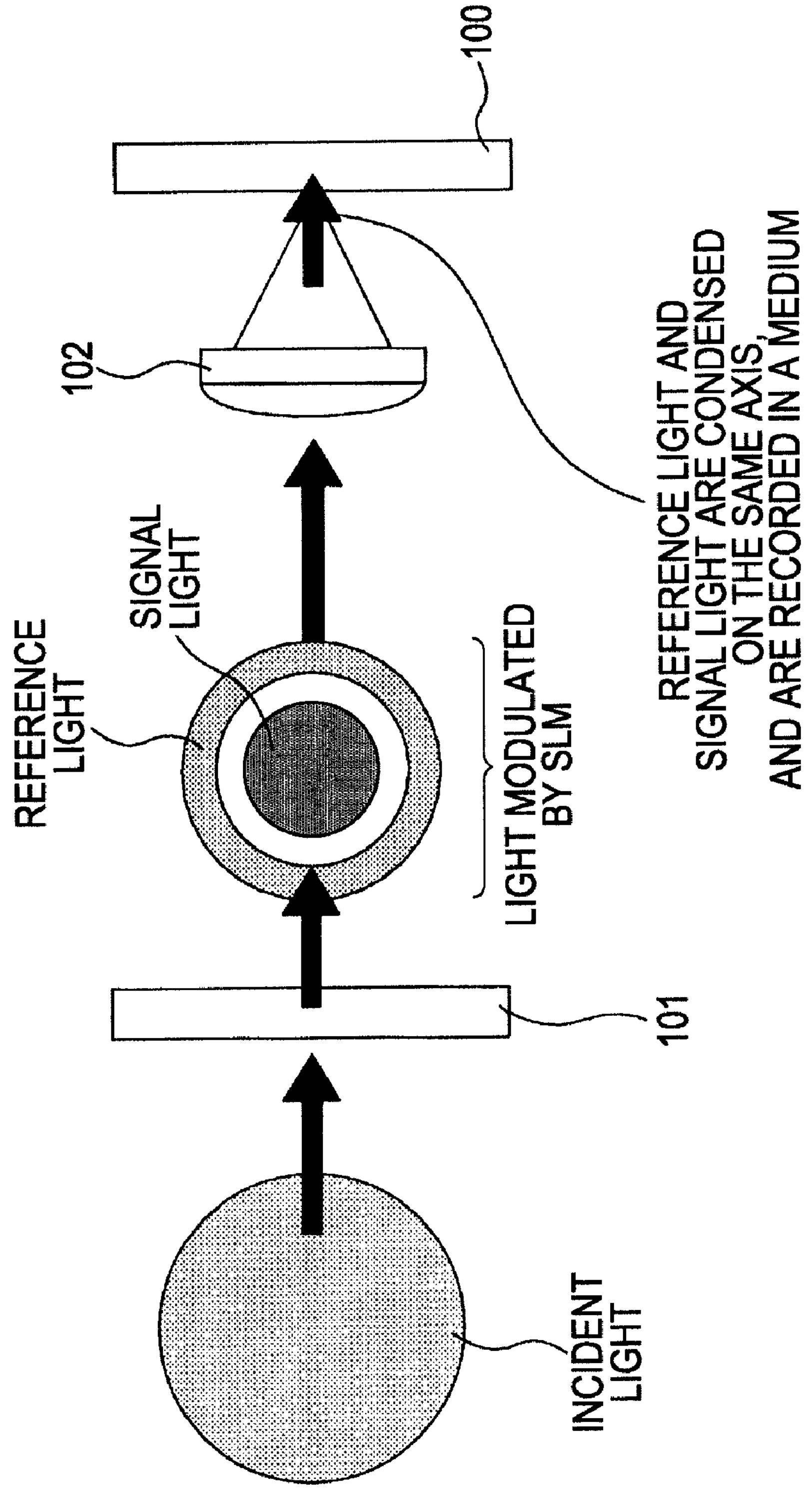
FIG. 38 is a diagram for describing a hologram recording technique according to a coaxial method.
Figure 39A:
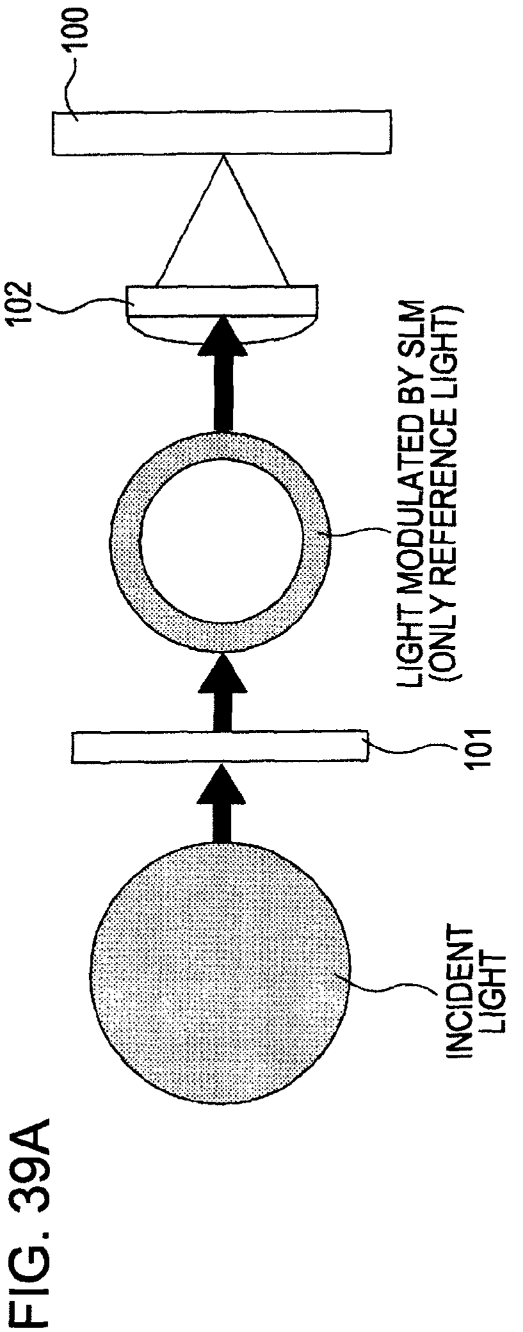
FIGS. 39A and 39B are diagrams for describing a hologram reproducing technique according to the coaxial method.
Figure 39B:
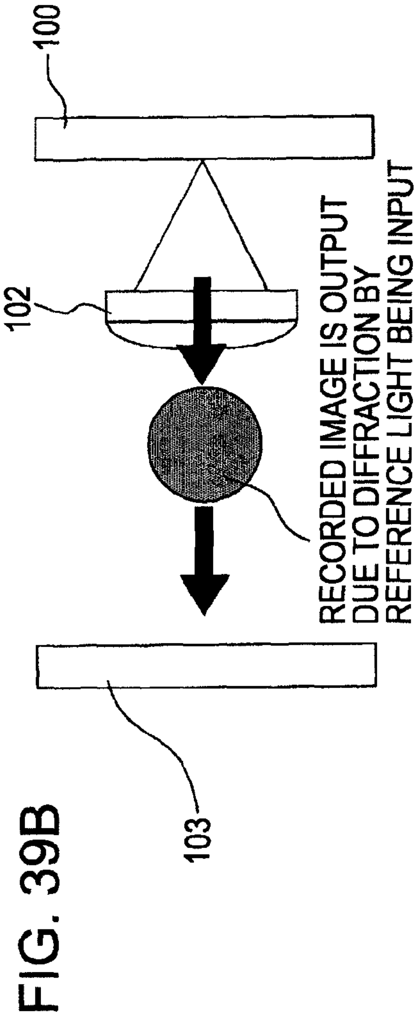

For example, in order to execute error correction processing using Reed-Solomon code along with error correction processing using LDPC code, a configuration for Reed-Solomon encoding/decoding may be added such as shown in FIG. 37.

FIG. 37 illustrates the configuration of a recording/reproducing processing system, thus, in the case of executing Reed-Solomon encoding/decoding. Note that, in this case as well, the whole configuration of the recording/reproducing device is the same as in the case of FIG. 1.

As shown in FIG. 37, with the recording processing system in this case, a Reed-Solomon encoding unit 30 for subjecting recorded data to Reed-Solomon encoding is added. In this case, the LDPC encoding unit 14 subjects the Reed-Solomon code output from the Reed-Solomon encoding unit 30 to LDPC encoding.

Also, with the reproducing processing system in this case, a Reed-Solomon decoding unit 31 for executing decoding of Reed-Solomon code as to the decoded results of the LDPC decoding processing unit 22 (i.e., Reed-Solomon code string) is added. The decoded results by the Reed-Solomon decoding unit 31 become reproduced data regarding the recorded data.

Note that a case has been exemplified here wherein another modulation processing is inserted before LDPC encoding (another decoding processing is inserted after LDPC decoding), but the present invention may be applied to a case where another modulation processing is inserted between LDPC encoding and sparse encoding (and another decoding processing is inserted between LLR computation and LDPC decoding).

Also, with the above description, a case has been exemplified wherein the present invention is applied to the hologram recording/reproducing system, but the present invention may suitably be applied to a case where channel data is made up of a two-dimensional array, for example, such as two-dimensional barcode writing/reading system or the like. However, the present invention is restricted to a case where balance code is used as recorded modulation code.

The present application contains subject matter related to that disclosed in Japanese Priority Patent Application JP 2009-028381 filed in the Japan Patent Office on Feb. 10, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A data modulating device comprising:

an LDPC encoding unit configured to execute LDPC encoding; and a balance encoding unit configured to process a data string subjected to encoding by said LDPC encoding unit as data to be encoded, and convert k bits of this data to be encoded into a balance code made up of m-bit block data;

wherein said balance encoding unit executes balance encoding of said data to be encoded using a data conversion table subjected to mapping so that a set of said k-bit data patterns of which the Hamming distance is 1 corresponds to a set of block data of which the Hamming distance is 2, and further wherein the variable k is an integer value defining a bit size of data patterns and the variable m is an integer value that defines a size of the block data and the variables k and m are each greater than 1.

2. The data modulating device according to claim 1, wherein mapping patterns of data within said data conversion table have been selected by a technique for generating a plurality of mapping patterns by repeating mapping a plurality of times that correlates each of $2^k$ kinds of said block data to each of $2^k$ kinds of said data patterns so that a mapping pattern to be generated with each mapping differs, thereby generating a plurality of mapping patterns, and calculating an evaluated value obtained for each generated mapping pattern by integrating, with $2^k$ block data groups used for mapping thereof, the Hamming distance of each of sets of said k-bit data patterns correlated to each of sets of block data of which the Hamming distance is 2, thereby selecting a mapping pattern where this evaluated value is the minimum.

3. The data modulating device according to claim 2, wherein, when generating said plurality of mapping patterns, said $2^k$ pieces of block data to be correlated to said $2^k$ data patterns are selected from more block data groups than $2^k$ and a mapping pattern selected based on the calculation result of said evaluated value, of a plurality of mapping patterns generated based on $2^k$ pieces of block data thus selected from more block data groups than $2^k$, is determined to be a mapping pattern of said data conversion table.

4. The data modulating device according to claim 2, wherein said evaluated value is obtained by computing the sum of the Hamming distance of each of sets of said k-bit data patterns correlated to each of sets of block data of which the Hamming distance is 2 with $2^k$ block data groups used for said mapping, and wherein a mapping pattern with said evaluated value as the minimum is a mapping pattern of said data conversion table.

5. The data modulating device according to claim 2, wherein said evaluated value is obtained by computing the sum of squares of the Hamming distance of each of sets of said k-bit data patterns correlated to each of sets of block data of which the Hamming distance is 2 with $2^k$ block data groups used for said mapping, and wherein a mapping pattern with said evaluated value as the minimum is a mapping pattern of said data conversion table.

6. A data modulating method for obtaining recorded modulation code, said method comprising the steps of:

executing LDPC encoding; and executing balance encoding by inputting a data string subjected to said LDPC encoding as data to be encoded, and converting k bits of this data to be encoded into balance code made up of m-bit block data;

wherein balance encoding of said data to be encoded is executed using a data conversion table subjected to mapping so that a set of said k-bit data patterns of which the Hamming distance is 1 corresponds to a set of block data of which the Hamming distance is 2, and further wherein the variable k is an integer value defining a bit size of data patterns and the variable m is an integer value that defines a size of the block data and the variables k and m are each greater than 1.

* * * * *